US011024777B2

(12) United States Patent
Yamanaka et al.

(10) Patent No.: US 11,024,777 B2
(45) Date of Patent: Jun. 1, 2021

(54) LIGHT SOURCE DEVICE

(71) Applicant: PANASONIC INTELLECTUAL PROPERTY MANAGEMENT CO., LTD., Osaka (JP)

(72) Inventors: Kazuhiko Yamanaka, Osaka (JP); Kenichi Matsumoto, Osaka (JP); Hideo Yamaguchi, Fukuoka (JP); Wakahiko Okazaki, Osaka (JP); Yasuhiko Enami, Osaka (JP); Taku Kobayashi, Kyoto (JP); Kazuki Adachi, Shiga (JP); Hirotaka Ueno, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 62 days.

(21) Appl. No.: 16/399,790

(22) Filed: Apr. 30, 2019

(65) Prior Publication Data
US 2019/0259917 A1  Aug. 22, 2019

Related U.S. Application Data

(63) Continuation of application No. PCT/JP2017/039040, filed on Oct. 30, 2017.

(30) Foreign Application Priority Data

Nov. 4, 2016  (JP) .............................. JP2016-216776

(51) Int. Cl.
*H01L 33/50* (2010.01)
*H01L 33/36* (2010.01)
(Continued)

(52) U.S. Cl.
CPC ............... *H01L 33/50* (2013.01); *B60Q 1/04* (2013.01); *B60Q 11/00* (2013.01); *F21V 23/00* (2013.01);
(Continued)

(58) Field of Classification Search
CPC ...................................................... H01L 33/50
See application file for complete search history.

(56) References Cited

U.S. PATENT DOCUMENTS

| 2010/0134711 A1 | 6/2010 | Park |
| 2011/0063115 A1 | 3/2011 | Kishimoto |
| 2011/0116520 A1 | 5/2011 | Krijn et al. |

FOREIGN PATENT DOCUMENTS

| JP | 2010-501980 A | 1/2010 |
| JP | 2010-127972 A | 6/2010 |

(Continued)

OTHER PUBLICATIONS

International Search Report and Written Opinion dated Jan. 30, 2018 in International (PCT) Application No. PCT/JP2017/039040; with partial English translation.

*Primary Examiner* — Joseph L Williams
(74) *Attorney, Agent, or Firm* — McDermott Will and Emery LLP

(57) ABSTRACT

A light source device includes a mounted substrate which is a multi-layered substrate, a semiconductor light-emitting device which emits a laser beam, a wavelength-converting member which radiates fluorescence by being irradiated with the laser beam emitted from the semiconductor light-emitting device as an excitation light, a state detection circuit, an electric field effect type transistor which adjusts an electric current amount applied to the semiconductor light-emitting device upon receipt of an output from the state detection circuit, and an external connecting member, and the semiconductor light-emitting device, the state detection circuit, the transistor, and the external connecting member are mounted on the single mounted substrate.

16 Claims, 59 Drawing Sheets

(51) Int. Cl.
  *G02B 5/20* (2006.01)
  *H01L 33/58* (2010.01)
  *H05B 33/08* (2020.01)
  *B60Q 11/00* (2006.01)
  *H01S 5/022* (2021.01)
  *F21V 23/00* (2015.01)
  *B60Q 1/04* (2006.01)
  *H05B 45/37* (2020.01)
  *H05B 45/18* (2020.01)

(52) U.S. Cl.
  CPC ............... *G02B 5/20* (2013.01); *H01L 33/36* (2013.01); *H01L 33/58* (2013.01); *H01S 5/022* (2013.01); *H05B 45/18* (2020.01); *H05B 45/37* (2020.01)

(56) References Cited

FOREIGN PATENT DOCUMENTS

| | | |
|---|---|---|
| JP | 2011-066069 A | 3/2011 |
| JP | 2011-527518 A | 10/2011 |
| JP | 2013-232394 A | 11/2013 |
| JP | 2013-251131 A | 12/2013 |
| JP | 2014-149489 A | 8/2014 |
| JP | 2016-115563 A | 6/2016 |
| JP | 2016-167362 A | 9/2016 |
| WO | 2008/023893 A1 | 2/2008 |
| WO | 2010/004477 A2 | 1/2010 |

THIS EMBODIMENT

COMPARATIVE EXAMPLE

FIG. 39

|  | (A) NORMAL | (B) LOW TEMP | (C) HIGH TEMP | (D) END TIME | (E) FAILURE MODE 1 (FIG38B) | (F) FAILURE MODE 2 (FIG38C) | (G) FAILURE MODE 3 (FIG24B) | (H) FAILURE MODE 4 (FIG24C) |
|---|---|---|---|---|---|---|---|---|
| S2$_{MIN}$ | 50 | 50 | 50 | 50 | 50 | 50 | 50 | 50 |
| S2$_{MAX}$ | 150 | 150 | 150 | 150 | 150 | 150 | 150 | 150 |
| S1$_{MIN}$ | 70 | 70 | 70 | 70 | 70 | 70 | 70 | 70 |
| S1$_{MAX}$ | 130 | 130 | 130 | 130 | 130 | 130 | 130 | 130 |
| S$_{PD2}$ | 100 | 111 | 78 | 76 | 3 | 2 | 67 | 34 |
| S$_{PD1}$ | 100 | 112 | 79 | 75 | 188 | 26.5 | 135 | 156 |
| (iii) | YES | YES | YES | YES | NO | NO | YES | NO |
| (iv) | YES | YES | YES | YES | - | - | YES | - |
| (v) | YES | YES | YES | YES | - | - | YES | - |
| (vi) | YES | YES | YES | YES | - | - | NO | - |

FIG. 40A

|  | (A) NORMAL | (B) LOW TEMP | (C) HIGH TEMP | (D) END TIME | (E) FAILURE MODE 1 (FIG38B) | (F) FAILURE MODE 2 (FIG38C) | (G) FAILURE MODE 3 (FIG24B) | (H) FAILURE MODE 4 (FIG24C) |
|---|---|---|---|---|---|---|---|---|
| $S2_{MIN}$ | 70 | 70 | 70 | 70 | 70 | 70 | 70 | 70 |
| $S2_{MAX}$ | 150 | 150 | 150 | 150 | 150 | 150 | 150 | 150 |
| $S1_{MIN}$ | 70 | 70 | 70 | 70 | 70 | 70 | 70 | 70 |
| $S1_{MAX}$ | 130 | 130 | 130 | 130 | 130 | 130 | 130 | 130 |
| $S_{PD2}$ | 100 | 111 | 78 | 76 | 3 | 2 | 67 | 34 |
| $S_{PD1}$ | 100 | 112 | 79 | 75 | 188 | 26.5 | 135 | 156 |
| (iii) | YES | YES | YES | YES | NO | NO | NO | NO |
| (iv) | YES | YES | YES | YES | – | – | – | – |
| (v) | YES | YES | YES | YES | – | – | – | – |
| (vi) | YES | YES | YES | YES | – | – | – | – |

LIGHT SOURCE DEVICE

CROSS REFERENCE TO RELATED APPLICATIONS

This application is a U.S. continuation application of PCT International Patent Application Number PCT/JP2017/039040 filed on Oct. 30, 2017, claiming the benefit of priority of Japanese Patent Application Number 2016-216776 filed on Nov. 4, 2016, the entire contents of which are hereby incorporated by reference.

BACKGROUND

1. Technical Field

The present disclosure relates to a light source device.

2. Description of the Related Art

With regard to a light source device and a light projecting device using a semiconductor light-emitting device constituted by a semiconductor light-emitting element such as a semiconductor laser, in order to radiate light with a high luminous flux, light radiated from a wavelength-converting member by irradiation of light of the semiconductor light-emitting device needs to be used efficiently.

As this type of light projecting device, Japanese Unexamined Patent Application Publication No. 2011-66069 discloses a light-emitting device using a semiconductor laser element and a fluorescent element. Conventional light-emitting device 1001 disclosed in Japanese Unexamined Patent Application Publication No. 2011-66069 will be described by using FIG. 57.

FIG. 57 is a view for explaining a configuration of conventional light-emitting device 1001. As illustrated in FIG. 57, conventional light-emitting device 1001 includes semiconductor laser element 1002 oscillating laser light, fluorescent element 1004 converting at least a part of the laser light oscillated from semiconductor laser element 1002 to incoherent light, reflection plate 1005 which reflects light radiated from fluorescent element 1004, and a safety device (photodetector 1011, controller 1009) which suppresses emission of the coherent laser light to an outside.

Blue laser light emitted from semiconductor laser element 1002 is wavelength-converted in fluorescent element 1004 to light with a wavelength larger than 500 nm and radiated. At this time, abnormal deterioration of fluorescent element 1004 such as damage or loss of fluorescent element 1004 can occur in some cases. In this case, light conversion abnormality which is a state where the laser light is emitted as it is to the outside can occur. Thus, in conventional light-emitting device 1001 illustrated in FIG. 57, when an output increase caused by the abnormal deterioration in fluorescent element 1004 is detected by photodetector 1011, an output of semiconductor laser element 1002 is stopped. More specifically, when an output value of light-receiving element 1008 is determined by controller 1009 to be a predetermined value or more, controller 1009 sends a signal to driver 1010 and causes driving of semiconductor laser element 1002 to be stopped. As a result, emission of the laser light to the outside is suppressed.

Here, optical filter 1007 of light-receiving element 1011 is configured to shield light (visible light) having a wavelength converted and to transmit laser light.

SUMMARY

When such a light projecting device combining a semiconductor laser element and a fluorescent element is used as a front lamp for a vehicle or the like, at a moment when a lighting instruction is given to the light projecting device, it needs to instantaneously determine that there is no abnormality in the light projecting device and the light projecting device should be lighted. Moreover, in the case of abnormality in the light projecting device such as separation of the fluorescent element during an operation, it is necessary that an operating state of the light projecting device is accurately determined, the light projecting device is stopped instantaneously, and alternative illumination is prepared.

However, in the conventional light projecting device, light radiated from the light projecting device is detected by a light-receiving element and determined by a determiner disposed in a peripheral part of the light projecting device, and the semiconductor laser element is controlled. Thus, since the light-receiving element, the determiner, and the semiconductor laser element are disposed in a scattered manner in the light projecting device, an error can occur easily in determination by the determiner, and a delay can occur easily in control of the light projecting device.

The present disclosure was made in order to solve such problems and has an object to provide a light source device which can accurately detect abnormal deterioration of a wavelength-converting member by a light-receiving element and can instantaneously stop the light-emitting element of the light source device with a compact configuration.

In order to solve the above-described problem, in accordance with an aspect of the present disclosure, there is provided a light source device used for exterior illumination of a vehicle, including: a single mounted substrate; a semiconductor light-emitting device which emits a laser beam; an external connecting member connected to the semiconductor light-emitting device and to which a driving current of the semiconductor light-emitting device is supplied from outside the light source device; a wavelength-converting member which radiates wavelength-converted fluorescence when irradiated with the laser beam as an excitation light; an operation state detection circuit which includes one or more light-receiving elements, detects an operation state of the light source device in accordance with light information detected by the one or more light-receiving elements, and outputs an operation state signal; a microcontroller which controls the operation of the semiconductor light-emitting device in accordance with the operation state signal; and a non-volatile memory which is disposed inside the microcontroller or on the single mounted substrate, wherein the semiconductor light-emitting device, the external connecting member, the microcontroller, and the operation state detection circuit are mounted on the single mounted substrate, the one or more light-receiving elements receive a scattered light generated by scattering the laser beam on the wavelength-converting member or the wavelength-converted fluorescence, an initial light amount value according to a light amount of at least a light amount of the scattered light or a light amount of the wavelength-converted fluorescence when the semiconductor light-emitting device is operated under an initial state measurement condition is stored in the non-volatile memory, and operation control of the semiconductor light-emitting device is executed by using the initial light amount value.

In accordance with another aspect of the present disclosure, there is provided a light source device used for exterior illumination of a vehicle, including: a single mounted substrate; a semiconductor light-emitting device which emits a laser beam; a wavelength-converting member which radiates wavelength-converted fluorescence when irradiated with the laser beam as an excitation light; an external connecting member connected to the semiconductor light-emitting device and to which a driving current of the semiconductor light-emitting device is supplied from outside the light source device; an operation state detection circuit which includes one or more light-receiving elements, detects an operation state of the light source device in accordance with light information detected by the one or more light-receiving elements, and outputs an operation state signal; and a microcontroller which controls the operation of the semiconductor light-emitting device in accordance with the operation state signal, wherein the semiconductor light-emitting device, the external connecting member, the microcontroller, and the operation state detection circuit are mounted on the single mounted substrate, the one or more light-receiving elements include: a first light-receiving element which receives a scattered light generated by scattering the laser beam on the wavelength-converting member and outputs a first signal; and a second light-receiving element which receives the wavelength-converted fluorescence and outputs a second signal; the scattered light of Lambert illuminance distribution is incident to the first light-receiving element; and the wavelength-converted fluorescence of Lambert illuminance distribution is incident to the second light-receiving element.

In accordance with another aspect of the present disclosure, there is provided a light source device used for exterior illumination of a vehicle, including: a single mounted substrate; a semiconductor light-emitting device which emits a laser beam; an external connecting member connected to the semiconductor light-emitting device and to which a driving current of the semiconductor light-emitting device is supplied from outside the light source device; an operation state detection circuit which includes a temperature detection element, detects an operation state of the light source device in accordance with temperature information detected by the temperature detection element, and outputs an operation state signal; a microcontroller which controls an operation of the semiconductor light-emitting device in accordance with the operation state signal; and a non-volatile memory which is disposed inside the microcontroller or on the single mounted substrate, wherein the semiconductor light-emitting device, the external connecting member, the microcontroller, and the operation state detection circuit are mounted on the single mounted substrate, driving current information according to the temperature information is stored in the non-volatile memory, and operation control of the semiconductor light-emitting device is executed by using the driving current information.

According to the present disclosure, in a light source device combining a semiconductor light-emitting element and a wavelength-converting member, abnormal deterioration of the wavelength-converting member can be accurately detected by a light-receiving element and the light emitting element of the light source device can be instantaneously stopped with a compact configuration.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 31A is a circuit block diagram for explaining a driving circuit connected to a circuit mounted on the light source device according to embodiment 4 and the like;

FIG. 39 is a view for explaining an example of a detection result of an operation state detection circuit according to embodiment 4;

FIG. 40A is a view for explaining an example of the detection result of the operation state detection circuit according to embodiment 4;

DETAILED DESCRIPTION OF THE EMBODIMENTS

Figure 1:
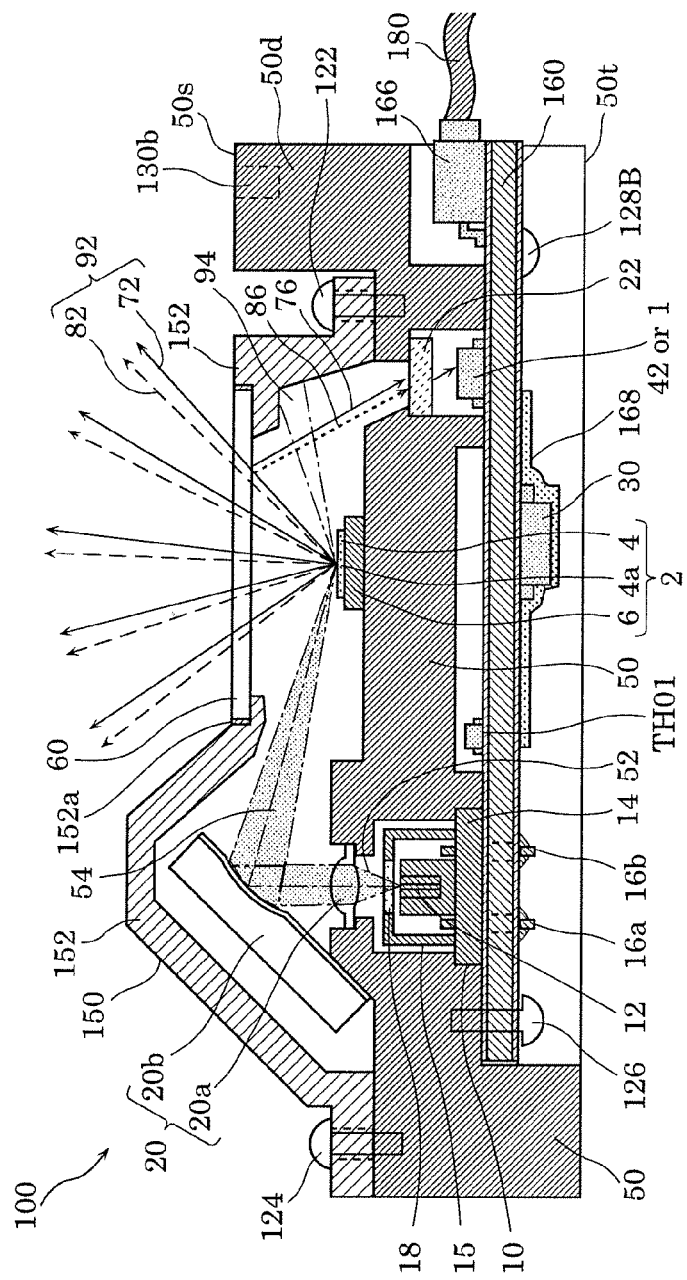
FIG. 1 is a schematic sectional view illustrating a configuration of a light source device according to embodiment 1.

Embodiments of the present disclosure will be described below with reference to drawings. Note that any one of the embodiments described below illustrates an exemplary specific example of the present disclosure. Therefore, numeral values, constituent elements, disposed positions and connection forms of the constituent elements, steps and an order of steps, and the like illustrated in the following embodiments are only examples and are not intended to limit the present disclosure. Thus, the constituent elements not described in independent claims indicating a highest-order concept of the present disclosure in the constituent elements in the following embodiments are described as arbitrary constituent elements.

Moreover, each drawing is a schematic diagram and is not necessarily strict illustration. In each view, same reference numerals are given to substantially the same constituent elements and duplicated description will be omitted or simplified. That is, description of the constituent elements common in each view will be omitted or simplified.

Embodiment 1

Hereinafter, light source device 100 according to embodiment 1 of the present disclosure will be described.
(Configuration of Light Source Device)

Figure 2:
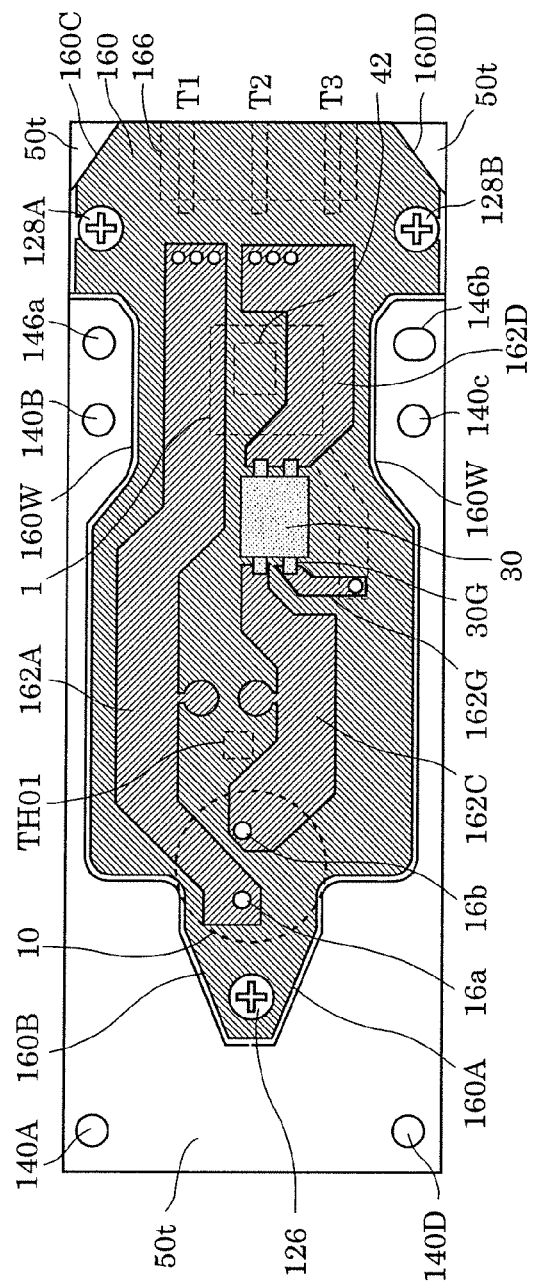
FIG. 2 is a view seen from a first surface side of the light source device, illustrating the configuration of the light source device according to embodiment 1.
Figure 3:
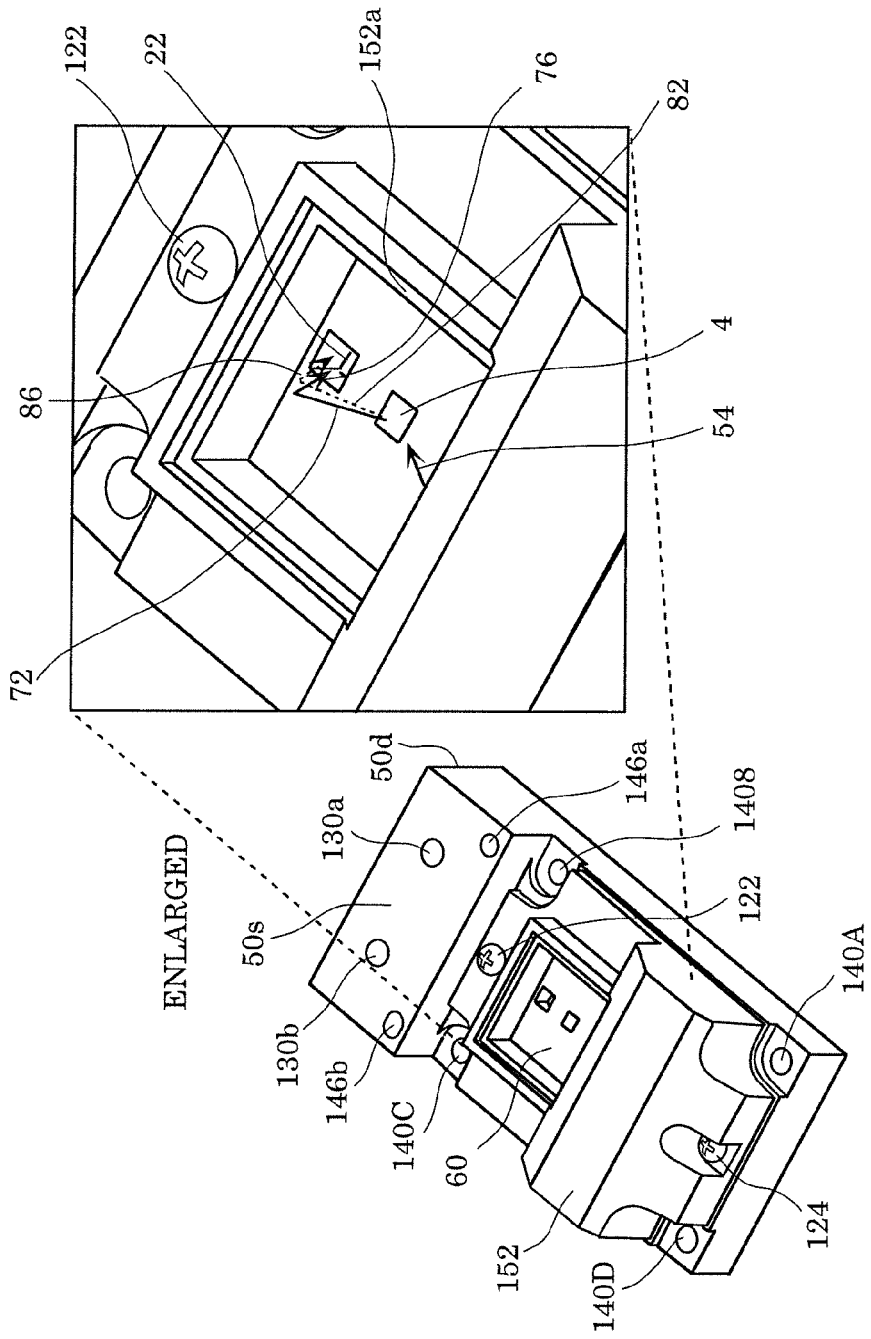
FIG. 3 is a schematic perspective view illustrating the configuration of the light source device according to embodiment 1.
Figure 4:
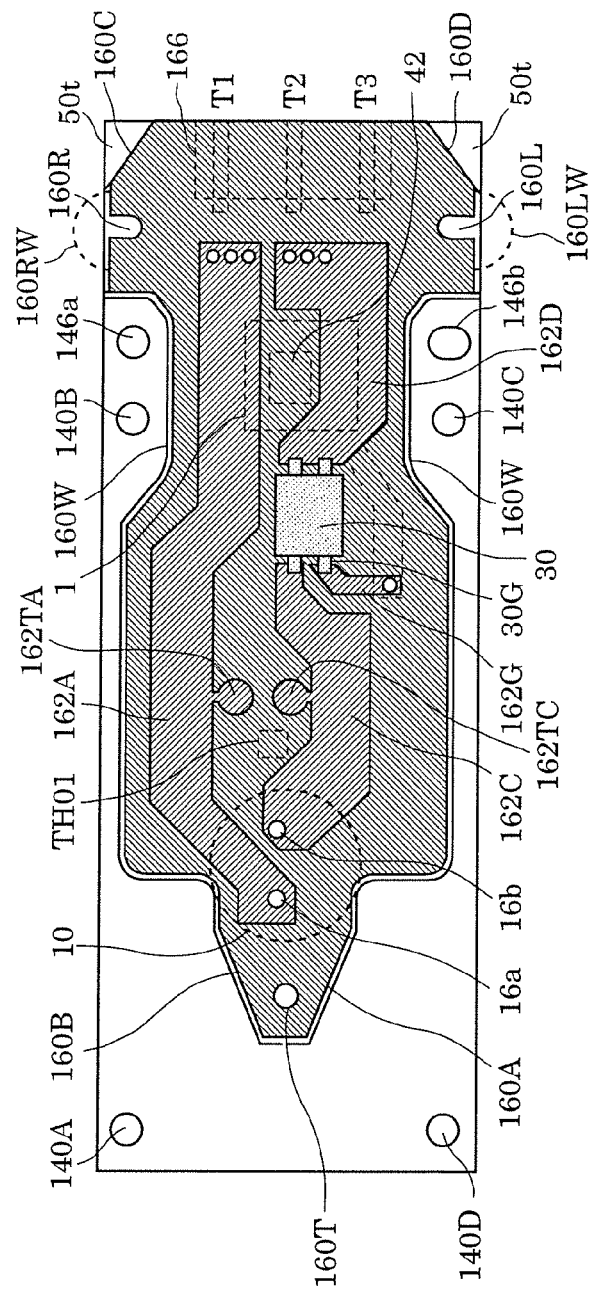
FIG. 4 is a schematic diagram for explaining a configuration of a mounted substrate of the light source device according to embodiment 1.
Figure 5:
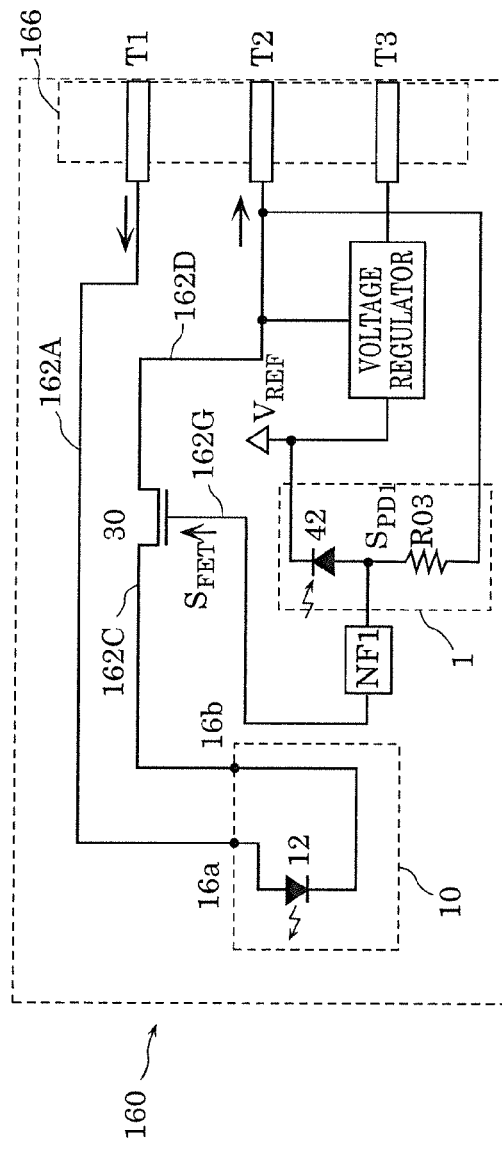
FIG. 5 is a circuit block diagram illustrating a circuit configuration mounted on the mounted substrate of the light source device according to embodiment 1.

First, a configuration of light source device 100 according to embodiment 1 will be described with reference to FIG. 1 to FIG. 5. FIG. 1 is a schematic sectional view illustrating a configuration of light source device 100 according to embodiment 1, and FIG. 2 is a schematic diagram of light source device 100 when seen from first surface 50t side (lower side on the drawing in FIG. 1). FIG. 3 is a schematic perspective view illustrating light source device 100 according to embodiment 1. FIG. 4 is a schematic diagram for explaining a configuration of a mounted substrate of light source device 100, and FIG. 5 is a simplified circuit block diagram illustrating a circuit configuration mounted on the mounted substrate.

As illustrated in FIG. 1 and FIG. 2, light source device 100 includes semiconductor light-emitting device 10 on which semiconductor light-emitting element 12 which is a semiconductor laser, for example, is mounted, external connecting member 166 which supplies electricity to semiconductor light-emitting device 10 from an outside, state detection circuit 1 configured by light-receiving element 42 and the like, and transistor 30 connected to semiconductor light-emitting device 10.

Semiconductor light-emitting device 10 is configured by mounting semiconductor light-emitting element 12 on TO-CAN type package 14 having lead pins 16a and 16b and by covering a portion on which semiconductor light-emitting element 12 is mounted by metal can 15 including light transmitting member 18 such as glass. And semiconductor light-emitting element 12 is electrically connected to lead pins 16a and 16b by a metal wire or the like, not shown.

State detection circuit 1 is an operation state detection circuit which detects an operation state of light source device 100 and outputs an operation state signal. In this embodiment, state detection circuit 1 is configured by first light-receiving element 42, resistors, and the like and detects a spectrum of emitted light emitted from semiconductor light-emitting device 10 and a physical amount related to a light amount as an operation state of light source device 100.

Transistor 30 is connected to semiconductor light-emitting device 10 and adjusts a current amount applied to semiconductor light-emitting device 10 by an operation state signal from state detection circuit 1.

Light source device 100 further includes mounted substrate 160. Mounted substrate 160 is printed circuit board in which printed wiring made of copper foil, for example, is formed on an insulating substrate such as glass epoxy and ceramics. And on mounted substrate 160, semiconductor light-emitting device 10, external connecting member 166, state detection circuit 1, and transistor 30 are mounted.

In the light source device having the configuration as above, a semiconductor light-emitting device which changes an operation state of a light source device, an external connecting member which supplies electricity to the semiconductor light-emitting device, an operation state detection circuit which detects the operation state of the light source device, and a transistor which can control the electricity to the semiconductor light-emitting device by the operation state signal from the operation state detection circuit are mounted on the same mounted substrate. Thus, when abnormality occurs in the light source device, the operation state of the semiconductor light-emitting device can be changed, and the light source device can be instantaneously changed to a safer operation state. More specifically, when an abnormal operation state such as emission of high density light from the light source device occurs, the light source device can be turned off at a high speed.

Moreover, light source device 100 includes base 50 constituted by an aluminum alloy, for example. And mounted substrate 160 and semiconductor light-emitting device 10 are fixed to base 50. Base 50 of light source device 100 includes first surface 50t which is a fixing surface which is fixed to an external heat radiator such as a heat sink, not shown, and an external device such as a housing of the light projecting device, when the light projecting device is constituted by using the light source device of this embodiment. In this embodiment, mounted substrate 160 is disposed on the fixing surface of a portion dented inward by one step from first surface 50t of base 50. And in this embodiment, mounted substrate 160 is disposed in parallel with first surface 50t.

In this embodiment, light source device 100 further includes wavelength-converting element 2 which absorbs a part of light from semiconductor light-emitting device 10 and radiates light changed in accordance with a spectrum and a light amount. Wavelength-converting element 2 is constituted by forming wavelength-converting member 4 including a fluorescent element such as an yttrium-aluminum-garnet (YAG) type fluorescent element, for example, on support member 6 in which a reflection film is formed on a high thermal conducting substrate, for example.

Light source device 100 further includes light-collecting optical member 20 which collects emitted light 54 radiated from semiconductor light-emitting device 10 to light emitter 4a which is a local region of wavelength-converting member 4. In this embodiment, light-collecting optical member 20 is constituted by lens 20a which is a collimator lens, for example, and reflection optical element 20b which is a glass substrate in which a concave lens and a reflection film are formed on a surface, for example. Light-collecting optical member 20 and wavelength-converting element 2 are disposed on base 50. At this time, light-collecting optical member 20 and wavelength-converting element 2 are fixed to a surface of base 50 on a side opposite to a surface on which first surface 50t is formed. And light-collecting optical member 20 and wavelength-converting element 2 are covered by cover unit 150 including light transmitting member 60 and holding member 152. Cover unit 150 is fixed to base 50 by screws 122 and 124 in this embodiment.

Moreover, mounted substrate 160 is fixed to base 50 by screws 126, 128A, and 128B. And through holes through which lead pins 16a and 16b of semiconductor light-emitting device 10 penetrate are formed in mounted substrate 160. Lead pins 16a and 16b are soldered to printed wiring of mounted substrate 160 and electrically connected.

Moreover, in light source device 100, reference hole 146a for positioning to an external device such as an external heat radiator, not shown, disposed on first surface 50t side with accuracy and long hole 146b making a pair with reference hole 146a are provided. And through holes 140A, 140B, 140C, and 140D which are holes at four spots to be fixed to the external heat radiator, not shown, disposed on first surface 50t side by screws or the like, not shown, are formed. In this embodiment, through holes 140A, 140B, 140C, and 140D are formed in a peripheral region of base 50 as illustrated in FIG. 2 and FIG. 3. Moreover, the through holes penetrate the base in a direction in parallel with a main axis of a direction in which emitted light 52 is radiated from semiconductor light-emitting device 10. By means of this configuration, light source device 100 can be fixed easily and with accuracy to the external heat radiator, not shown.

Moreover, as illustrated in FIG. 3, base 50 has pedestal 50d, and pedestal 50d includes second surface 50s on a surface opposite to first surface 50t. And reference hole 146a and long hole 146b penetrate base 50 and form an opening portion also in second surface 50s of base 50.

A light-projecting optical member, not shown, such as a curved mirror is fixed to second surface 50s of base 50 when a light projecting device is constituted by using the light source device of the present embodiment. Thus, reference hole 146a and long hole 146b formed in second surface 50s can be used for positioning for light emitter 4a of light source device 100 and the light-projecting optical member fixed to second surface 50s. And screw holes 130a and 130b may be formed in the same plane as second surface 50s in which reference hole 146a and long hole 146b are formed. By means of such configuration, the light-projecting optical member constituting the light projecting device can be fixed to light source device 100 with accuracy and easily by using reference hole 146a, long hole 146b, screw hole 130a, and screw hole 130b. As illustrated in FIG. 2, printed wiring 162A, 162C, and 162D each having a large wiring width are formed in order to apply a large electric current of 3 amperes, for example, to semiconductor light-emitting device 10 on mounted substrate 160. Printed wiring 162A is used as wiring for an anode of semiconductor light-emitting device 10. Printed wiring 162C and 162D are used as wiring for a cathode of semiconductor light-emitting device 10. And transistor 30 which is a field effect transistor, for example, is connected between printed wiring 162C and 162D. Transistor 30 is a field effect transistor of p-channel, for example, and the one which is on in a state where a voltage is not applied to gate terminal 30G is used. And transistor 30 is connected in series with semiconductor light-emitting device 10. Moreover, gate terminal 30G of transistor 30 is connected to state detection circuit 1 constituted by light-receiving element 42 by printed wiring 162G. An operation state signal output from state detection circuit 1 is made to a signal $S_{FET}$ directly or subjected to predetermined signal-conversion, transmitted through printed wiring 162G and input into gate terminal 30G. By configuring as above, transistor 30 connected in series with semiconductor light-emitting device 10 can be controlled by using an operation state signal from state detection circuit 1. Therefore, electricity applied to semiconductor light-emitting device 10 can be controlled at a high speed in accordance with a state of the light source device. Moreover, a function of detecting an operation state of the light source device and function of controlling an operation state such as light emission of the light source device by using a detection result can be equipped in light source device 100 easily.

Subsequently, a shape of mounted substrate 160 and an electric circuit formed on mounted substrate 160 will be described in detail with reference to FIG. 4 and FIG. 5. FIG. 4 is a view illustrating light source device 100 seen from first surface 50t side similarly to FIG. 2, and an outer shape of mounted substrate 160 is illustrated by removing screws 126, 128A, and 128B from FIG. 2. In FIG. 4, semiconductor light-emitting device 10 is connected to a left side of mounted substrate 160, while external connecting member 166 which is a connector is connected to a right side. In a circuit block diagram in FIG. 5, comparison is made easy as a diagram in which semiconductor light-emitting device 10 is disposed on the left side and external connecting member 166 on the right side. In FIG. 4, since semiconductor light-emitting device 10 and external connecting member 166 are not seen from first surface 50t side, they are indicated by dotted lines. External connecting member 166 includes terminals T1, T2, and T3 to be electrically connected to external wiring 180. In FIG. 4, first light-receiving element 42 constituting state detection circuit 1 is mounted on a surface of mounted substrate 160 on a side opposite to first surface 50t side in order to receive light related to the light emitted from semiconductor light-emitting device 10. Thus, semiconductor light-emitting device 10 and external connecting member 166 disposed on the surface on the opposite side are similarly indicated by dotted lines.

Subsequently, a configuration and an operation of mounted substrate 160 will be described in more detail with reference to a simplified circuit block diagram in FIG. 5. In the schematic sectional view in FIG. 4, only major circuit components of the circuit block illustrated in FIG. 5 are illustrated. As illustrated in FIG. 5, an electric current input from terminal T1 of external connecting member 166 is input into semiconductor light-emitting device 10 by printed wiring 162A and is led from terminal T2 of external connecting member 166 to the outside by printed wiring 162C and 162D. At this time, transistor 30 is inserted between printed wiring 162C and 162D.

State detection circuit 1 is constituted by first light-receiving element 42 and resistor R03, and a constant voltage is applied by a voltage regulator which is a constant voltage circuit. An outputter of state detection circuit 1 is connected to filter circuit NF1 and is further connected to gate terminal 30G of transistor 30. At this time, filter circuit NF1 may be a low-pass filter constituted by a resistor and a capacitor.

Moreover, printed wiring 162A is directly connected to lead pin 16a for anode terminal of semiconductor light-emitting device 10 on which semiconductor light-emitting element 12 is mounted. Printed wiring 162C is directly connected to lead pin 16b for cathode terminal. And test pads 162TA and 162TC which can be electrically connected to semiconductor light-emitting device 10 by using contact pins from the outside are formed on printed wiring 162A and 162C, respectively.

And mounted substrate 160 is longer in a direction connecting semiconductor light-emitting device 10 and wavelength-converting member 4 and shorter in a direction perpendicular to the direction connecting semiconductor light-emitting device 10 and wavelength-converting member 4. In the present embodiment, the longer direction of mounted substrate 160 is assumed to be a long axis and the shorter direction to be a short axis. External connecting member 166 has a rectangular shape in plan view and has a short side shorter in the long axis direction and a long side longer in the short axis direction of mounted substrate 160.

Mounted substrate 160 is fixed to a fixing surface located at a position dented inward by one step from first surface 50t of base 50 on first surface 50t side. By means of the configuration, the light source device can be fixed with the external heat radiator having a flat surface and first surface 50t of base 50 in planar contact. Thus, a heat radiation path from the light source device to the external heat radiator can be easily configured. Moreover, in mounted substrate 160, screw hole 160T for mounting and screw holes 160L and 160R for mounting for fixing mounted substrate 160 to base 50 by screws are provided. At this time, screw holes 160L and 160R for mounting are disposed in a pair on the short axis direction of mounted substrate 160, that is, in the long side direction of external connecting member 166. Moreover, screw holes 160L and 160R for mounting are opened to an external direction in plan view. At this time, assuming that screw holes 160L and 160R for mounting are through holes, extended portions 160RW and 160LW of mounted substrate 160 slightly larger than screws 128A and 128B are needed. Therefore, necessity of extended portions 160RW and 160LW can be eliminated by a structure in which screw holes 160L and 160R for mounting are opened to the external direction. As described above, by means of such configuration, the mounted substrate can be firmly fixed to the base and a width of a driving substrate can be reduced in the short axis direction, and a small-sized light source device can be realized.

Moreover, as illustrated in FIG. 4, in mounted substrate 160, opening portion 160W having an open shape is formed at spots where reference hole 146a and long hole 146b of the base are formed in plan view when seen from first surface 50t side of light source device 100. By means of such configuration, a size of the outer shape of the light source device is reduced, while the light source device can be easily fixed to a heat radiator of a lamp or the like.

Moreover, in mounted substrate 160, end portions 160A and 160B at an end of a connection portion between mounted substrate 160 and semiconductor light-emitting device 10 are chamfered on the end side of mounted substrate 160 so as to follow the outer shape of semiconductor light-emitting device 10. By means of such configuration, since an area of mounted substrate 160 can be reduced, an exposed area of the base on a disposed surface of the mounted substrate in the vicinity of semiconductor light-emitting device 10, that is, first surface 50t which is a fixing surface can be enlarged. Thus, even in the case of fixation to the external heat radiator by using the fixing surface on the disposed side of the mounted substrate in the light source device, heat radiation performance of the light source device, that is, heat radiation performance from the semiconductor light-emitting device to the external heat radiator can be improved.

Moreover, when mounted substrate 160 is seen in plan view, end portions 160C and 160D of an extended portion of mounted substrate 160 formed in the long side direction of external connecting member 166 are chamfered. By means of such configuration, while the size of the light source device is maintained, an area of the mounted substrate can be reduced, an occupied rate of first surface 50t of the light source device in a surface area of the base is increased, and heat radiation performance from the light source device to the external heat radiator can be improved. Moreover, while a size of the light source device is maintained, first surface 50t is provided in the vicinity of external connecting member 166, and base 50 and the external heat radiator are configured to cover external connecting member 166 for easy protection.

Moreover, electronic components such as transistor 30 of mounted substrate 160 are covered by protective film 168 made of polyolefin resin, urethane resin, acrylic resin, or the like. By means of such configuration, short-circuit of terminals of the electronic components caused by dusts or alteration caused by humidity in an atmosphere can be prevented.

Subsequently, a manufacturing method of light source device 100 of the present embodiment will be described with reference to FIG. 6.

Figure 6:
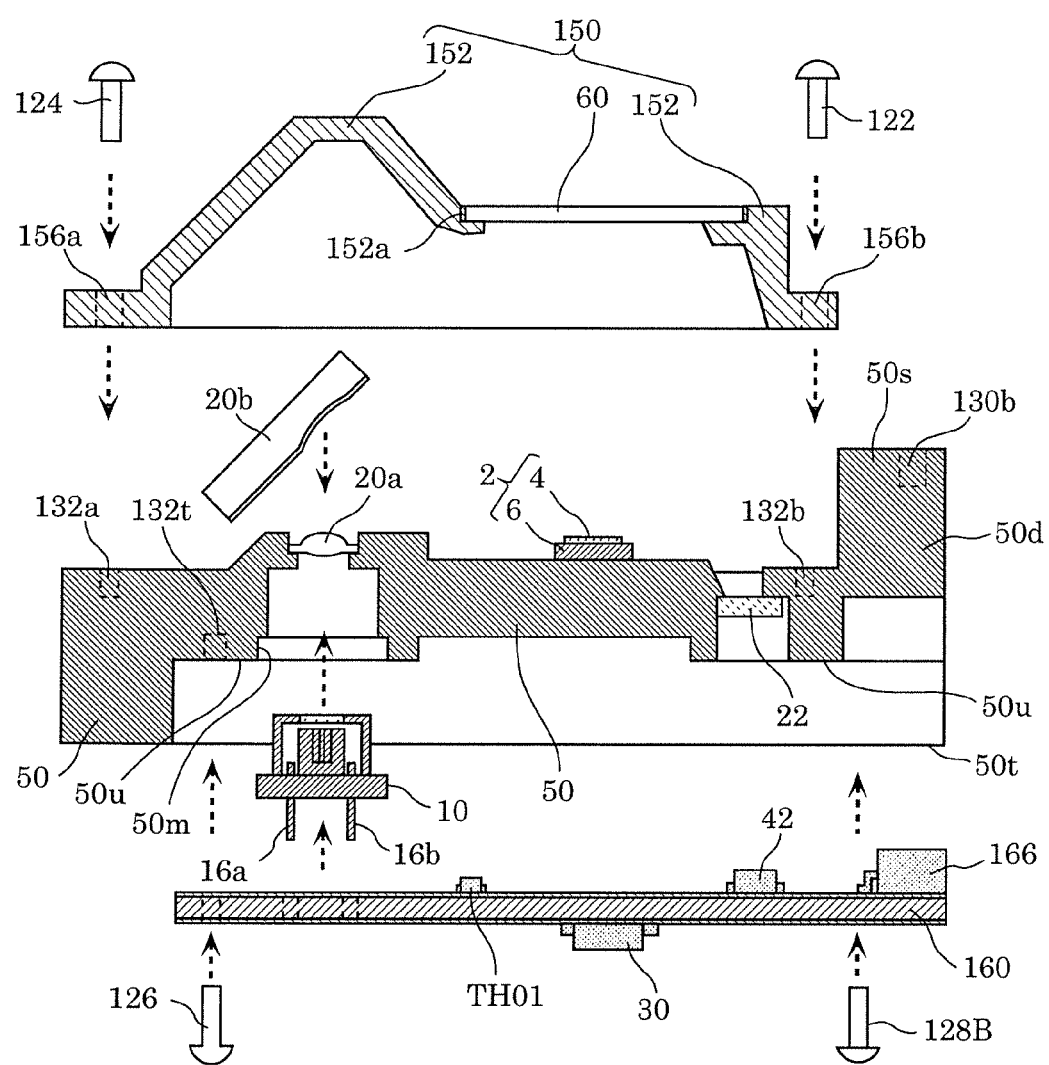
FIG. 6 is a schematic sectional view for explaining a manufacturing method of the light source device according to embodiment 1.

FIG. 6 is a schematic sectional view for explaining the manufacturing method of light source device 100 according to embodiment 1.

First, wavelength-converting element 2 and lens 20a are bonded to base 50 and fixed at a predetermined position. Subsequently, semiconductor light-emitting device 10 is press-fitted and fixed to opening portion 50m on a surface opposite to a surface to which wavelength-converting element 2 of base 50 is fixed. Subsequently, mounted substrate 160 on which transistor 30, light-receiving element 42, external connecting member 166, and the like are mounted is mounted by being inserted into lead pins 16a and 16b of semiconductor light-emitting device 10 and further screwed to base 50 by screws 126, 128A, and 128B. At this time, mounted substrate 160 is fixed to third surface 50u which is located on first surface 50t side of base 50 and is a fixing surface of a portion dented inward by one step from first surface 50t. More specifically, screws 126, 128A, and 128B penetrate screw holes 160T, 160R, and 160L of mounted substrate 160 and are screwed in screw holes corresponding to screw hole 132t formed in third surface 50u and screw holes 160R and 160L, not shown, and mounted substrate 160 is fixed to third surface 50u. After that, printed wiring 162A of mounted substrate 160 and lead pin 16a are soldered and then, printed wiring 162C and lead pin 16b are soldered, and semiconductor light-emitting device 10 and mounted substrate 160 are electrically connected. Subsequently, position adjustment and fixation to base 50 of reflection optical element 20b is performed. More specifically, a light emission detector, not shown, is disposed on an upper surface of wavelength-converting element 2. Then, electricity is applied by external connecting member 166 to a voltage regulator and semiconductor light-emitting device 10, and emitted light from semiconductor light-emitting device 10 is projected to wavelength-converting element 2, and emitted light is radiated from the vicinity of light emitter 4a of wavelength-converting element 2. At this time, while a light emission pattern and a light emission position of the emitted light are detected, the position of reflection optical element 20b is adjusted, and reflection optical element 20b is bonded and fixed to base 50 by using an ultraviolet-curing resin or the like. Lastly, cover unit 150 in which light transmitting member 60 is fixed to holding member 152 having opening portion 152a is fixed to base 50. At this time, cover unit 150 is fixed to the base by screwing screws 122 and 124 by using through holes 156a and 156b formed in holding member 152 and screw holes 132a and 132b formed in base 50. At this time, holding member 152 is manufactured by casting of an aluminum alloy or forging of stainless steel, for example, and cover unit 150 is constituted by fixing light transmitting member 60 which is glass on which a reflection preventive film is formed on a surface to opening portion 152a which is a heat-curing resin and has a stepped portion. In the aforementioned manufacturing method, electricity can be supplied easily to semiconductor light-emitting device 10 by using mounted substrate 160 during manufacture of light source device 100. Therefore, a light emission pattern and a position of the emitted light can be adjusted easily by using an optical element. Moreover, by means of such configuration, an optical system constituted by semiconductor light-emitting device 10, lens 20a, reflection optical element 20b, and wavelength-converting element 2 of light source device 100 can be protected from the outside easily by cover unit 150.

Note that, in the aforementioned manufacturing method, when the position of reflection optical element 20b is adjusted while a light emission pattern of light emitter 4a in wavelength-converting element 2 is detected, electricity may be applied to semiconductor light-emitting element 12 so as to emit light by using a contact pin, not shown, from test pads 162TA and 162TC. By means of this method, since semiconductor light-emitting element 12 can be made to emit light regardless of operation/non-operation of transistor 30, light source device can be manufactured easily.

A configuration and an operation of light source device 100 having the aforementioned configuration will be described with reference also to a partial sectional view in FIG. 7.

Figure 7:
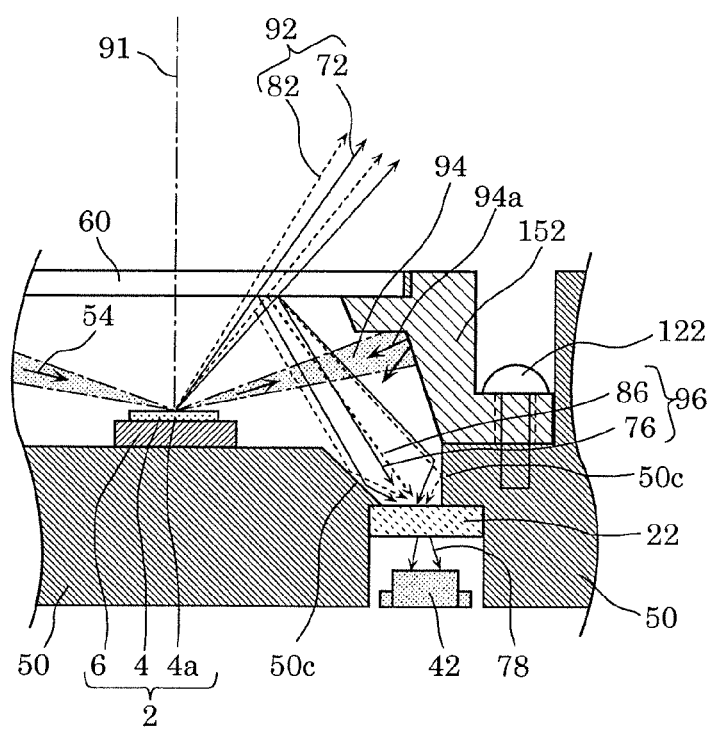
FIG. 7 is a schematic partial sectional view for explaining a function of the light source device according to embodiment 1.

FIG. 7 is a schematic partial sectional view for explaining a function of light source device 100 according to embodiment 1.

Transistor 30 is a p-channel field effect transistor, for example, and the one which is turned on in a state where a voltage is not applied to gate terminal 30 is assumed to be used. Subsequently, a predetermined voltage such as 5 V, for example, is applied to terminal T3 of external connecting member 166. Then, predetermined electricity is applied to terminal T1 connected to an anode terminal and to terminal T2 connected to a cathode terminal of semiconductor light-emitting device 10. At this time, as illustrated in FIG. 1, emitted light 52 which is laser light having a center wavelength of 450 nm, for example, is radiated from semiconductor light-emitting element 12 of semiconductor light-emitting device 10. Emitted light 52 becomes propagated light 54 in which a beam is shaped by lens 20a and reflection optical element 20b and is incident to light emitter 4a of wavelength-converting element 2. Propagated light 54 incident to light emitter 4a of wavelength-converting element 2 is partially reflected by a surface of wavelength-converting member 4 as emitted light 94 and irradiates holding member 152. A part of remaining propagated light 54 is partially absorbed and wavelength-converted by fluorescent substances of wavelength-converting member 4 as first emitted light 72 which is scattered propagated light and is radiated from wavelength-converting element 2 as second emitted light 82 having a wavelength longer than that of propagated light 54. At this time, second emitted light 82 is radiated as light which is Lambert illuminance distribution having strongest light intensity of main axis 91 in a normal direction with respect to the surface of wavelength-converting member 4. First emitted light 72 and second emitted light 82 radiated from wavelength-converting element 2 are mixed and radiated as emitted light 92. Most of emitted light 92 transmits through light transmitting member 60 and is radiated to the outside from light source device 100. At this time, a part of emitted light 92 is reflected by light transmitting member 60 and goes toward first light-receiving element 42 as reflected light 96. Reflected light 96 is constituted by first reflected light 76 which is a part of the first emitted light reflected by light transmitting member 60 and second reflected light 86 which is a part of second emitted light reflected by light transmitting member 60.

Here, an example of holding member 152 of the light source device will be described. As described above, emitted light 94 irradiates holding member 152. Since emitted light 94 is light with light intensity higher in a specific direction, emitted light 94 may not contribute as emitted light 92. Therefore, a surface irradiated with emitted light 94 in holding member 152 may be configured as follows. First, a part of holding member 152 is constituted so as to extend to wavelength-converting member 4 side of light transmitting member 60. Then, a side surface of holding member 152 on wavelength-converting member 4 side is constituted so as to be separated from main axis 91 toward base 50 side. By constituting as above, emitted light 94 is multi-reflected in a space surrounded by cover unit 150 and base 50 and can be attenuated and thus, emission as stray light in emitted light 92 to the outside of light source device 100 can be made difficult. That is, emitted light 94 propagated upward from base 50 is reflected by the side surface of holding member 152 and becomes reflected light 94a propagating downward, that is, to base 50 side.

At this time, irregularity may be further formed on the surface of holding member 152 by blast machining. By means of such configuration, emitted light 94 can be attenuated even on the surface of holding member 152.

In the above, first light-receiving element 42 receives at least either one of a part of first emitted light 72 emitted from semiconductor light-emitting device 10 and scattered by wavelength-converting member 4 and a part of second emitted light 82 which is fluorescence wavelength-converted by wavelength-converting member 4. As a result, an operation state of light source device 100 can be detected accurately by state detection circuit 1.

Moreover, first optical filter 22 is disposed between light transmitting member 60 and first light-receiving element 42 of light source device 100. Then, only a wavelength of a part of reflected light 96 is configured to pass through first optical filter 22. Then, reflected light 96 is configured to pass through first optical filter 22 and to reach first light-receiving element 42. By configuring as above, light of a part of a spectrum of emitted light 92 emitted from wavelength-converting member 4 can be received by first light-receiving element 42. Therefore, the operation state of light source device 100 can be detected by state detection circuit 1 more accurately.

Moreover, reflected light 96 is configured to pass through light-guide opening portion 50c formed in base 50 and to reach optical filter 22. At this time, an opening area of light-guide opening portion 50c may be configured to become smaller toward first light-receiving element 42. By means of such configuration, reflected light 96 is multi-reflected by a side surface of light-guide opening portion 50c and goes toward first light-receiving element 42 and thus, reflected light 96 can be led to first light-receiving element 42 efficiently.

Moreover, first optical filter 22 reflects light with a part of wavelengths in the light of reflected light 96 and transmits light with a part of the wavelengths so that the light reaches first light-receiving element 42 by using the one in which a dielectric multi-layered film is formed on a surface of glass, for example. At this time, by configuring first optical filter 22 by using the dielectric multi-layered film, wavelength dependency of transmissivity can be designed easily. In the aforementioned configuration, wavelength-converting member 4 is configured to absorb light with a wavelength of 490 nm or less and to contain a fluorescent substance radiating fluorescence with a wavelength of 490 nm to 700 nm, for example. At this time, optical filter 22 is designed to mainly transmit light with the wavelength of 490 nm or less. By means of such configuration, first light-receiving element 42 can mainly detect relative intensity of first emitted light 72 radiated from semiconductor light-emitting element 12 and scattered by wavelength-converting element 2.

Then first emitted light 72 received by first light-receiving element 42 is converted to a photo-electric current and is output from first light-receiving element 42. Then the light is voltage-converted by resistor R03, transmitted through filter circuit NF1 as signal $S_{PD1}$ which is an operation state signal, and is input into gate terminal 30G of transistor 30. At this time, signal $S_{PD1}$ input into gate terminal 30G is set such that a voltage value at which transistor 30 is brought into an on state is input as signal $S_{FET}$ when wavelength-converting element 2 is in a normal operation state. And transistor 30 is set to be turned off if a voltage of 1.5 times, for example, of a voltage value input as signal $S_{FET}$ input into gate terminal 30G of transistor 30 when the light source device is in the normal operation state is input.

In the aforementioned configuration, assume that some abnormality such as separation occurs in wavelength-converting member 4 of light source device 100 and a function of wavelength conversion in wavelength-converting member 4 is lost. In this case, a ratio of first emitted light 72 in emitted light 92 increases. In this case, since a voltage larger than predetermined is input into gate terminal 30G of transistor 30, transistor 30 is turned off, and semiconductor light-emitting device 10 is stopped. As described above, mounted substrate 160 is mounted on light source device 100, and a transistor and a light-receiving element are mounted on mounted substrate 160. Then, the semiconductor light-emitting device is connected and configured such that an operation state signal from the light-receiving element is input into the transistor and then, such a light source device can be provided which can easily stop the semiconductor light-emitting device, if abnormality occurs in the wavelength-converting member.

Moreover, in the aforementioned configuration, circuit configuration which turns on/off the semiconductor light-emitting device in accordance with a signal from the light-receiving element can be realized simply and with a smaller number of components. Therefore, an occurrence rate of a failure in the light source device caused by a failure of a component constituting the electric circuit can be lowered.

Note that, in the aforementioned configuration, an output level can be inversed by inserting amplifier AMP01 of an output inversion type into an outputter of state detection circuit 1, and transistor 30 can be changed to an n-channel enhancement type field effect transistor. By means of such configuration, in the operation state before a predetermined voltage is input into mounted substrate 160 by terminal T3, transistor 30 can be shut down, and when predetermined electricity or more is applied to anode terminal T1 or cathode terminal T2 of semiconductor light-emitting device 10, too, electricity supply to semiconductor light-emitting device 10 can be suppressed.

Moreover, in the aforementioned configuration, destruction prevention of the light source device using temperature dependency of a light amount of the emitted light of the semiconductor light-emitting device can be realized easily. In an environment where an atmospheric temperature is zero degrees or less, for example, in the semiconductor light-emitting device using a semiconductor laser, a light amount of the emitted light increases under a condition where the same current amount is applied to the semiconductor light-emitting device as compared with an environment at a room temperature, and there is a possibility of destruction by catastrophic optical damage (COD).

In the present embodiment, the semiconductor light-emitting device is protected by setting such that the semiconductor light-emitting device is stopped when a light output becomes a predetermined value or more at a predetermined environmental temperature or less, and the light source device can be operated easily when the light source device is at the predetermined temperature or more. Such application of this configuration can be made easily that the light source device is mounted as a front lamp of a vehicle, for example, so that the lamp can be lighted after warming-up.

(Variation 1 of Embodiment 1)

Subsequently, variation 1 of light source device 100 of this embodiment will be described with reference to FIG. 8. Since this variation has a substantially same configuration that of as embodiment 1, different portions will be mainly described. In this variation, a threshold value generator and a comparator are formed in an electric circuit formed on mounted substrate 160 in addition to the configuration of embodiment 1. The threshold value generator is a constant voltage circuit, for example, and can be set for each light source device, for example. As the comparator, a differential amplifier such as an op-amp can be used, for example.

Figure 8:
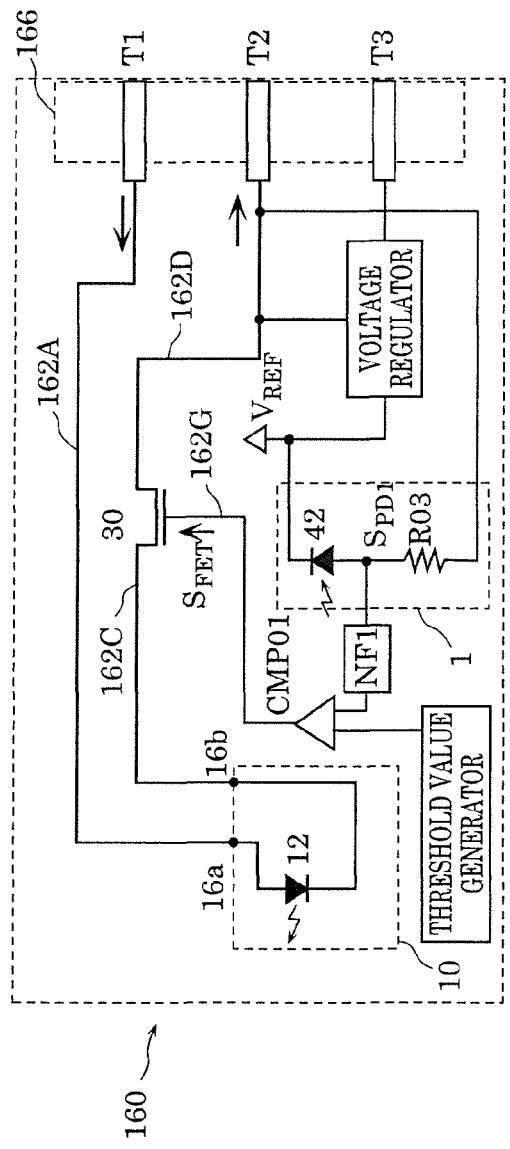
FIG. 8 is a circuit block diagram for explaining variation 1 of the light source device according to embodiment 1.

FIG. 8 is a circuit block diagram of light source device 100 according to variation 1 of embodiment 1. As illustrated in the figure, filter circuit NF1 and the threshold value generator of an outputter of the light-receiving element are connected to comparator CMP01, and the outputter is input into transistor 30.

In the aforementioned configuration, signal $S_{PD1}$ which is an operation state signal correlated with intensity of emitted light radiated from wavelength-converting member 4 detected by the light-receiving element and an output value in the threshold value generator are compared in the comparator. At this time, output value $S_{FET}$ in proportion to a difference obtained by subtracting signal $S_{PD1}$ from the output value in the threshold value generator is input into transistor 30. At this time, by designing such that transistor 30 is turned on when signal $S_{FET}$ is a predetermined value or less, abnormality such as separation in wavelength-converting member 4 occurs and an abnormal increase of first emitted light in emitted light 92 of light source device 100 can be detected, and transistor 30 can be stopped. That is, transistor 30 is controlled on the basis of a comparison result obtained by comparing the operation state signal and a reference value determined in advance. In this case, since an output from first light-receiving element 42 can be directly input into the transistor, if abnormality occurs in the light source device, radiation of abnormal light from the light source device can be stopped at a high speed.

Moreover, in the aforementioned configuration, circuit configuration which turns on/off the semiconductor light-emitting device in accordance with an operation state signal from the light-receiving element of the operation state detection circuit can be realized simply and with a smaller number of components. Therefore, an occurrence rate of a failure in the light source device caused by a failure of a component constituting the electric circuit can be lowered.

Moreover, in the aforementioned configuration, a reference value of a voltage which is a threshold value of the threshold value generator may be set freely by changing a constant of a circuit component constituting the threshold value generator. By means of such configuration, an optimal threshold value can be set for each light source device, for example.

Moreover, the threshold value may be changed to different values for each time or external environment by constituting the threshold value generator by using a microcontroller. That is, the microcontroller mounted on the mounted substrate may control the operation of the semiconductor light-emitting device on the basis of the operation state signal. By means of such configuration, an optimal voltage reference value of the threshold value generator accompanying a lowered output of the semiconductor light-emitting device caused by a temperature change and aging of the light source device can be set, for example. As a result, more accurate abnormality determination can be made and turning on/off of the semiconductor light-emitting device can be performed in accordance with the operation state of the light source device.

(Variation 2 of Embodiment 1)

Subsequently, variation 2 of light source device 100 of this embodiment will be described with reference to FIG. 9.

Figure 9:
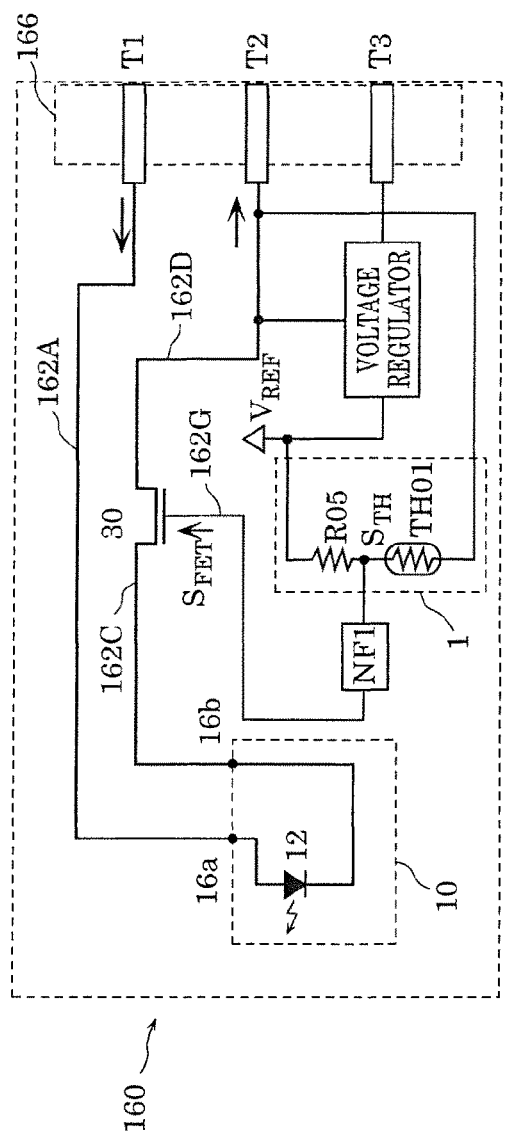
FIG. 9 is a circuit block diagram for explaining variation 2 of the light source device according to embodiment 1.

FIG. 9 is a circuit block diagram for explaining light source device 100 according to variation 2 of embodiment 1. Since this variation has a substantially same configuration as that of embodiment 1, different portions will be mainly described. This variation is different in a point that state detection circuit 1 is constituted by using temperature detection element THO1 which is a thermistor, for example. At this time, as temperature detection element THO1, a positive temperature coefficient (PTC) thermistor whose resistance value rises with a temperature rise is used, for example. And temperature detection element THO1 may be mounted on mounted substrate 160 in the vicinity of semiconductor light-emitting device 10 as illustrated in FIG. 1. By means of such configuration, when a temperature of the light source device rises higher than the reference value, transistor 30 is turned off, and deterioration of semiconductor light-emitting element 12 caused by the temperature rise can be suppressed. In the aforementioned configuration, a negative temperature coefficient (NTC) thermistor whose resistance value lowers with the temperature rise may be used as the thermistor. In this case, by configuring state detection circuit 1 in which an inverter is connected to an outputter of the thermistor, a light source device having the same function as the aforementioned configuration can be configured easily. Moreover, a platinum resistance thermometer or a thermocouple may be used in configuration of a temperature detection element.

Note that, in this variation, the threshold value generator and the comparator may be disposed in the electric circuit similarly to variation 1, and a result of comparison between the operation state signal from state detection circuit 1 and the voltage which is a reference value generated by the threshold value generator may be used as an input signal to transistor 30. As a result, the operation state of the light source device can be determined more accurately, and transistor 30 can be turned on/off.

(Variation 3 of Embodiment 1)

Subsequently, variation 3 of light source device 100 of this embodiment will be described with reference to FIG. 10.

Figure 10:
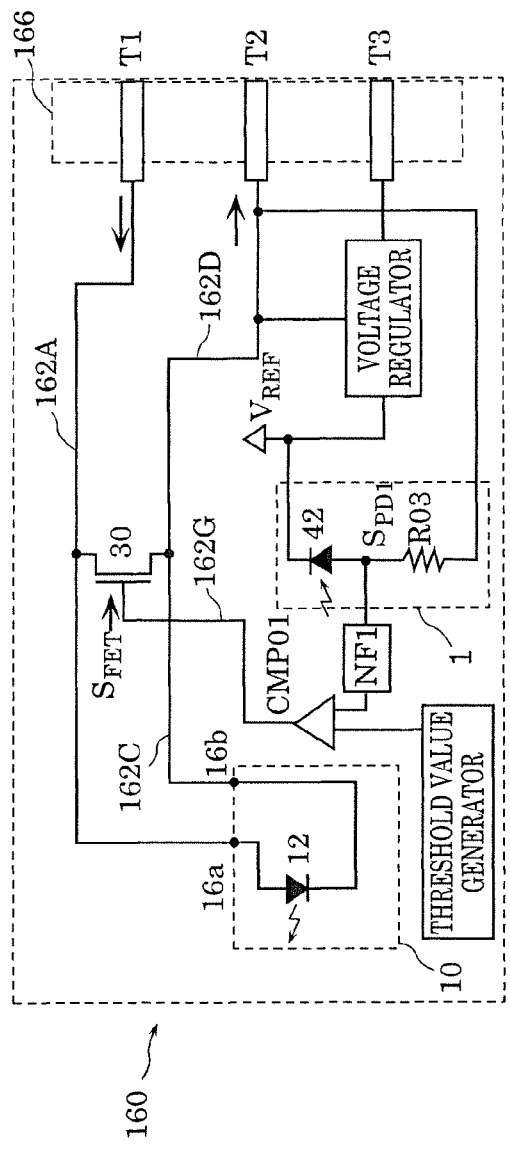
FIG. 10 is a circuit block diagram for explaining variation 3 of the light source device according to embodiment 1.

FIG. 10 is a circuit block diagram for explaining light source device 100 according to variation 3 of embodiment 1. Since this variation has a substantially same configuration as those of embodiment 1 and variation 2, different portions will be mainly described. This variation is different in a point that transistor 30 is connected in parallel with semiconductor light-emitting device 10. In this case, as transistor 30, an enhanced type, that is, a normally-off type field effect transistor which is not operated when the voltage is not applied to the gate is used.

By means of such configuration, electricity input from terminals T1 and T2 of the external connecting member is input into semiconductor light-emitting device 10 during a normal operation, and semiconductor light-emitting element 12 of semiconductor light-emitting device 10 emits light. However, if separation of wavelength-converting member 4 of light source device 100 or the like occurs, and reflected light larger than the reference value is incident to first light-receiving element 42, a photo-electric current output from first light-receiving element 42 becomes larger and as a result, signal $S_{PD1}$ output form state detection circuit 1 becomes larger, and transistor 30 is turned on. As a result, electricity is not supplied to semiconductor light-emitting device 10 anymore and thus, light emission of semiconductor light-emitting element 12 can be stopped.

By using this variation as above, if abnormality occurs in the light source device, light emission of the light source device can be stopped at a high speed. Moreover, in this variation, when the light source device is normally operated, the electric current flows through semiconductor light-emitting device 10, while the electric current does not flow through transistor 30. Therefore, as compared with the case where the transistor is connected in series, power consumption of the transistor in the normal operation state can be reduced and thus, power consumption of the light source device can be reduced.

(Variation 4 of Embodiment 1)

Subsequently, variation 4 of light source device 100 of this embodiment will be described with reference to FIG. 11.

Figure 11:
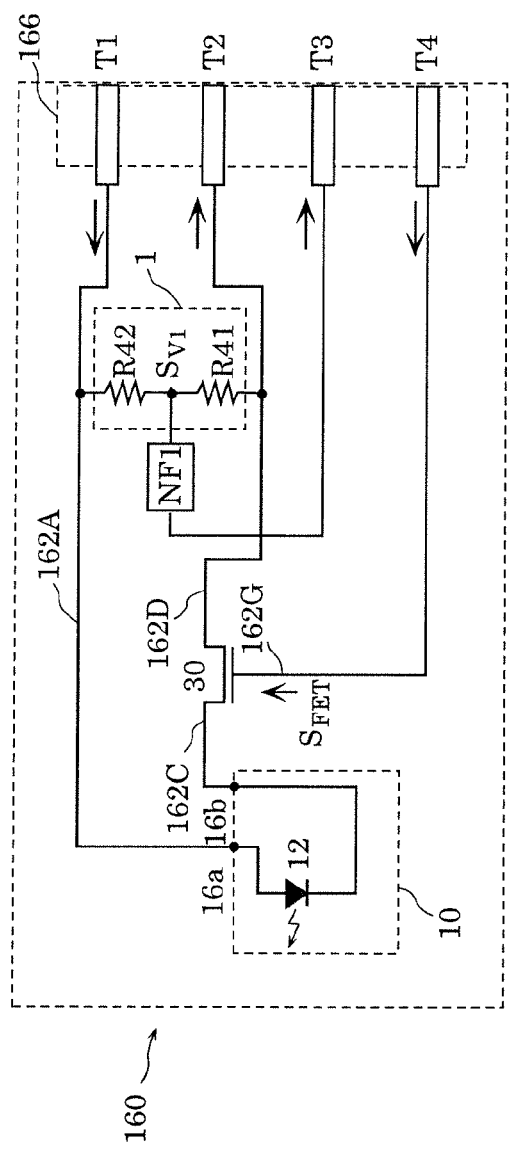
FIG. 11 is a circuit block diagram for explaining variation 4 of the light source device according to embodiment 1.

FIG. 11 is a circuit block diagram for explaining light source device 100 according to variation 4 of embodiment 1. Since this variation has a substantially same configuration as that of embodiment 1, different portions will be mainly described.

In this variation, the external connecting member has four terminals, that is, terminal T1, terminal T2, terminal T3, and terminal T4. Moreover, state detection circuit 1 is constituted by resistors R41 and R42 connected to printed wiring 162A connected to the anode side of semiconductor light-emitting device 10 and printed wiring 162D connected to the cathode side through transistor 30.

In this embodiment, resistors R41 and R42 which are a part of the operation state detection circuit are connected in series, and signal $S_{V1}$ which is the operation state signal is output from a connection portion of resistors R41 and R42. By means of such configuration, state detection circuit 1 outputs signal $S_{V1}$ which is a partial pressure correlated with the operation voltage applied between the anode and the cathode of semiconductor light-emitting device 10 by sufficiently lowering on-resistance of transistor 30. In this variation, signal $S_{V1}$ is output to an external circuit (not shown) from terminal T3 of light source device 100 through filter circuit NF1. Then, it can be determined in the external circuit whether a predetermined voltage is applied to semiconductor light-emitting device 10.

Moreover, the gate of transistor 30 of light source device 100 is connected to terminal T4 of external connecting member 166 by printed wiring 162G. Terminal T4 is connected to the external circuit (not shown) similarly to terminal T3. By means of such configuration, the external circuit can make a determination by signal $S_{V1}$ which is the operation state signal of the operation state of light source device 100 and input signal $S_{FET}$ which controls the semiconductor light-emitting device to light source device 100 by using the result.

Signal $S_{FET}$ is input into the gate of transistor 30 provided in light source device 100 through printed wiring 162G. At this time, if transistor 30 is to be operated by using an enhancement type field effect transistor, 5 V is input, for example, as signal $S_{FET}$, while if transistor 30 is not to be operated, 0 V is input, for example, as signal $S_{FET}$. As a result, semiconductor light-emitting device 10 can be switched to the operation state or to the non-operation state at a high speed. More specifically, if semiconductor light-emitting element 12 is destroyed in a short-circuit mode, a signal at a predetermined voltage or less is output as signal $S_{V1}$. In this case, by immediately stopping the operation of semiconductor light-emitting element 12, excessive heat generation of semiconductor light-emitting element 12 and deterioration of devices around light source device 100 can be prevented.

Moreover, semiconductor light-emitting element 12 has a characteristic that internal resistance increases with a temperature drop. Moreover, as described above, under a condition that the same electric current amount is applied to the semiconductor light-emitting device, when an environmental temperature lowers, a light amount of the emitted light increases, and a possibility of destruction by catastrophic optical damage increases. Therefore, by monitoring signal $S_{V1}$, the internal resistance of semiconductor light-emitting element 12 is detected, and if the voltage falls to a predetermined value or less, semiconductor light-emitting device 10 can be stopped by using transistor 30. That is, the increase in the light amount of the emitted light using temperature dependency of the internal resistance of semiconductor light-emitting element 12 can be suppressed.

(Variation 5 of Embodiment 1)

Subsequently, variation 5 of light source device 100 of this embodiment will be described with reference to FIG. 12.

Figure 12:
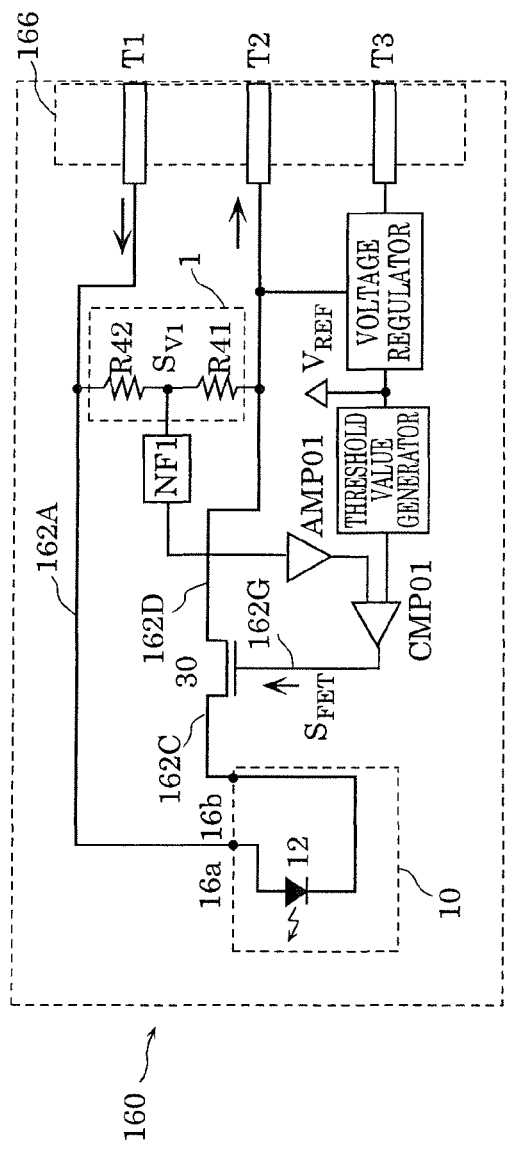
FIG. 12 is a circuit block diagram for explaining variation 5 of the light source device according to embodiment 1.

FIG. 12 is a circuit block diagram for explaining light source device 100 according to variation 5 of embodiment 1. Since this variation has a substantially same configuration as that of variation 4, different portions will be mainly described.

In this variation, external connecting member 166 is constituted by three terminals, that is, terminal T1, terminal T2, and terminal T3. Moreover, signal $S_{V1}$ which is the operation state signal generated in state detection circuit 1 is converted by amplifier AMP01 mounted on mounted substrate 160 of light source device 100 and then, input into comparator CMP01. Then, electricity input from terminal T3 of external connecting member 166 and the reference value of the voltage generated by the voltage regulator and the threshold value generator are compared. If the signal at the reference value or more is input into comparator CMP01 from state detection circuit 1, transistor 30 is turned off, and the operation of semiconductor light-emitting device 10 is stopped.

By means of the aforementioned configuration, similarly to variation 4, the voltage applied to semiconductor light-emitting device 10 can be detected, and if it is determined to be an abnormal operation state, semiconductor light-emitting device 10 can be stopped at a high speed. Moreover, in this variation, the operation state of light source device 100 can be detected on mounted substrate 160 of light source device 100 and transistor 30 can be operated by using the comparator mounted on the same mounted substrate as state detection circuit 1 and thus, the operation can be performed more accurately and at a high speed.

(Variation 6 of Embodiment 1)

Subsequently, variation 6 of light source device 100 of this embodiment will be described with reference to FIG. 13.

Figure 13:
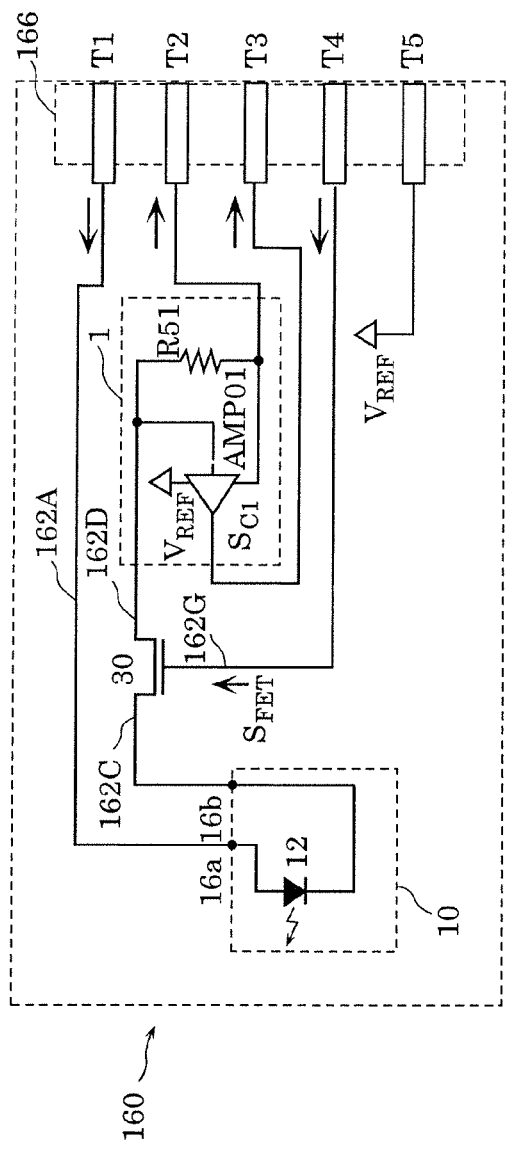
FIG. 13 is a circuit block diagram for explaining variation 6 of the light source device according to embodiment 1.

FIG. 13 is a circuit block diagram for explaining light source device 100 according to variation 6 of embodiment 1. Since this variation has a substantially same configuration as that of embodiment 1, different portions will be mainly described.

In this variation, the external connecting member has five terminals, that is, terminal T1, terminal T2, terminal T3, terminal T4, and terminal T5. Moreover, state detection circuit 1 includes sense resistor R51 having 0.1 ohm, for example, and disposed on printed wiring 162D. And voltages on both ends of sense resistor R51 are input into amplifier AMP01. And signal $S_{C1}$ which is an output signal of amplifier AMP01 is an operation state signal related to an operation current applied to semiconductor light-emitting device 10 of light source device 100 and is output to an external circuit (not shown) from terminal T3 of external connecting member 166 in this variation. At this time, amplifier AMP01 is operated by reference value $V_{REF}$ of the voltage input from terminal T5. Then, it can be determined in the external circuit whether a predetermined electric current is applied to semiconductor light-emitting device 10.

Moreover, the gate of transistor 30 of light source device 100 is connected to terminal T4 of external connecting member 166 by printed wiring 162G. Terminal T4 is connected to the external circuit similarly to terminal T3. By means of such configuration, the external circuit can determine the operation state of light source device 100 by signal $S_{C1}$ and can output signal $S_{FET}$ which controls the semiconductor light-emitting device of light source device 100 by using the result. More specifically, if a predetermined voltage or more is applied to sense resistor R51, a predetermined electric current or more is applied to semiconductor light-emitting device 10. In this case, since an excessive electric current is applied to semiconductor light-emitting device 10, a light amount of the emitted light increases, and a possibility of destruction by catastrophic optical damage increases. Therefore, a destruction risk of semiconductor light-emitting device 10 can be detected, and transistor 30 can be controlled by using signal $S_{C1}$ which is the operation state signal output from state detection circuit 1.

Signal $S_{FET}$ is input into the gate of transistor 30 provided in light source device 100 through printed wiring 162G. An enhancement type field effect transistor is used as transistor 30. And if transistor 30 is to be operated, 5 V is input, for example, as signal $S_{FET}$, while if transistor 30 is not to be operated, 0 V is input, for example, as signal $S_{FET}$. At this time, since transistor 30 mounted on the same mounted substrate as state detection circuit 1 can be operated, semiconductor light-emitting device 10 can be switched to the operation state or to the non-operation state at a high speed.

(Variation 7 of Embodiment 1)

Subsequently, variation 7 of light source device 100 of this embodiment will be described with reference to FIG. 14.

Figure 14:
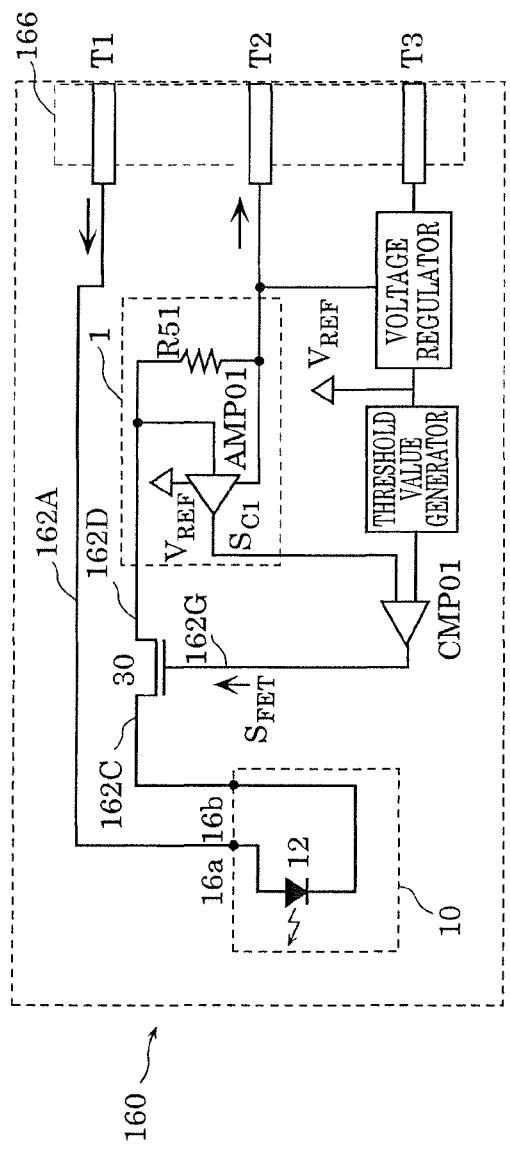
FIG. 14 is a circuit block diagram for explaining variation 7 of the light source device according to embodiment 1.

FIG. 14 is a circuit block diagram for explaining light source device 100 according to variation 7 of embodiment 1. Since this variation has a substantially same configuration as that of variation 6, different portions will be mainly described.

In this variation, the external connecting member has three terminals, that is, terminal T1, terminal T2, and terminal T3. Moreover, signal $S_{C1}$ generated in state detection circuit 1 is input into comparator CMP01 mounted on mounted substrate 160 of light source device 100. Then, the electricity input from terminal T3 of external connecting member 166 and the reference value of the voltage generated by the voltage regulator and the threshold value generator are compared in comparator CMP01. And if a signal of the reference value or more is input from state detection circuit 1 to comparator CMP01, transistor 30 is turned off, and the operation of semiconductor light-emitting device 10 is stopped.

By means of the aforementioned configuration, similarly to variation 6, the electric current applied to semiconductor light-emitting device 10 can be detected, and if it is determined to be an abnormal operation state, semiconductor light-emitting device 10 can be stopped at a high speed. Moreover, in this variation, the operation state of light source device 100 can be detected on mounted substrate 160 of light source device 100, and transistor 30 mounted on the same mounted substrate as state detection circuit 1 can be operated and thus, operation can be performed at a higher speed.

(Variation 8 of Embodiment 1)

Subsequently, variation 8 of light source device 100 of this embodiment will be described with reference to FIG. 15.

Figure 15:
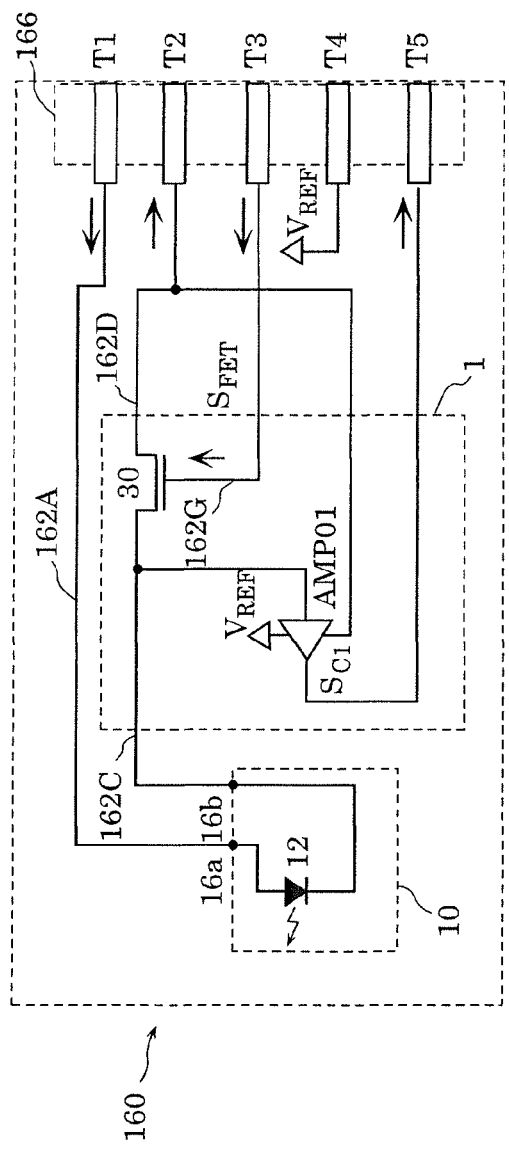
FIG. 15 is a circuit block diagram for explaining variation 8 of the light source device according to embodiment 1.

FIG. 15 is a circuit block diagram for explaining light source device 100 according to variation 8 of embodiment 1. Since this variation has a substantially same configuration as that of embodiment 6, different portions will be mainly described.

In this variation, the external connecting member has five terminals, that is, terminal T1, terminal T2, terminal T3, terminal T4, and terminal T5. Moreover, state detection circuit 1 has transistor 30 itself. And transistor 30 serves also as a sense resistor which detects an electric current applied to semiconductor light-emitting device 12. More specifically, a voltage applied between a drain and a source of transistor 30 is detected and input into amplifier AMP01. Signal $S_{C1}$ output from amplifier AMP01 is output to an external circuit (not shown) from terminal T3 of external connecting member 166. At this time, amplifier AMP01 is operated by reference value $V_{REF}$ of the voltage input from terminal T5. And the external circuit can determine whether the predetermined electric current is applied to semiconductor light-emitting device 10.

Moreover, the gate of transistor 30 of light source device 100 is connected to terminal T3 of external connecting member 166 by printed wiring 162G. Terminal T4 is connected to the external circuit similarly to terminal T3. By means of such configuration, the external circuit can determine the operation state of light source device 100 by signal $S_{C1}$ and can output signal $S_{FET}$ which controls the semiconductor light-emitting device of light source device 100 by using the result.

By means of the aforementioned configuration, mounted substrate 160 of light source device 100 can be configured more easily and semiconductor light-emitting device 10 can be switched to the operation state or to the non-operation state at a high speed by using transistor 30 mounted on the same mounted substrate as state detection circuit 1.

(Variation 9 of Embodiment 1)

Subsequently, variation 9 of light source device 100 of this embodiment will be described with reference to FIG. 16 and FIG. 17.

Figure 16:
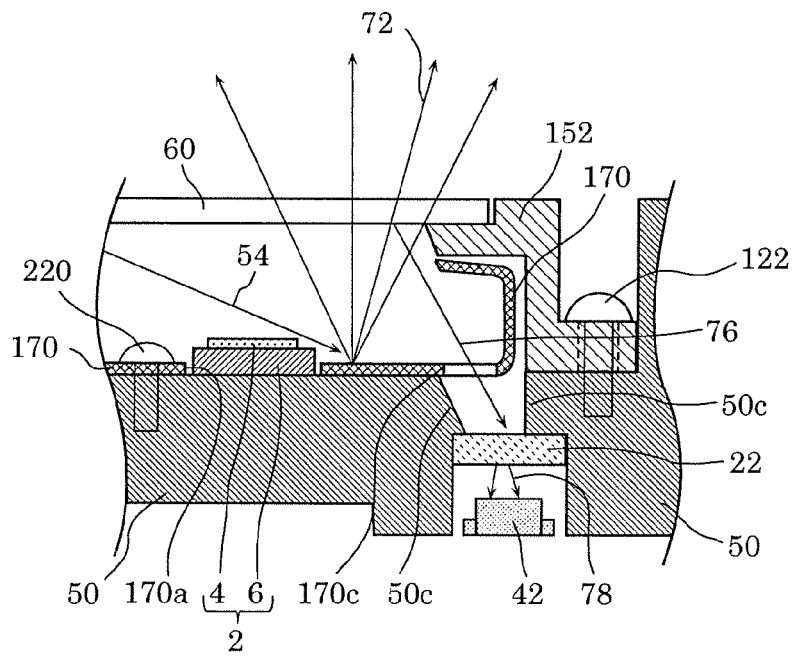
FIG. 16 is a schematic partial sectional view for explaining variation 9 of the light source device according to embodiment 1.
Figure 17:
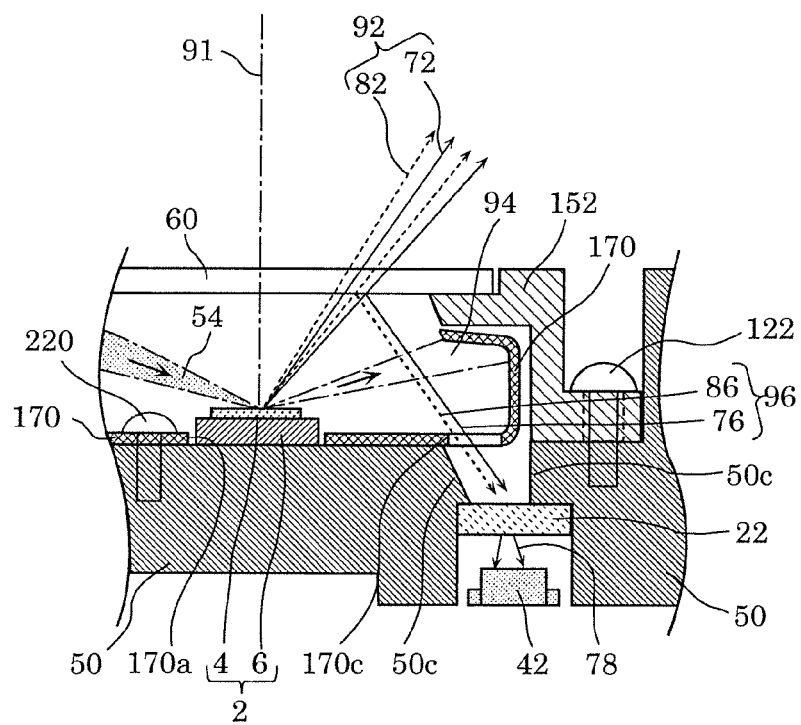
FIG. 17 is a schematic partial sectional view for explaining variation 9 of the light source device according to embodiment 1.

FIG. 16 and FIG. 17 are schematic partial sectional views of light source device 100 according to variation 9 of embodiment 1. Though the configuration of light source device 100 is the same in FIG. 16 and FIG. 17, an irradiation position of propagated light 54 is different. FIG. 16 illustrates a state where some abnormal state occurs in a structure of light source device 100, and propagated light 54 is not irradiated to wavelength-converting member 4, and FIG. 17 illustrates a state where light source device 100 is operated in a normal state. Since this variation has a substantially same configuration as that of embodiment 1, different portions will be mainly described.

In this variation, base 50 in the vicinity of wavelength-converting member 4 is covered by base cover 170 which is a plate-shaped metal component. Base cover 170 may be constituted by metal such as aluminum alloy, stainless, and the like. Base cover 170 is fixed to base 50 by screw 220.

Base cover 170 may have irregularity formed on a surface. More specifically, base cover 170 is molded by press working a metal plate and is manufactured by forming irregularity on the surface by blast working and the like. And with regard to a size of the irregularity, arithmetic mean roughness Ra is configured to be 0.5 μm or more which is a wavelength or more of emitted light radiated from semiconductor light-emitting element 12. Moreover, opening portion 170a is formed in base cover 170, and opening portion 170a is disposed so as to surround wavelength-converting member 4. By means of such configuration, as illustrated in FIG. 16, if a position of reflection optical element 20b of light source device 100 is dislocated, and propagated light 54 having a wavelength of the emitted light radiated from semiconductor light-emitting element 12 is irradiated to a spot other than wavelength-converting member 4, propagated light 54 is irradiated to the surface of base cover 170. At this time, since irregularity is formed on the surface of base cover 170, propagated light 54 becomes scattered emitted light 72. At this time, emitted light 72 is not a light having light intensity in a specific direction but is a light having light intensity in a direction toward entire light transmitting member 60. Therefore, a part of emitted light 72 is reflected by light transmitting member 60, passes through optical filter 22, and can be detected by first light-receiving element 42 of state detection circuit 1. Therefore, the operation state of the light source device can be detected by state detection circuit 1, and the semiconductor light-emitting device can be controlled by using transistor 30. Moreover, base cover 170 may surround light-guide opening portion 50c, and a light shielding portion (opening portion 170c) which shields a part of the opening portion of light-guide opening portion 50c is provided. By means of such configuration, as illustrated in FIG. 17, a light amount of emitted light 94 can be adjusted by the light shielding portion (opening portion 170c). At this time, optical filter 22 is designed so as to mainly transmit light at a wavelength of 490 nm or less. By means of such configuration, light-receiving element 42 can mainly detect relative intensity of first emitted light 72 radiated from semiconductor light-emitting element 12 and scattered by wavelength-converting elements 2.

Moreover, base cover 170 may be configured to cover a side surface of holding member 152. By means of such configuration, emitted light 94 generated by reflecting propagated light 54 by wavelength-converting member 4 can be irradiated to the surface of base cover 170 and be scattered. As a result, such a state that emitted light 94 having directivity is reflected in a specific direction and emitted from light transmitting member 60, and emitted light 92 becomes a light having intensity distribution stronger in a specific direction can be further suppressed.

Moreover, base cover 170 may be configured to be bent having an angled U-shape so as to cover a surface side on base 50 side of light transmitting member 60 as illustrated in FIG. 17. By means of such configuration, emission of emitted light 94 from light transmitting member 60 of light source device can be suppressed.

Embodiment 2

Subsequently, light source device 100 according to embodiment 2 of the present disclosure will be described. Since the light source device of this embodiment has a substantially same configuration as that of embodiment 1, different portions will be mainly described.
(Configuration of Light Source Device)

A configuration of light source device 200 according to embodiment 2 will be described with reference to FIG. 18 and FIG. 19.

Figure 18:
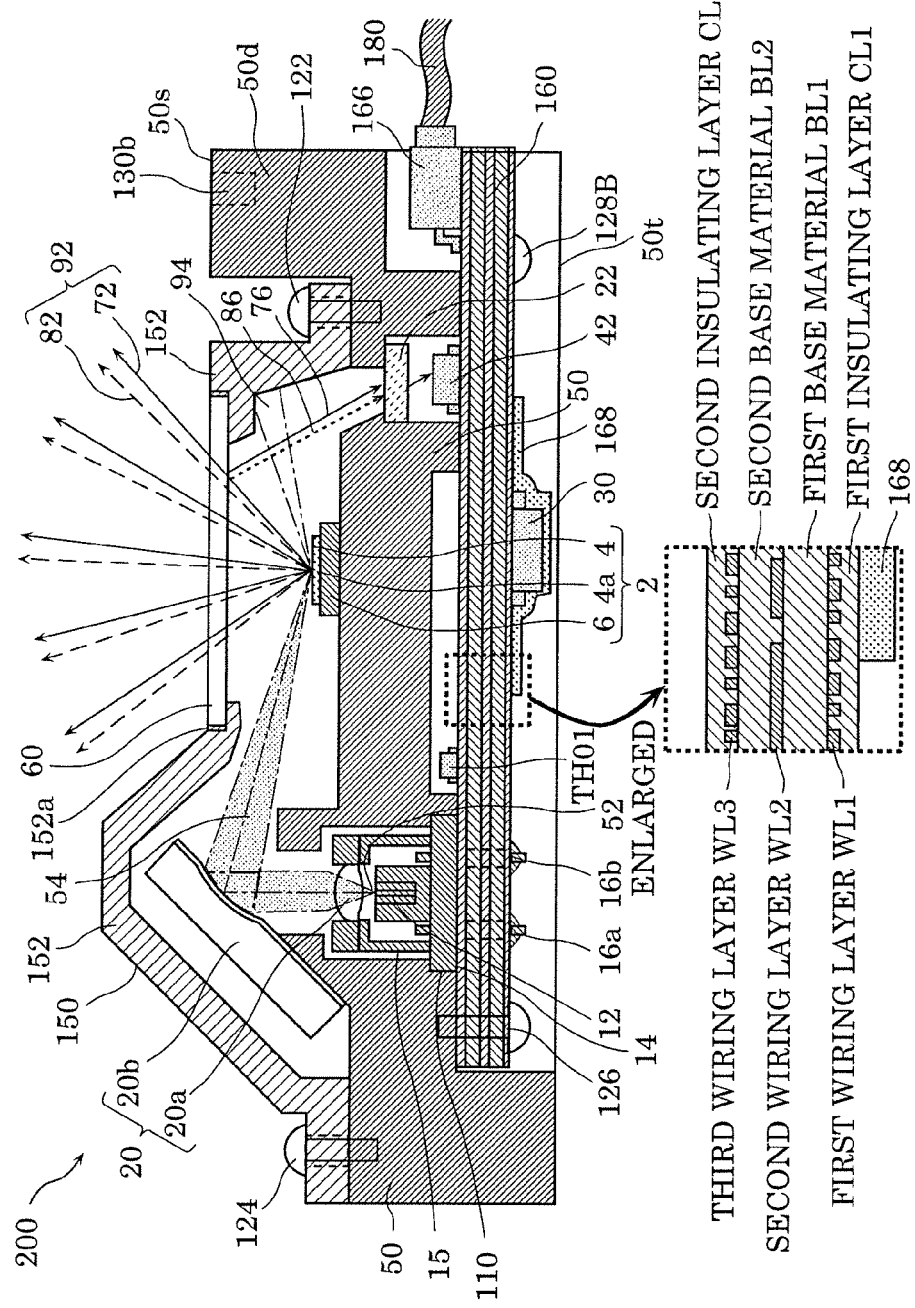
FIG. 18 is a schematic sectional view for explaining a light source device according to embodiment 2.

FIG. 18 is a schematic sectional view illustrating a configuration of light source device 200 according to embodiment 2. Note that, in FIG. 18, a partial enlarged sectional view of mounted substrate 160 is also illustrated. FIG. 19 is a schematic diagram for explaining a configuration of the mounted substrate of light source device 200 according to embodiment 2.

Light source device 200 according to this embodiment is different from embodiment 1 mainly in a configuration of semiconductor light-emitting device 10, lens 20a, mounted substrate 160, and light transmitting member 60. In this embodiment, all the electric circuits described in embodiment 1 can be applied as a circuit configuration mounted on the mounted substrate, but description will be made with reference to the one to which a circuit block diagram of variation 1 illustrated in FIG. 8 is applied as a typical example.

In light source device 200 illustrated in FIG. 18, in semiconductor light-emitting device 110, semiconductor light-emitting element 12 which is a semiconductor laser is mounted on TO-CAN type package 14, for example, similarly to embodiment 1, and metal can 15 to which lens 20a which is a collimator lens is fixed is mounted to package 14, for example. That is, semiconductor light-emitting device 110 has a function of lens 20a in embodiment 1. Thus, emitted light 54 which is substantially a parallel light is emitted from semiconductor light-emitting device 110.

Moreover, in this embodiment, mounted substrate 160 is a multi-layered substrate having three wiring layers. As a specific configuration, as illustrated in an enlarged sectional view of mounted substrate 160 on a lower part of FIG. 18, first wiring layer WL1, first base material BL1, second wiring layer WL2, second base material BL2, and third wiring layer WL3 are laminated alternately. And an uppermost surface is covered partially or wholly by first insulating layer CL1 and second insulating layer CL2.

In this embodiment, state detection circuit 1, a voltage regulator, a threshold value generator, a comparator, and transistor 30 are mounted on mounted substrate 160. By means of such configuration, abnormality of a component related to a light emitting function of the light source device can be detected by state detection circuit 1, and the detected signal can be calculated. Moreover, light source device 200 can be dimmed or extinguished by using transistor 30 or an external driving circuit (not shown) by using the signal. At this time, state detection circuit 1 can be configured by using a light-receiving element, a temperature detection element, and a resistor as in embodiment 1 and the variations.

Figure 19:
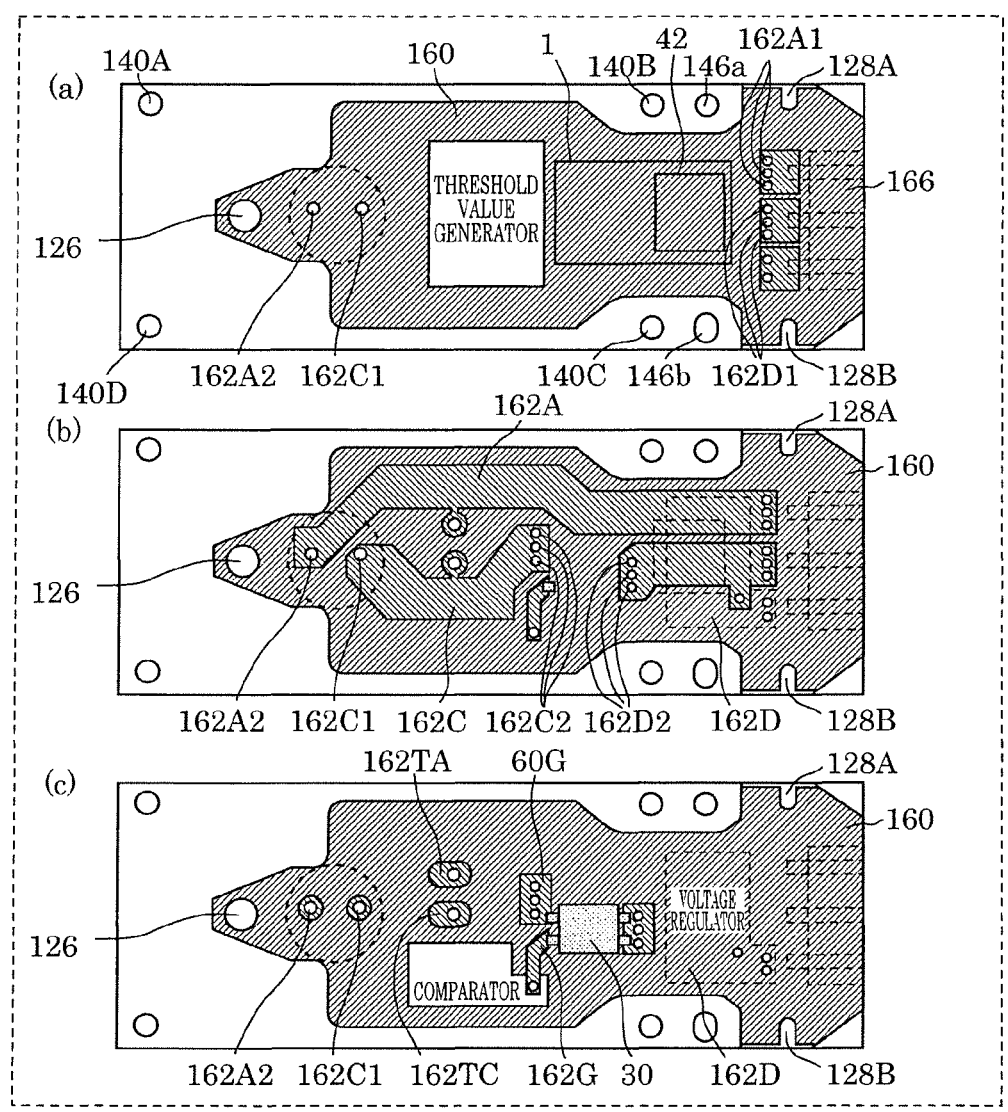
FIG. 19 is a view for explaining a configuration of the mounted substrate of the light source device according to embodiment 2.

(a), (b), and (c) in FIG. 19 are schematic diagrams of wiring layout examples formed on the three wiring layers of mounted substrate 160, that is, first wiring layer WL1, second wiring layer WL2, and third wiring layer WL3 seen from first surface 50t. (a) in FIG. 19 illustrates third wiring layer WL3, (b) in FIG. 19 illustrates second wiring layer WL2, and (c) in FIG. 19 illustrate first wiring layer WL1. Printed wirings 162A, 162C, and 162D each having a large wiring width are formed on mounted substrate 160 in order to apply a large electric current of 3 amperes, for example, to semiconductor light-emitting device 10 and most of their patterns are formed at a center layer of the three wiring layers, that is, on second wiring layer WL2.

By means of such configuration, a wide pattern with a large electric current used for a semiconductor light-emitting device can be disposed on the mounted substrate easily while a size of the mounted substrate is maintained compact. Moreover, the mounted substrate can be formed without forming a large number of wires with a small wiring width on an inner wiring layer, that is, second wiring layer WL2, for example. Thus, first base material BL1 and second base material BL2 joined to second wiring layer WL2 can be suppressed to join to a surface with many irregularities. Thus, separation between the wiring layer and the base material or more specifically of second wiring layer WL2 from first base material BL1 and second base material BL2 can be suppressed.

In mounted substrate 160, printed wiring 162A is used as wiring for an anode of semiconductor light-emitting device 10, printed wiring 162C and 162D are used as wiring for a cathode of semiconductor light-emitting device 10, and most of them is formed on second wiring layer WL2. Between printed wiring 162C and 162D, transistor 30 which is a field effect transistor is connected, for example, and semiconductor light-emitting device 10 and transistor 30 are connected in series. At this time, since transistor 30 is mounted on a surface on the first wiring WL1 side of mounted substrate 160, a part of printed wiring 162C and 162D is formed on first wiring layer WL1 by via wiring 162C2 and 162D2. Moreover, since external connecting member 166 which is a connector, for example, is mounted on a surface on third wiring WL3 side of mounted substrate 160, parts of printed wiring 162A which is an anode line and printed wiring 162C which is a cathode line are formed on third wiring layer WL3 by via wiring 162A1 and 162D1. Moreover, via wiring 162A2 and 162C1 in which through holes through which lead pins 16a and 16b of semiconductor light-emitting device 10 are inserted are formed are formed on mounted substrate 160 and soldered with lead pins 16A and 16C of semiconductor light-emitting device 10 and electrically connected.

As described above, a main pattern of printed wiring connected to the anode terminal and the cathode terminal of semiconductor light-emitting device 10 does not have via wiring other than connection with semiconductor light-emitting device, the external connecting member, and the transistor disposed. By means of this configuration, low-impedance wiring can be realized.

Light-collecting optical member 20 of light source device 200 of this embodiment is constituted by lens 20a and reflection optical element 20b of semiconductor light-emitting device 110. And wavelength-converting element 2 which converts propagated light 54 emitted from semiconductor light-emitting element 12 to emitted light 92 is fixed to base 50. Moreover, light-collecting optical member 20 and wavelength-converting member 4 are covered by cover unit 150 including light transmitting member 60 and holding member 152 similarly to embodiment 1. At this time, light transmitting member 60 may be covered by a water-repellent film on the surface.

In light source device 200 with the aforementioned configuration, propagated light 54 emitted from semiconductor light-emitting element 12 is irradiated to wavelength-converting member 4, and emitted light 92 in which first emitted light 72 and second emitted light 82 are mixed is radiated. A part of emitted light 92 is reflected by light transmitting member 60 and goes toward first light-receiving element 42.

At this time, light transmitting member 60 may be covered by the water-repellent film on the surface. Thus, if light source device 200 is exposed to an environment with high humidity and where a temperature rapidly lowers, for example, adhesion of water droplets by condensation to the surface of light transmitting member 60 and a change in the light amount of reflected light 96 going toward first light-receiving element 42 by the water droplets for a long time can be suppressed.

(Variation 1 of Embodiment 2)

Subsequently, a variation of light source device 200 of this embodiment will be described with reference to FIG. 20A.

Figure 20A:
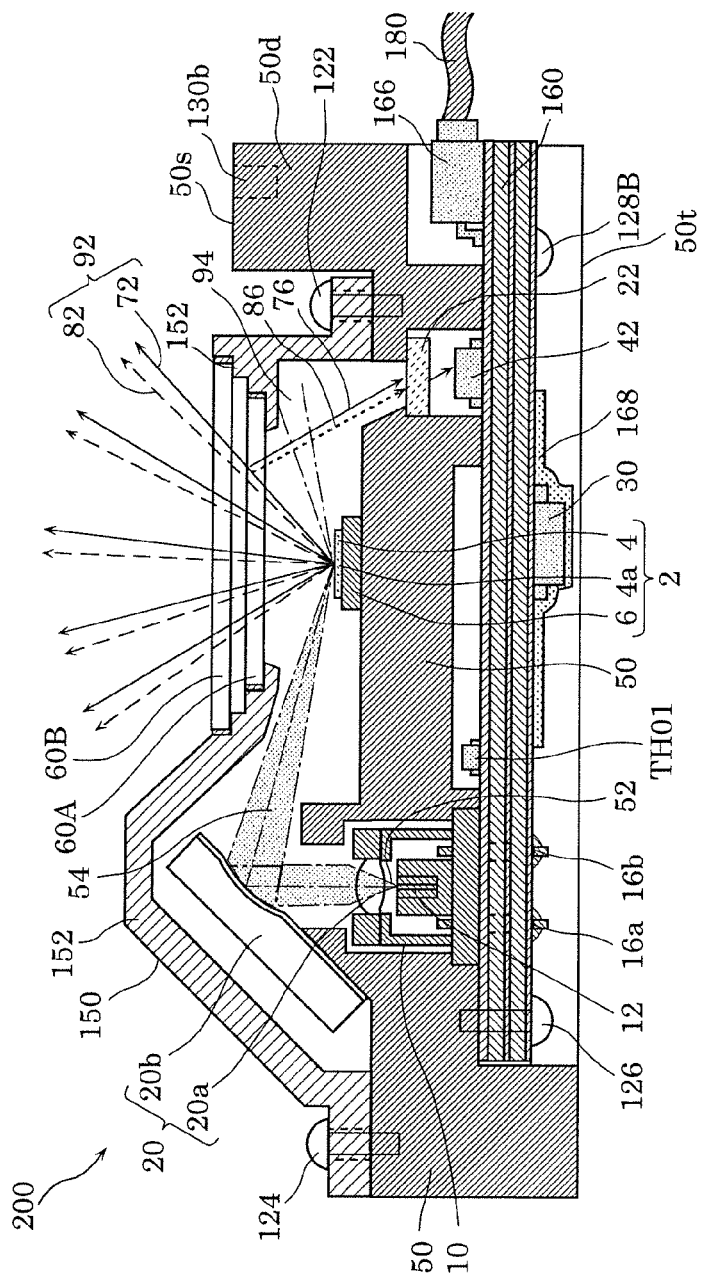
FIG. 20A is a schematic sectional view for explaining the light source device according to variation 1 of embodiment 2.

FIG. 20A is a schematic sectional view for explaining light source device 200 according to variation 1 of embodiment 2. Since this variation has a substantially same configuration as that of embodiment 2, different portions will be mainly described.

Light source device 200 according to this variation is different from light source device 200 in embodiment 2 in a configuration of cover unit 150. In this variation, in cover unit 150, a plurality of steps is formed on the opening portion of holding member 152, and a plurality of light transmitting members (glass plates) is fixed. In FIG. 20A, an example in which two sheets of light transmitting members 60A and 60B are fixed is illustrated.

By means of such configuration, since an air layer is sealed between light transmitting members 60A and 60B, even if light source device 200 is exposed to a rapid temperature change, condensation on surfaces of light transmitting members 60A and 60B can be suppressed. Particularly in this variation, since water droplets by condensation do not adhere to the surface of light transmitting member 60A of base 50 easily, a change in the light amount of reflected light 96 going toward first light-receiving element 42 by the water droplets for a long time can be suppressed.

(Variation 2 of Embodiment 2)

Subsequently, a variation of light source device 200 of this embodiment will be described with reference to FIG. 20B.

Figure 20B:
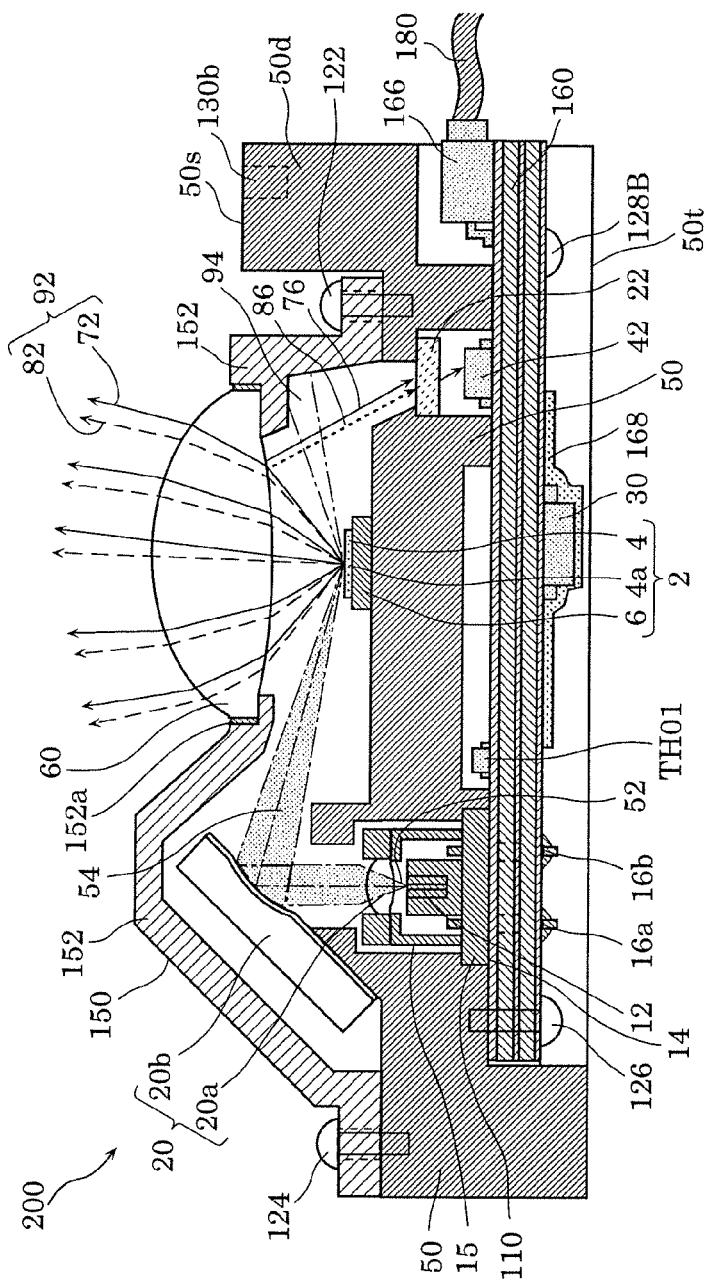
FIG. 20B is a schematic sectional view for explaining the light source device according to variation 2 of embodiment 2.

FIG. 20B is a schematic sectional view for explaining light source device 200 according to variation 2 of embodiment 2. Since this variation has a substantially same configuration as that of embodiment 2, different portions will be mainly described.

Light source device 200 according to this variation is different from light source device 200 in embodiment 2 in a configuration of cover unit 150. In this variation, in cover unit 150, light transmitting member 60 which is a light collecting lens is fixed to holding member 152. In FIG. 20B, a configuration when an aspherical lens which is a convex lens is fixed as light transmitting member 60 is illustrated.

By means of such configuration, the light collecting lens collecting emitted light 92 emitted from wavelength-converting member 4 can be disposed in the vicinity of wavelength-converting member 4 having light emitter 4a. Thus, emitted light 92 can be emitted with high optical efficiency to the outside of light source device 200 by light transmitting member 60 which is a light collecting lens. Moreover, in this variation, wavelength-converting member 4 can be covered by cover unit 150 similarly to embodiment 2 and the like. Thus, adhesion of dusts from the outside to the surface of wavelength-converting member 4 and lowering of optical characteristics of emitted light 92 can be suppressed.

Moreover, in this variation, reflected light from the surface of light transmitting member 60 which is a light collecting lens can be used as reflected light 96 going toward first light-receiving element 42. Thus, similarly to other embodiments, an operation state of wavelength-converting member can be detected by using the light-receiving element.

Embodiment 3

Hereinafter, light source device 300 according to embodiment 3 of the present disclosure will be described. In this embodiment, an operation state of a light source device or particularly wavelength-converting member 4 can be detected more accurately by using a plurality of light-receiving elements or more particularly two light-receiving elements (first light-receiving element 42 and second light-receiving element 44).

(Configuration of Light Source Device)

First, a configuration of light source device 300 according to embodiment 3 will be described with reference to FIG. 21.

Figure 21:
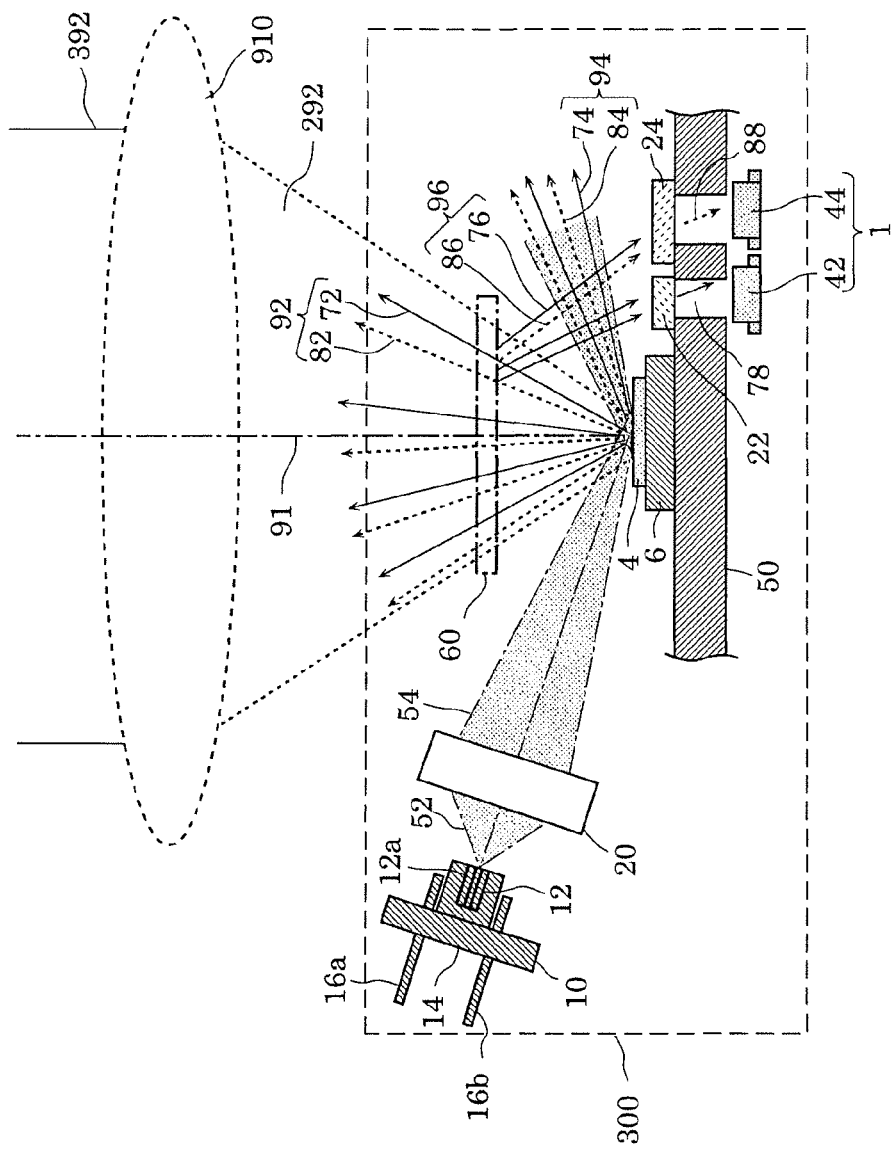
FIG. 21 is a schematic diagram for explaining a light source device according to embodiment 3.

FIG. 21 is a schematic diagram illustrating a configuration of light source device 300 according to embodiment 3. As illustrated in FIG. 21, light source device 300 includes semiconductor light-emitting device 10, wavelength-converting member 4, and state detection circuit 1. State detection circuit 1 includes first light-receiving element 42 and second light-receiving element 44, mounted on a mounted substrate, not shown, and electrically connected to the outside by an external connecting member, not shown. In this embodiment, light source device 300 further includes light-collecting optical member 20 and light transmitting member 60. In this embodiment, description will be made by using the one from which light transmitting member 18 and metal can 15 are omitted as semiconductor light-emitting device 10.

Hereinafter, an operation of light source device 300 of this embodiment will be described with reference to flowcharts in FIG. 21 and FIG. 22. Emitted light 52 which is a laser beam having a peak wavelength of 450 nm, for example, emitted from optical waveguide 12a of semiconductor light-emitting element 12 of semiconductor light-emitting device 10 is collected by light-collecting optical member 20 which is a lens, for example, and becomes propagated light 54 and is irradiated to wavelength-converting member 4. In wavelength-converting member 4, a part of propagated light 54 is reflected by wavelength-converting member 4 and emitted as first emitted light 74 emitted at an emission angle correlated with an incident angle. That is, first emitted light 74 is light with large emission azimuth dependency of light intensity. Moreover, another part of propagated light 54 is scattered by wavelength-converting member 4 and emitted as first emitted light 72 with small emission azimuth dependency of light intensity to the surface side. Here, the fact that the emission azimuth dependency of light intensity is small means light having emission azimuth dependency along Lambert reflection. That is, it is light having dependency of light intensity indicated by $\cos \theta$ with respect to an angle $\theta$ from main axis 91 which is a normal direction to the surface of wavelength-converting member 4. And a part of propagated light 54 is absorbed by a fluorescent material which is yttrium-aluminum-garnet type fluorescent element, for example, of wavelength-converting member 4, converted to fluorescence with a wavelength longer than propagated light 54, and emitted to the surface side as second emitted light 82 and 84 with smaller azimuth dependency of light intensity.

And light in which first emitted light 72 and second emitted light 82 are mixed is radiated as emitted light 92 of light source device 300. Most of emitted light 92 passes through light transmitting member 60 which is glass on which a reflection preventive film is formed on a surface, for example, and is radiated as emitted light 92 to the outside of light source device 300. At this time, emitted light 94 with large emission azimuth dependency of light intensity may be set so as not to pass through light transmitting member 60. As described above, only emitted light 92 with small emission azimuth dependency of light intensity is configured to pass through light transmitting member 60. A part of emitted light 92 emitted from light source device 300 as above is irradiated to the outside as illumination light from a light projecting device constituted by light source device 300 and light projecting optical member 910 as emitted light 392 which is substantially a parallel light in light projecting optical member 910 which is a projection lens, for example.

On the other hand, a part of emitted light 92 is reflected by light transmitting member 60 and goes toward base 50 side as reflected light 96. Reflected light 96 is configured by first reflected light 76 which is light having the same wavelength as propagated light 54 and second reflected light 86 made of fluorescence generated in wavelength-converting member 4. A part of reflected light 96 goes toward first optical filter 22. And another part of reflected light 96 goes toward second optical filter 24. The light having passed through first optical filter 22 and second optical filter 24 becomes first emitted light 78 and second emitted light 88 which is light in which light with a part of wavelengths of reflected light 96 is cut, and is incident to first light-receiving element 42 and second light-receiving element 44.

Here, first optical filter 22 is an optical filter which transmits light with a wavelength less than 490 nm and reflects light with a wavelength of 490 nm or more, for example. That is, first optical filter 22 is an optical filter which transmits most of the light with a wavelength of propagated light 54 emitted from semiconductor light-emitting device 10 and reflects most of the light with a spectrum of second emitted light 82 generated in wavelength-converting element 2.

Second optical filter 24 is an optical filter which reflects light with a wavelength less than 490 nm and transmits light with a wavelength of 490 nm or more, for example. That is, second optical filter 24 is an optical filter which reflects most of the light with a wavelength of excitation light 54 emitted from semiconductor light-emitting device 10 and transmits most of the light with a spectrum of second reflected light 86 which is fluorescence generated in wavelength-converting element 2.

In reflected light 96 incident to first optical filter 22, only a component of first reflected light 76 which is substantially scattered light transmits through first optical filter 22 and is received by first light-receiving element 42. In reflected light 96 incident to second optical filter 24, only a component of second reflected light 86 which is substantially fluorescence transmits through second optical filter 24 and is received by second light-receiving element 44.

In the aforementioned configuration, the light incident to light transmitting member 60 from wavelength-converting member 4 is configured to be only emitted light 92 with small emission azimuth dependency of light intensity, and emitted light 94 with large emission azimuth dependency is not incident. By means of such configuration, the light with stable distribution of light intensity is incident to the light-receiving element from wavelength-converting member 4. Thus, when the light source device is in a normal operation state, the light intensity of the emitted light incident to the light-receiving element can be detected with accuracy. Therefore, a slight change in the light intensity of the emitted light emitted from wavelength-converting member 4, generated by occurrence of abnormality in wavelength-converting member 4 can be detected with accuracy.

As described above, abnormal deterioration of the wavelength-converting member can be accurately detected by the light-receiving element by using light source device 300 of this embodiment. Moreover, the signal detected by the light-receiving element can be calculated, and the calculation result can be output to the outside of the light source device at a high speed by the external connecting member. Furthermore, since the mounted substrate performing these calculations can be made small-sized, a small-sized light source device can be realized.

Figure 22:
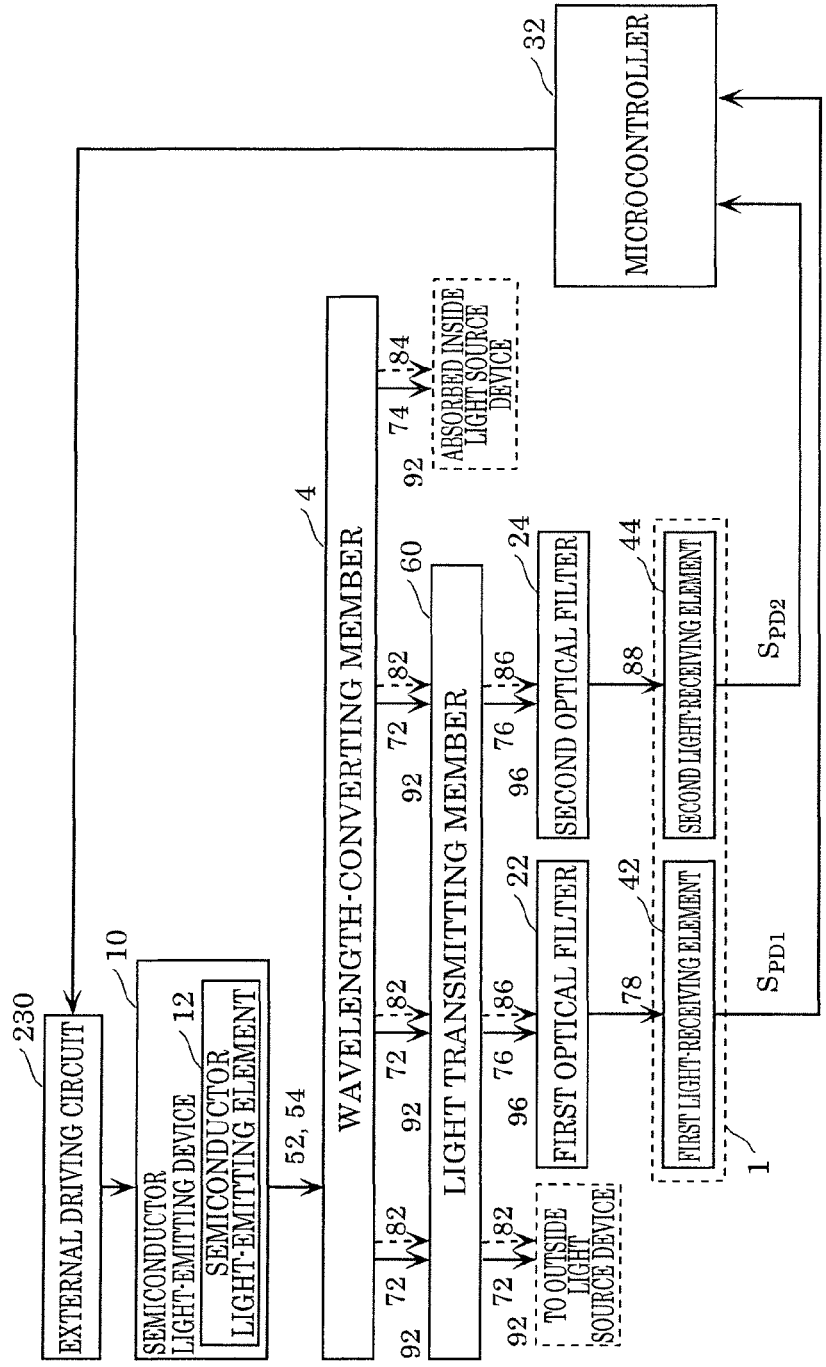
FIG. 22 is a flowchart for explaining an operation of the light source device according to embodiment 3.

FIG. 22 is a flowchart for explaining the operation of light source device 300 according to embodiment 3. In this embodiment, microcontroller 32 is provided inside or outside of light source device 300, and external driving circuit 230 is further provided. And they are connected to semiconductor light-emitting device 10 and state detection circuit 1.

First, when electricity is applied to semiconductor light-emitting device 10 from external driving circuit 230, propagated light 54 from semiconductor light-emitting device 10 reaches wavelength-converting member 4, a part of emitted light 92 from wavelength-converting element 2 is separated by light transmitting member 60 and passes through first optical filter 22 and second optical filter 24 and reaches first light-receiving element 42 and second light-receiving element 44 of state detection circuit 1. Signals $S_{PD1}$ and $S_{PD2}$ obtained by converting and outputting a photo-electric current generated by the light incident to first light-receiving element 42 and second light-receiving element 44 by a current-voltage converter provided inside or outside of first light-receiving element 42 and second light-receiving element 44 are input into microcontroller 32, signals $S_{PD1}$ and $S_{PD2}$ are analyzed by microcontroller 32 and a control signal to external driving circuit 230 is output. External driving circuit 230 controls an operation of semiconductor light-emitting element 12 by using the control signal.

As described above, in light source device 300 according to this embodiment, an operation state of light source device 300 can be easily diagnosed by using a signal output from state detection circuit 1 by using microcontroller 32.

Figure 23:
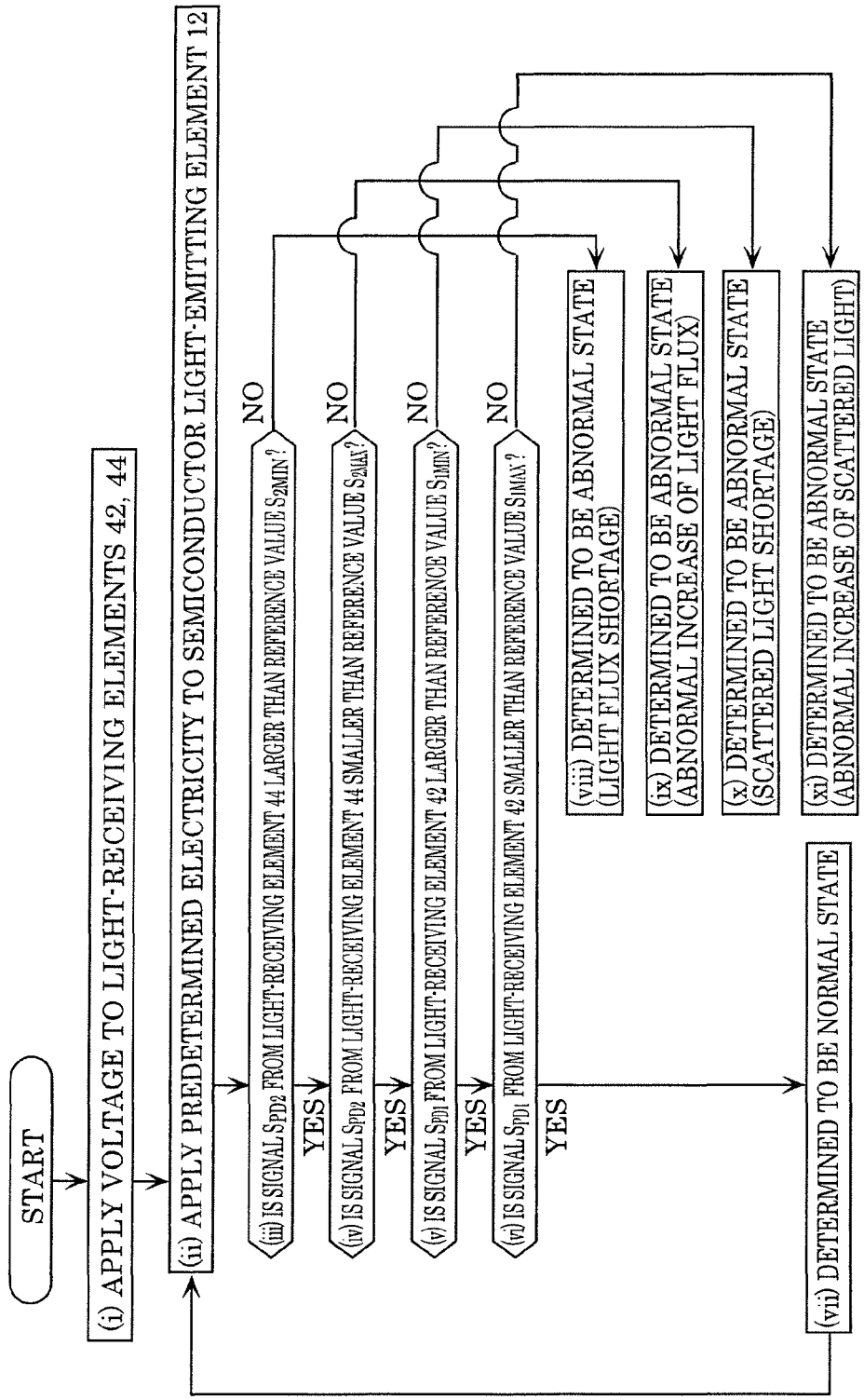
FIG. 23 is a flowchart for explaining an operation which detects a state of the light source device according to embodiment 3.

Subsequently, a flow of signal processing in microcontroller 32 will be described with reference to FIG. 23. FIG. 23 is a flowchart for explaining an operation which detects the operation state of light source device 300 according to embodiment 3.

First, when the operation of light source device 300 is to be started, initially, (i) a predetermined voltage is applied to first light-receiving element 42 and second light-receiving element 44 of state detection circuit 1.

Subsequently, predetermined electricity is applied to semiconductor light-emitting element 12, and signals $S_{PD1}$ and $S_{PD2}$ which are output voltages from first light-receiving element 42 and second light-receiving element 44 are determined by microcontroller 32 in the following order.

First, (ii) predetermined electricity is applied to semiconductor light-emitting element 12. Subsequently, (iii) signal $S_{PD2}$ from second light-receiving element 44 and reference value $S_{2MIN}$ are compared, and if signal $S_{PD2}$ is larger than $S_{2MIN}$, the routine goes to the subsequent step, while if signal $S_{PD2}$ is smaller, it is determined that a light flux which is a light amount of the emitted light abnormally runs short, and an error signal is output (viii).

Subsequently, (iv) signal $S_{PD2}$ of second light-receiving element 44 and reference value $S_{2MAX}$ are compared, and if signal $S_{PD2}$ is smaller than reference value $S_{2MAX}$, the routine goes to the subsequent step, while if signal $S_{PD2}$ is larger, it is determined that a light flux has abnormally increased, and an error signal is output (ix).

Subsequently, (v) signal $S_{PD1}$ of first light-receiving element 42 and reference value $S_{1MIN}$ are compared, and if signal $S_{PD1}$ is larger than reference value $S_{2MIN}$, the routine goes to the subsequent step, while if signal $S_{PD1}$ is smaller, it is determined to be shortage of scattered light, and an error signal is output (x).

Subsequently, (vi) signal $S_{PD1}$ of first light-receiving element 42 and reference value $S_{1MAX}$ are compared, and if signal $S_{PD1}$ is smaller than reference value $S_{1MAX}$, the routine goes to the subsequent step, while if signal $S_{PD1}$ is larger, it is determined to be abnormal increase in scattered light, and an error signal is output.

After determination at the aforementioned (iii) to (vi) is all cleared, (vii) the operation state is determined to be normal, the operation of light source device 300 is continued, and the routine goes on to step (ii) after a predetermined period of time.

As described above, in microcontroller 32, the operation state inside light source device 300 can be easily detected by determining signals $S_{PD1}$ and $S_{PD2}$ on the basis of the aforementioned flow.

Figure 25:
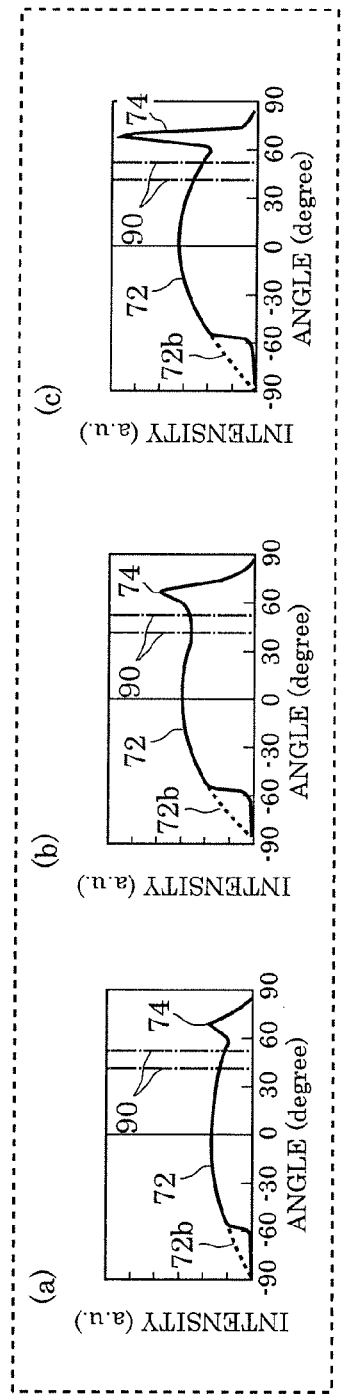
FIG. 25 is a schematic diagram illustrating dependency of light intensity on first emitted light emitted from the wavelength-converting member of the light source device according to embodiment 3 with respect to an angle from an optical axis.
Figure 26:
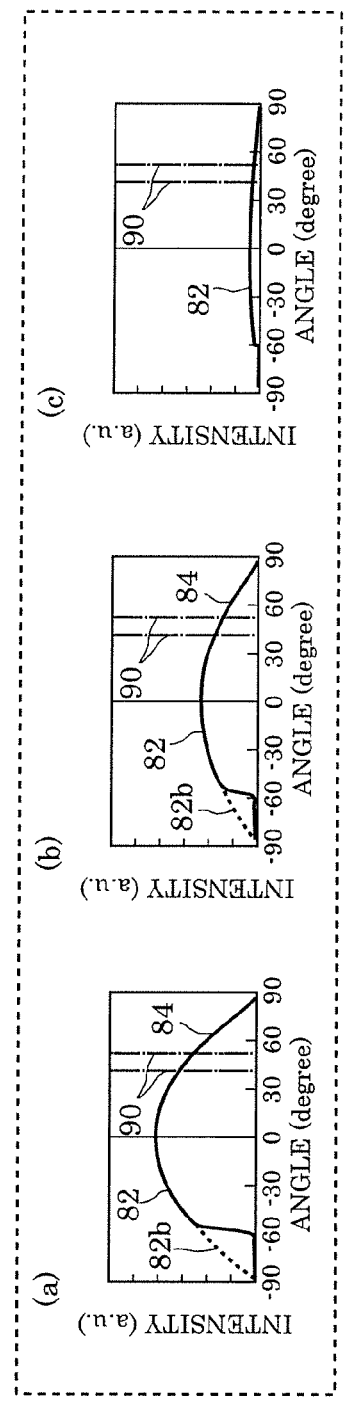
FIG. 26 is a schematic diagram illustrating dependency of light intensity on second emitted light emitted from the wavelength-converting member of the light source device according to embodiment 3 with respect to an angle from an optical axis.

Subsequently, a control method which accurately detects abnormal deterioration of wavelength-converting member 4 will be described with reference to FIG. 24 to FIG. 26.

Figure 24:
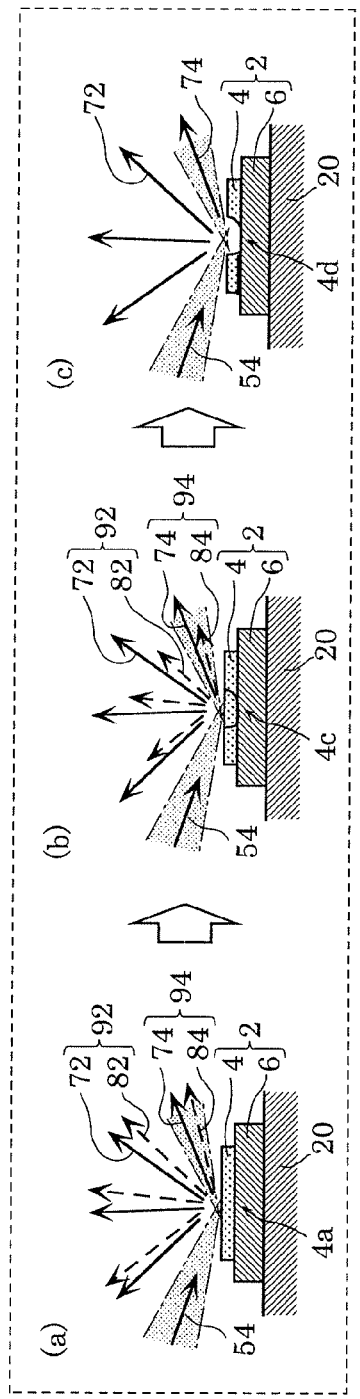
FIG. 24 is a view for explaining a change in a shape of a wavelength-converting member of the light source device and a change of a radiated light according to embodiment 3.

FIG. 24 is a view for explaining a change in a shape of wavelength-converting member 4 of light source device 300 according to embodiment 1 and changes in emitted light 92 and 94. Here, emitted light 92 is constituted by first emitted light 72 and second emitted light 82. Emitted light 94 is constituted by first emitted light 74 and second emitted light 84. FIG. 25 and FIG. 26 are schematic diagrams illustrating dependency on an angle from the optical axis in light intensity of the emitted light corresponding to FIG. 24, and FIG. 25 illustrates angle dependency of light intensities of first emitted light 72 and 74, while FIG. 26 illustrates angle dependency of light intensities of second emitted light 82 and 84. Note that (a), (b), and (c) in FIG. 25 and FIG. 26 correspond to (a), (b), and (c) in FIG. 24, respectively.

First, a light intensity change which occurs in first emitted light 72 and 74 and second emitted light 82 and 84 when abnormal deterioration occurs in wavelength-converting member 4 will be described. The abnormal deterioration of wavelength-converting member 4 is caused by damage of wavelength-converting member 4, for example. In FIG. 24, (a) illustrates a state in the vicinity of wavelength-converting member 4 in a normal operation state. (b) in FIG. 24 illustrates a state in the vicinity of wavelength-converting member 4 where damage begins. (c) in FIG. 24 illustrates a state in the vicinity of wavelength-converting member 4 where damage has advanced.

With regard to wavelength-converting member 4, wavelength-converting member 4 is fixed by a predetermined thickness on support member 6, for example. A material with high reflection rate of visible light and high heat conductivity may be used as support member 6. More specifically, the one in which a reflection film made of a laminated film of a silver-alloy film and a dielectric multi-layered film is formed on a surface of a silicon substrate can be used. Moreover, the one in which fluorescent particles are mixed with a binder such as silicone, applied on support member 6 by a predetermined thickness, and hardened may be used as wavelength-converting element 2, for example.

In (a) in FIG. 24, a part of propagated light 54 collected and incident to wavelength-converting element 2 is scattered by the fluorescent particles of wavelength-converting element 2 and radiated from wavelength-converting element 2 as first emitted light 72. Another part of propagated light 54 is absorbed by fluorescent particles and radiated from wavelength-converting element 2 as second emitted light 82 which is fluorescence having a peak wavelength in the vicinity of 540 nm.

At this time, the vicinity of light emitter 4a which is an irradiation region irradiated with propagated light 54 in wavelength-converting element 2 generates heat by stokes loss which is energy loss at conversion from propagated light 54 to second emitted light 82 and 84, and a temperature rises locally.

This heat is usually radiated to base 50 through support member 6, and the temperature of light emitter 4a becomes constant or less. However, unintended abnormal temperature rise of wavelength-converting element 2 can occur in some cases due to continuous irradiation of light with high energy density to wavelength-converting element 2.

In this case, since the temperature of the binder or the fluorescent particles constituting wavelength-converting element 2 rises rapidly, as illustrated in (b) in FIG. 24, altered part 4c in which structures of the binder and the fluorescence particle are destroyed is generated on a part of wavelength-converting member 4, for example.

In such a case, conversion efficiency of propagated light 54 to second emitted light 82 and 84 in altered part 4c is changed from normal light emitter 4a. Thus, as indicated by lengths of arrows in (a) in FIG. 24 and (b) in FIG. 24, ratios of first emitted light 72 and 74 and second emitted light 82 are changed. That is, as illustrated in comparison between (a) in FIG. 25 and (b) in FIG. 25, a light intensity peak of first emitted light 74 is increased. And as illustrated in the comparison between (a) in FIG. 26 and (b) in FIG. 26, light intensity of second emitted light 82 is lowered.

And as alteration further advances, as illustrated in (c) in FIG. 24, a vicinity of altered part 4c in wavelength-converting member 4 becomes locally ablated altered part 4d. In such a case, since propagated light 54 is hardly converted to second emitted light 82 and 84 or scattered, the light intensity peak of first emitted light 74 is rapidly increased as illustrated in the comparison between (b) in FIG. 25 and (c) in FIG. 25, and the light intensity of second emitted light 82 is rapidly lowered as illustrated in comparison between (b) in FIG. 26 and (c) in FIG. 26.

In the above, light source device 300 of this embodiment detects first emitted light 72 and second emitted light 82 in a range indicated by detection range 90 as light to enter first light-receiving element 42 and second light-receiving element 44. That is, a signal generated by receiving first emitted light 74 with large emission azimuth dependency of light intensity is minimized as a signal amount of an operation state signal or not used. In such configuration, as illustrated in (a), (b), and (c) in FIG. 24, changes in the light intensities of first emitted light 72 and second emitted light 82 accompanying alteration generated in wavelength-converting member 4, that is, light intensity changes illustrated in (a), (b), and (c) in FIG. 25 and (a), (b), and (c) in FIG. 26 can be detected by the light-receiving element. From the aforementioned result, abnormality occurring in wavelength-converting member 4 can be detected easily by using the light-receiving element by using light source device 300 of this embodiment.

Figure 27:
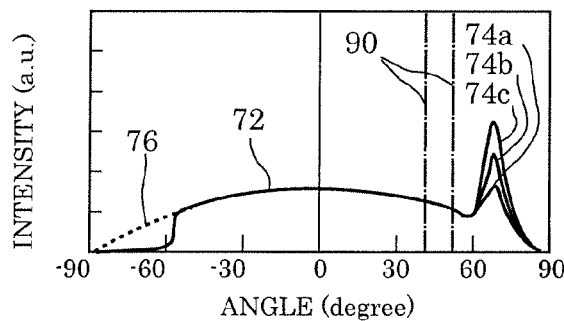
FIG. 27 is a schematic diagram illustrating a result of comparison of dependency of the light intensity of the first emitted light emitted from the wavelength-converting member of the light source device with respect to the angle from the optical axis for a plurality of light source devices.
Figure 28A:
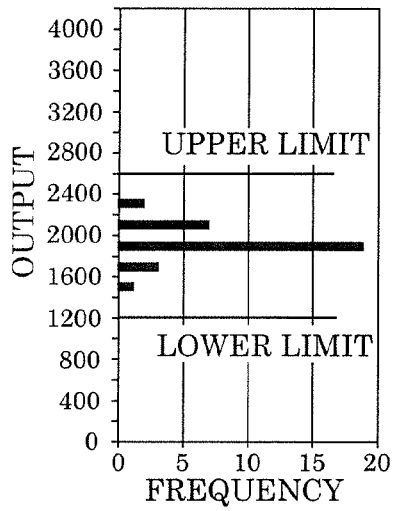
FIG. 28A is a view for explaining variation of a signal detected by a light-receiving element of the plurality of light source devices in embodiment 3.
Figure 28B:
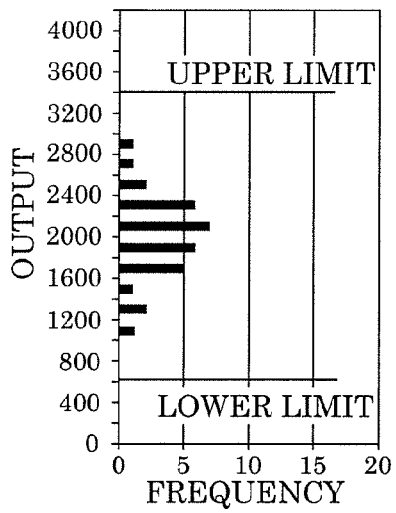
FIG. 28B is a view for explaining variation of a signal detected by a light-receiving element of the plurality of light source devices in a comparative example.

And FIG. 27, FIG. 28A, and FIG. 28B illustrate that abnormality of wavelength-converting member 4 can be detected more accurately by minimizing a signal generated by receiving first emitted light 74 with large emission azimuth dependency of light intensity as a signal amount of the operation state signal.

FIG. 27 illustrates a result obtained by manufacturing a plurality of light source devices 300 emitting excitation light 54 with a same center wavelength 450 nm from semiconductor light-emitting device 10 and by comparing angle dependency of emission angles of emission light intensities of first emitted light 72 and 74. An angle of 0 degrees in FIG. 27 is a normal direction with respect to a surface of wavelength-converting member 4. In FIG. 27, emitted light intensity distribution of three light source devices was compared. In the result of this experiment example, a part of propagated light 54 is scattered by wavelength-converting member 4, and first emitted light 72 with small emission azimuth dependency of light intensity on the surface side had substantially equal intensity, and emitted light having emission angle dependency of the light intensity according to Lambert reflection was obtained. On the other hand, first emitted light 74 emitted with an emission angle correlated with the incident angle was detected with different light intensities 74a, 74b, and 74c in the three light source devices. That is because the light intensity of first emitted light 74 has a large influence on a slight change of a surface state of wavelength-converting member 4. Thus, when first emitted light 74 is used as the operation state signal which detects the operation state of light source device 300, variation in initial values for each light source device becomes large. Thus, in the light source device of this embodiment, an initial value of first emitted light 72 or second emitted light 82 is used in a method of detecting abnormality of the wavelength-converting member.

FIG. 28A is an example of a result of collecting variations in the operation state signals of the plurality of light source devices when a light not including first emitted light 74 is detected by the light-receiving element. FIG. 28B is an example of the result of collecting variations in the operation state signals of the plurality of light source devices when a light including first emitted light 74 is detected by the light-receiving element in a comparative example. That is, FIG. 28A illustrates distribution when signal $S_{PD1}$ is configured by using only a part of first emitted light 72, and FIG. 28B illustrate distribution when signal $S_{PD1}$ is configured by using a part of first emitted light 72 and 74. From the results, particularly when the operation state of the light source device is determined in the plurality of light source devices by using reference values $S_{1MAX}$, $S_{1MIN}$, $S_{2MAX}$, and $S_{2MIN}$, reference values $S_{1MAX}$, $S_{1MIN}$, $S_{2MAX}$, and $S_{2MIN}$ can be set in a narrower range and thus, the operation state of the light source device can be determined accurately.

As described above, in the light source device of this embodiment, a detection light detection angle range of emitted light (an angle range of emitted light used for detection light) is limited. By means of such configuration, even if light intensity has strong dependency on the emission angle, since an angle range in which light intensity is stable is limited for detection for each product, accuracy of light intensity of detection light can be improved. Therefore, the deterioration state of wavelength-converting member 4 can be accurately detected.

Embodiment 4

Hereinafter, a light source device according to embodiment 4 of the present disclosure will be described. The light source device of this embodiment is characterized in that a microcontroller is provided, and the microcontroller is mounted on a mounted substrate. Since the other parts are substantially the same as the light source devices in embodiments 1 and 3, different portions will be mainly described.

(Configuration of Light Source Device)

A configuration of light source device 400 according to embodiment 4 will be described with reference to FIG. 29 to FIG. 32.

Figure 29:
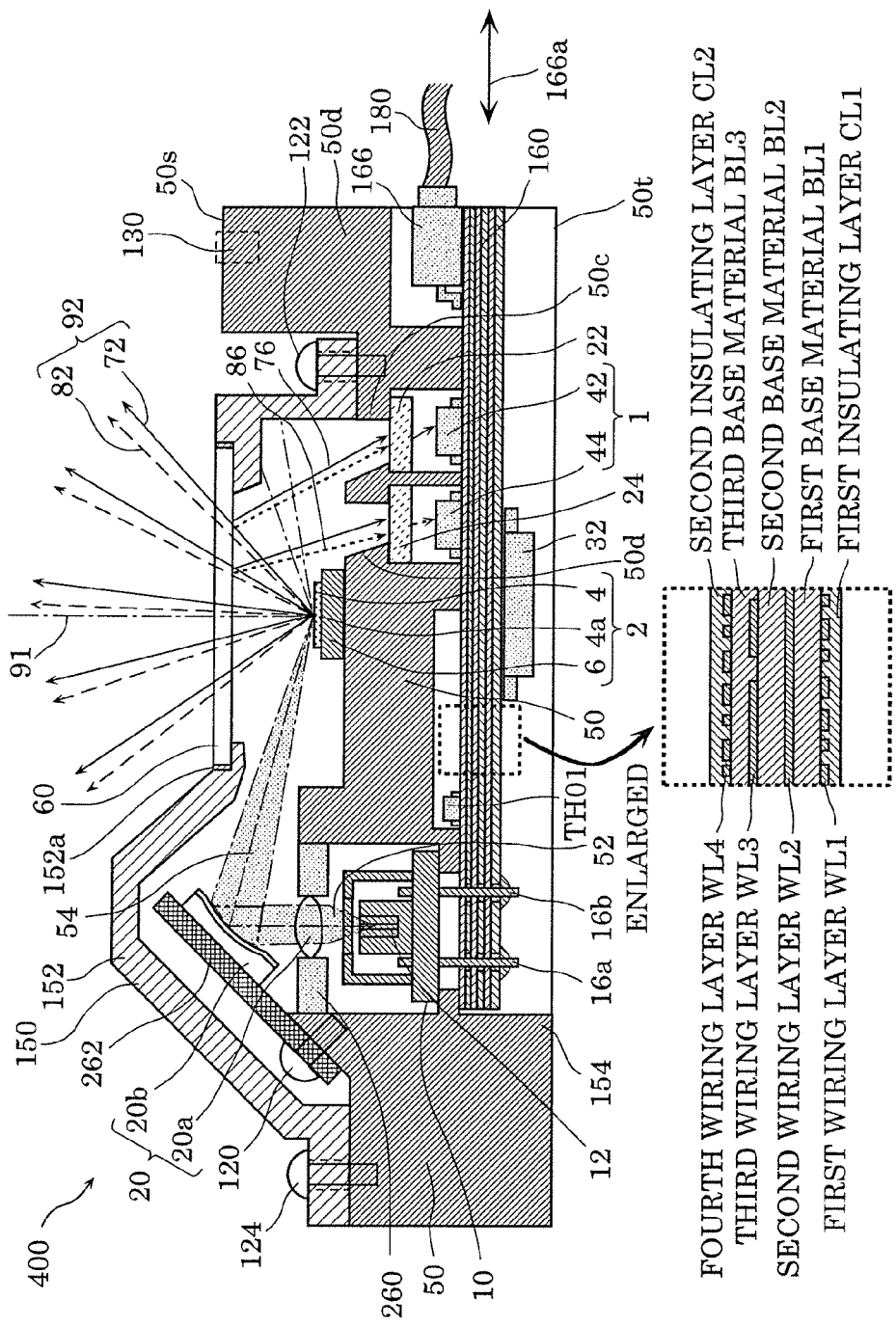
FIG. 29 is a schematic sectional view for explaining a light source device according to embodiment 4.
Figure 30:
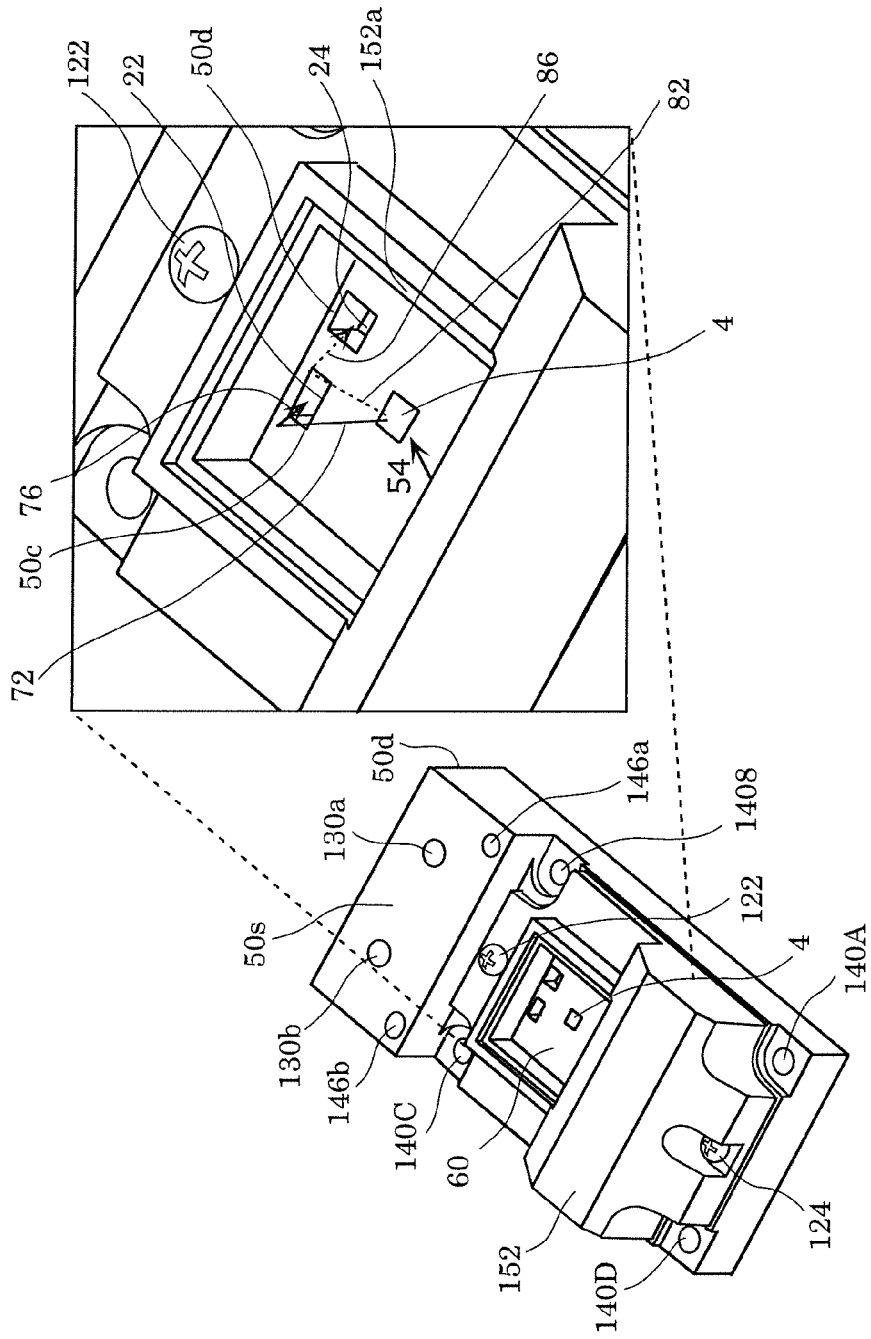
FIG. 30 is a schematic sectional view illustrating a configuration of the light source device according to embodiment 4.
Figure 31A:
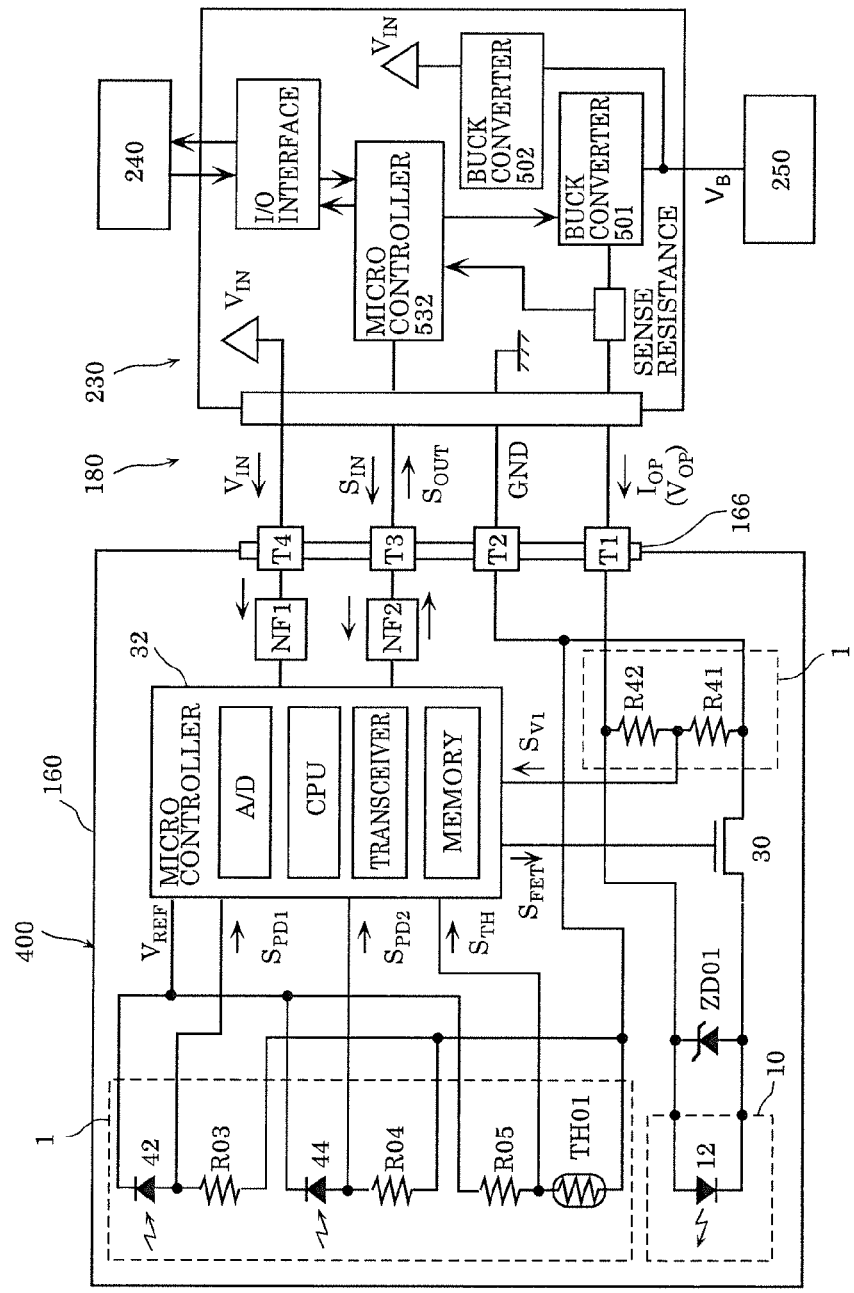
Figure 32:
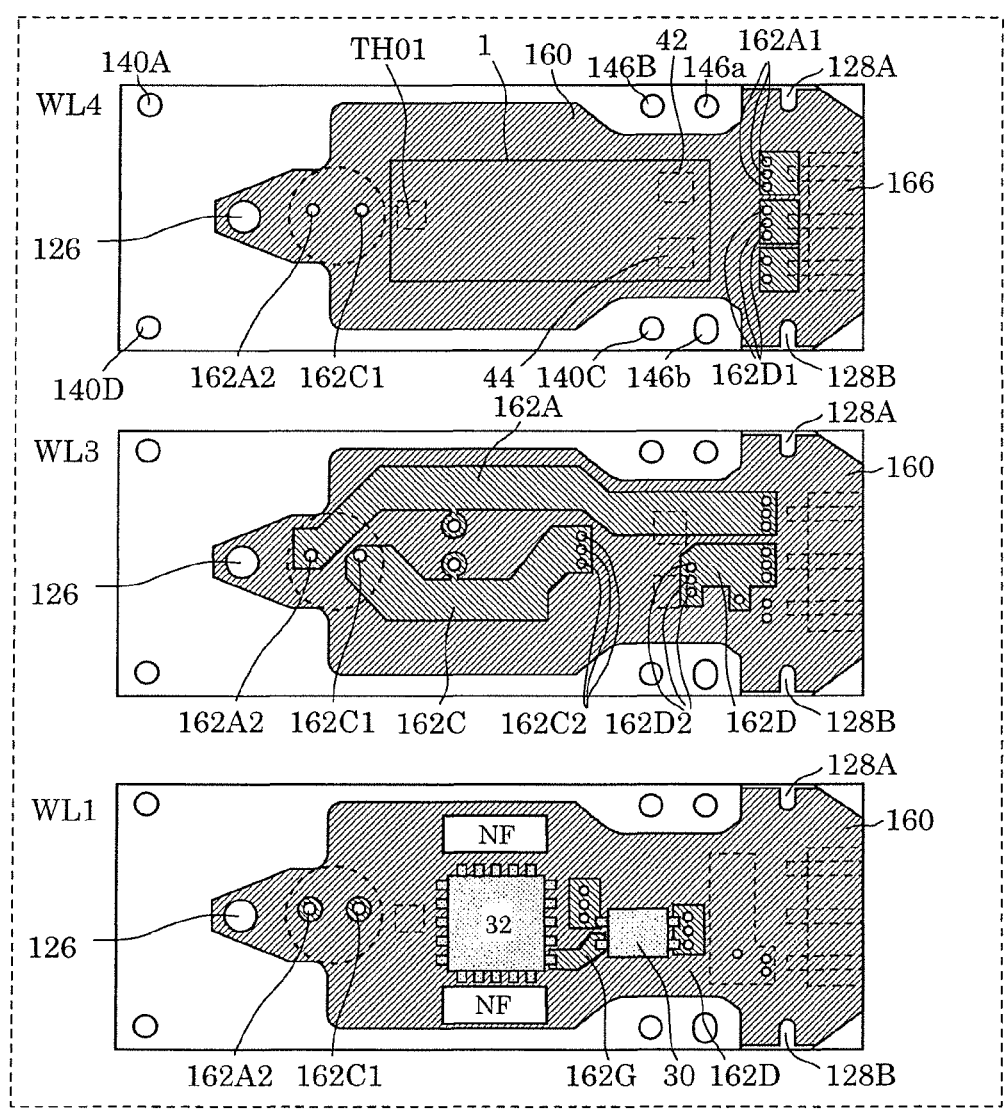
FIG. 32 is a schematic diagram for explaining a configuration of a mounted substrate of the light source device according to embodiment 4.

FIG. 29 is a schematic sectional view of light source device 400 according to embodiment 4, and a sectional view of mounted substrate 160 is illustrated on a lower part of the figure. Moreover, FIG. 30 is a view of light source device 400 according to embodiment 4 when seen from diagonally above, and an enlargement view of a vicinity of wavelength-converting member 4 is illustrated on an upper right part in the figure. Moreover, FIG. 31A is a circuit block diagram of an electric circuit mounted on mounted substrate 160 of light source device 400 according to embodiment 4. FIG. 31A further describes external driving circuit 230 which drives mounted substrate 160, controller 240, power supply 250 such as a battery, and external wiring 180 such as a cable. Moreover, FIG. 32 is a view for explaining a circuit layout of mounted substrate 160.

In light source device 400, semiconductor light-emitting device 10 is disposed on an opening portion opened to wavelength-converting element 2 side of base 50. And lead pins 16a and 16b of semiconductor light-emitting device 10 are connected to mounted substrate 160 from a side opposite to base 50. Lens 20a is held by holder 260 and is fixed to base 50 after position adjustment. Moreover, reflection optical element 20b is also held by holder 262 and is fixed to base 50 by screw 120 after position adjustment. In light source device 400 of this embodiment, temperature detection element THO1, two light-receiving elements (first light-receiving element 42 and second light-receiving element 44), resistors R42, R41, R03, R04, and R05 are mounted as a part of state detection circuit 1. Moreover, in light source device 400, first optical filter 22 and second optical filter 24 with different wavelength dependencies of transmissivity are mounted between first light-receiving element 42 as well as second light-receiving element 44 and light transmitting member 60. And first optical filter 22 is positioned and fixed to first light-receiving element 42, and second optical filter 24 is positioned and fixed to second light-receiving element 44.

Moreover, in light source device 400, semiconductor light-emitting device 10, state detection circuit 1, microcontroller 32, and external connecting member 166 are mounted on single mounted substrate 160. And mounted substrate 160 is disposed in parallel with first surface 50t at a position dented inward by one step on first surface 50t side of base 50. In this embodiment, mounted substrate 160 is a multi-layered substrate having four wiring layers. With regard to a specific configuration of mounted substrate 160, first wiring layer WL1, first base material BL1, second wiring layer WL2, second base material BL2, third wiring layer WL3, third base material BL3, and fourth wiring layer WL4 are alternately laminated as illustrated in the enlarged sectional view of mounted substrate 160 in FIG. 29. A part of each wiring layer is connected by via wiring. And an uppermost surface is covered partially or wholly by first insulating layer CL1 and second insulating layer CL2. And microcontroller 32 is mounted on the first insulating layer CL1 side, and temperature detection element THO1, first light-receiving element 42, second light-receiving element 44, and external connecting member 166 are mounted on the second insulating layer CL2 side.

FIG. 29 illustrates external wiring 180 is further connected to external connecting member 166 of light source device 400. In light source device 400, electricity is supplied from external wiring 180 to external connecting member 166, a part of the electricity is supplied from mounted substrate 160 to semiconductor light-emitting device 10, and emitted light 52 is emitted. Emitted light 52 becomes propagated light 54 by lens 20a and reflection optical element 20b and is collected in light emitter 4a of wavelength-converting element 2. Light incident to light emitter 4a becomes emitted light 92 constituted by first emitted light 72 and second emitted light 82, passes through light transmitting member 60, and is emitted from light source device 400. Moreover, a part of the electricity is supplied from external connecting member 166 of mounted substrate 160 to microcontroller 32. And the operation state signal from temperature detection element THO1 disposed in the vicinity of semiconductor light-emitting device 10 is input into microcontroller 32. Moreover, a part of emitted light 92 is reflected by light transmitting member 60 and is incident to first light-receiving element 42 and second light-receiving element 44, and signals from first light-receiving element 42 and second light-receiving element 44 are input into microcontroller 32.

In this embodiment, as illustrated in FIG. 31A, a non-volatile memory is mounted on microcontroller 32, in addition to a central processing unit. And microcontroller 32 further has a transceiver function capable of communication with the outside. And electricity is supplied to microcontroller 32 from terminal T4 of external connecting member 166 through filter circuit NF1. Microcontroller 32 converts the supplied electricity and supplies reference voltage $V_{REF}$ to first light-receiving element 42 and second light-receiving element 44 of state detection circuit 1. And microcontroller 32 is connected to an outputter of state detection circuit 1, and the operation state signal which is a detection result of the operation state of the light source device, or more specifically, signals $S_{PD1}$, $S_{PD2}$, $S_{TH}$, and $S_{V1}$ are input from state detection circuit 1 to microcontroller 32. Microcontroller 32 calculates the signal from state detection circuit 1, determines the operation state of the light source device, and outputs information on the determination result as a signal. Moreover, a communication terminal of microcontroller 32 is connected to terminal T3 of external connecting member 166 through filter circuit NF2. Then, terminal T3 is connected to microcontroller 532 of external driving circuit 230, for example, by external wiring 180. Therefore, light source device 400 can communicate with external driving circuit 230. Thus, information related to the operation state of light source device 400 can be obtained by an external device such as external driving circuit 230.

By means of such configuration, state detection circuit 1 can detect the operation state of a component related to the light emitting function of the light source device and input the detection result to microcontroller 32 mounted in the vicinity of the same mounted substrate. Therefore, since an influence of an external noise or delay in signal transmission does not occur easily in the wiring between state detection circuit 1 and microcontroller 32, the operation state of the light source device can be input into microcontroller 32 at a high speed and with accuracy. And the operation state of the light source device can be output as a control signal by calculating the input detection result by microcontroller 32. Moreover, in this embodiment, the external connecting member connected to the outside is mounted on the same mounted substrate as microcontroller 32. Thus, since the influence of the external noise or delay in signal transmission does not occur easily in the wiring between the microcontroller and the external connecting member, the determination result at microcontroller 32 can be communicated to the outside accurately and at a high speed. And the light source device can be dimmed or turned off at a high speed by using external driving circuit 230 on the basis of the information. At this time, since microcontroller 32 is mounted on the mounted substrate of the light source device, a control algorithm which calculates the operation state signal from state detection circuit 1 and generates a control signal for controlling the external driving circuit can be freely set.

Moreover, the aforementioned communication between microcontroller 32 and the external driving circuit may be conducted by a digital signal. By means of such configuration, the information related to the operation state of light source device 400 can be accurately transmitted to an external device such as external driving circuit 230.

Moreover, microcontroller 32 outputs signal $S_{FET}$ which is a control signal to the gate of transistor 30 and controls on/off of transistor 30. At this time, microcontroller 32 can output the operation state of the light source device as a control signal by calculating the detection result input from state detection circuit 1. Since the control signal can be input into the transistor mounted on the same mounted substrate as microcontroller 32 and can control the transistor, the light source device can be dimmed or turned off at a high speed. At this time, since microcontroller 32 is mounted on the mounted substrate of the light source device, a control algorithm which calculates the operation state signal and generates a control signal for controlling the transistor can be freely set. Moreover, in aforementioned microcontroller 32, a reference value for calculating and comparing the operation state signal from state detection circuit 1 is stored in the non-volatile memory mounted on microcontroller 32. By means of such configuration, microcontroller 32 can determine the operation state of the light source device easily by using the signal form state detection circuit 1 in light source device 400.

At this time, a reference value with respect to a signal of the light-receiving element related to the light amount of the emitted light in the light source device can be stored in the aforementioned non-volatile memory. Moreover, a reference value with respect to a signal of the temperature detection element related to the temperature of the light source device can be also stored in the non-volatile memory. Moreover, a temporal change coefficient of the light amount of the emitted light under a predetermined driving condition such as a driving current and a temperature of the semiconductor light-emitting device mounted on the light source device can be also stored in the non-volatile memory. Moreover, accumulated operation time of the light source device can be also stored in the non-volatile memory. Moreover, a maximum driving current value to a predetermined temperature of the light source device can be also stored in the non-volatile memory.

As described above, by storing the reference value to a measured value used by state detection circuit 1 as a parameter in the non-volatile memory, microcontroller 32 can calculate the operation state signal detected by state detection circuit 1 of the light source device and can make determination easily by the result.

Here, in FIG. 29, first light-receiving element 42 and second light-receiving element 44 of state detection circuit 1 are described to be juxtaposed in an advance direction of propagated light 54, but, as illustrated in FIG. 30, they may be disposed side by side so as to cross the advance direction of propagated light 54. By disposing as above, emitted light 92 with the same emission angle to main axis 91 can be led to a plurality of light-receiving elements. Thus, first emitted light 72 and second emitted light 82 with the same emission angle can be compared, for example, and the operation state of the light source device can be detected more accurately. Moreover, shapes of light-guide opening portions 50c and 50d which lead emitted light 92 from wavelength-converting member 4 to first light-receiving element 42 and second light-receiving element 44 may be different between first light-receiving element 42 and second light-receiving element 44. Moreover, outer shapes of first optical filter 22 and second optical filter 24 disposed on light-guide opening portions 50c and 50d may be different from each other such as a square and a rectangle and a parallelogram and a diamond, for example. By means of such configuration, in a process of manufacturing light source device 400, an error in disposition of first optical filter 22 and second optical filter 24 can be suppressed.

Subsequently, the electric circuit of the light source device of this embodiment will be described in more detail with reference to FIG. 31A, FIG. 31B, and FIG. 32. As illustrated in FIG. 31A, semiconductor light-emitting device 10 is connected to terminals T1 and T2 of external connecting member 166 of light source device 400. At this time, an anode terminal of semiconductor light-emitting device 10 is connected to terminal T1. A cathode terminal of semiconductor light-emitting device 10 is connected to transistor 30 and is connected to terminal T2. Moreover, Zener diode ZD01 is connected in parallel with semiconductor light-emitting element 12 as a surge protection element and is mounted on mounted substrate 160. In this embodiment, Zener diode ZD01 is disposed outside semiconductor light-emitting device 10 but may be built in semiconductor light-emitting device 10. And resistors R41 and R42 are connected in series-parallel with terminals T1 and T2. A part of state detection circuit 1 is constituted by resistors R41 and R42 and is mounted on mounted substrate 160. Resistors R41 and R42 generate signal S vi which is an operation state signal. Signal $S_{V1}$ is a partial voltage of terminal voltage input into the anode terminal and the cathode terminal of semiconductor light-emitting device 10 and is a signal correlated with the terminal voltage. And signal S vi is input into microcontroller 32 mounted on the same mounted substrate and microcontroller 32 determines the operation state of the light source device. By means of the aforementioned configuration, the operation state of the light source device can be determined by the light source device itself at a high speed and accurately.

Moreover, a part of aforementioned state detection circuit 1 may be replaced by a detection circuit which detects a terminal current by using a sense resistor with a circuit configuration similar to the circuit configuration of variation 6 of embodiment 1. At this time, signal $S_{C1}$ which is an operation state signal related to the electric current to be applied to semiconductor light-emitting device 10 is output from state detection circuit 1. And signal $S_{C1}$ is similarly input into microcontroller 32 and microcontroller 32 can determine the operation state of the light source device.

Moreover, aforementioned state detection circuit 1 may be a detection circuit which detects the electric current to be applied to semiconductor light-emitting device by detecting a voltage applied to transistor 30 with a circuit configuration similar to the circuit configuration of variation 7 of embodiment 1. As a result, mounting of a sense resistor on the light source device can be omitted.

In the light source device of this embodiment, the outputter of microcontroller 32 is connected to transistor 30. Therefore, transistor 30 can be controlled by inputting signal $S_{V1}$ or $S_{C1}$ into microcontroller 32, by calculating the aforementioned signal by microcontroller 32, by outputting signal $S_{FET}$ by using the result, and by applying signal $S_{FET}$ to the gate of the transistor.

By means of such configuration, abnormality in electric wiring inside and outside the semiconductor light-emitting device of the light source device or electro-optical converting function of semiconductor light-emitting device 10 can be easily detected. And the result can be determined in microcontroller 32 mounted on light source device 400, and an instruction can be sent to transistor 30. Therefore, in the light source device of this embodiment, the operation state of the light source device can be changed at a high speed by accurately detecting the operation state of the light source device itself by state detection circuit 1 and by reducing an electric current amount applied to the semiconductor light-emitting device at a high speed.

Moreover, the calculation result performed by microcontroller 32 of light source device 400 can be also sent to external driving circuit 230 as signal $S_{OUT}$ from terminal T3 of external connecting member 166 through filter circuit NF2 from microcontroller 32. In external driving circuit 230, a received signal from light source device 400 is processed, and electricity to be supplied to semiconductor light-emitting device 10 of light source device 400 can be freely changed.

Moreover, mounted substrate 160 of this embodiment includes a circuit including a light-receiving element as described above as a part of state detection circuit 1. More specifically, as illustrated in FIG. 31A, two types of detection circuits, that is, state detection circuit 1 including first light-receiving element 42 and state detection circuit 1 including second light-receiving element 44 are mounted. State detection circuit 1 constituted by first light-receiving element 42 and resistor R03 outputs signal $S_{PD1}$ which is an operation state signal according to a light amount incident to first light-receiving element 42. State detection circuit 1 constituted by second light-receiving element 44 and resistor R04 outputs signal $S_{PD2}$ according to a light amount incident to second light-receiving element 44. Then, signals $S_{PD1}$ and $S_{PD2}$ are input into microcontroller 32. By means of such configuration, optical abnormality is detected by state detection circuit 1, and the result can be determined by the microcontroller. And communication is conducted with the external driving circuit by using the result determined in microcontroller 32, and an electric current amount to be applied to the semiconductor light-emitting device is adjusted. Moreover, signal $S_{FET}$ is output from microcontroller 32, and transistor 30 can be controlled.

By means of such configuration, emitted light abnormality caused by abnormality in the optical member inside the semiconductor light-emitting device of the light source device, the electro-optical converting function of the light emitter of the wavelength-converting member of wavelength-converting element 2, and the like can be detected easily, the result is determined by microcontroller 32 mounted on light source device 400, and an instruction can be sent to transistor 30. Thus, the electric current amount to be applied to the semiconductor light-emitting device can be reduced at a high speed. Moreover, the calculation result performed by microcontroller 32 of light source device 400 can be also sent to external driving circuit 230 as signal $S_{OUT}$ from terminal T3 of external connecting member 166 through filter circuit NF2 from microcontroller 32. In external driving circuit 230, electricity to be supplied to semiconductor light-emitting device 10 of light source device 400 can be freely changed by processing a received signal from light source device 400.

Furthermore, in state detection circuit 1 of light source device 400 of this embodiment includes temperature detection element THO1 which is a thermistor, for example. And the operation state signal correlated with a temperature of light source device 400 can be output from state detection circuit 1. Signal $S_{TH}$ which is an operation state signal output from temperature detection element THO1 of state detection circuit 1 is input into microcontroller 32. And calculation is performed in microcontroller 32 by using the signal, and the operation state of the light source device can be determined. Microcontroller 32 communicates with the external driving circuit by using the determination result and adjusts the electric current amount to be applied to the semiconductor light-emitting device. Moreover, microcontroller 32 outputs signal $S_{FET}$ and inputs the signal to the gate of transistor 30. Transistor 30 controls input electricity of semiconductor light-emitting device 10 by signal $S_{FET}$ input into the gate.

By means of the aforementioned configuration, temperature information of the light source device is detected by the operation state detection circuit, and the electricity to be applied to the semiconductor light-emitting device can be controlled. Therefore, a temperature change of light source device 400 is detected, and a driving current of the semiconductor light-emitting device can be controlled.

Furthermore, an operation state of each of a plurality of light source devices can be accurately detected by using a non-volatile memory. In a plurality of different light source devices, light amounts/wavelengths of emitted light of the light source devices can be slightly different even with the same driving current or sensitivity of the light-receiving elements can be slightly different with respect to the same light amount. Thus, a signal value output from the light-receiving element can be varied for each light source device even in the same driving current and in the same operation state. In this embodiment, an individual difference among each light source can be corrected by calculating the signal values output from light-receiving elements different for each light source device by using an inter-module variation correction coefficient for each light source device.

More specifically, a signal value output from the light-receiving element under a specific operation condition (environmental temperature, driving current) in a light source device is measured before shipment, and a ratio to a signal value output from the light-receiving element in a light source device which is a standard is calculated as the inter-module variation correction coefficient. And the inter-module variation correction coefficient for each light source device, a temperature conversion equation for converting the signal value output from the temperature detection element to a temperature, and a temperature correction equation for correcting the temperature dependency of the signal value output from the light-receiving element are stored in the aforementioned non-volatile memory in advance.

The operation state can be accurately determined by detecting the operation state of the light source device by using the inter-module variation correction coefficient stored in the aforementioned non-volatile memory, the temperature conversion equation, and the temperature correction equation, and if the operation state of the light source device is abnormal, the driving current of the light source device can be shut down.

Figure 31B:
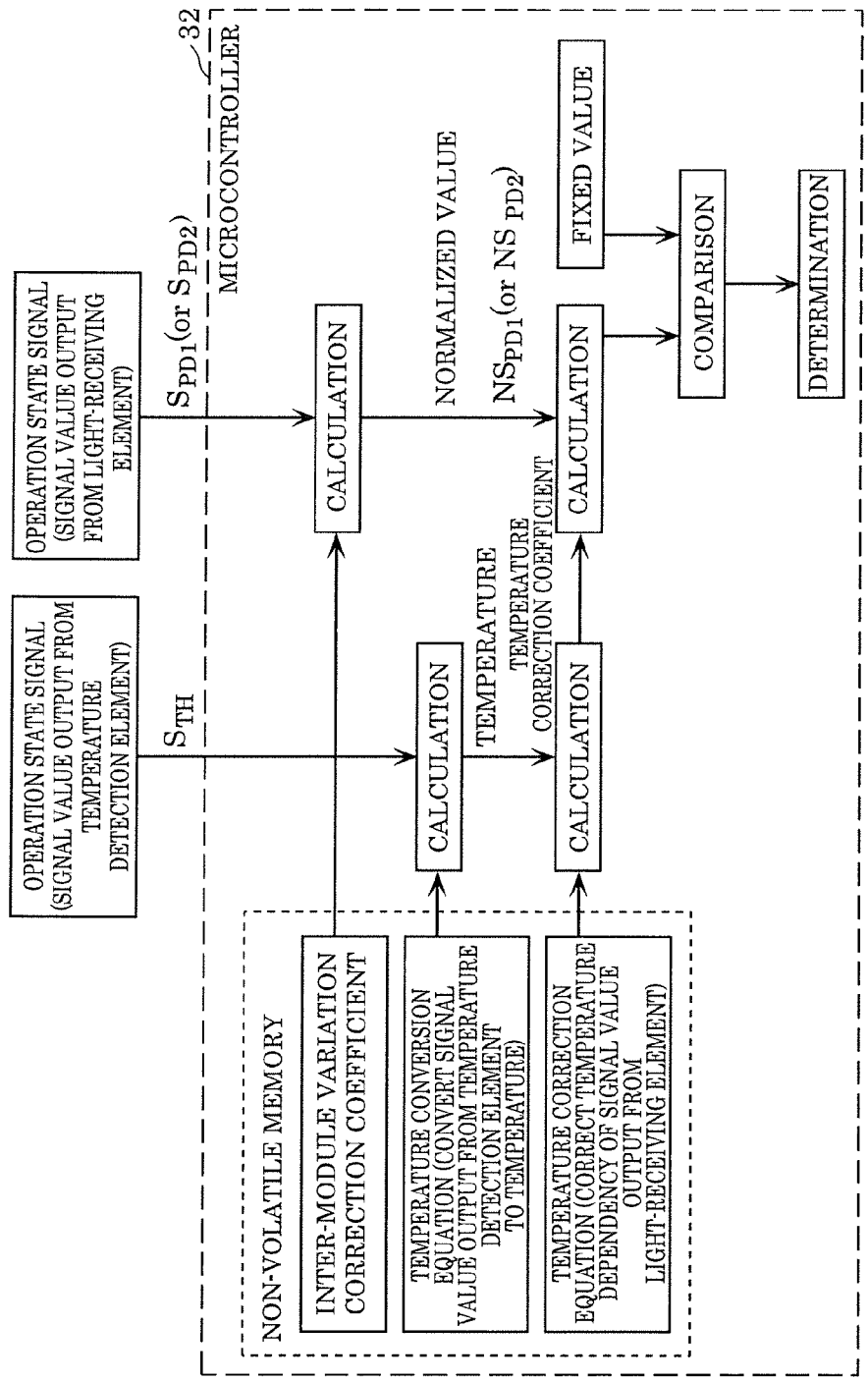
FIG. 31B is a flowchart for explaining an operation which detects a state of the light source device according to embodiment 4.

More specifically, as illustrated in FIG. 31A and FIG. 31B, first, normalized values $NS_{PD1}$ and $NS_{PD2}$ normalized by multiplying signal values $S_{PD1}$ and $S_{PD2}$ input into microcontroller 32 and output from the light-receiving element by the inter-module variation correction coefficient are acquired. Subsequently, the temperature is acquired for signal value STD of the temperature detection element input into microcontroller 32 by using the temperature conversion equation, and the temperature correction coefficient is acquired by using the obtained temperature and the temperature correction equation. Then, calculation is performed for the normalized values $NS_{PD1}$ and $NS_{PD2}$ with the temperature correction coefficient in microcontroller 32, the calculation result is compared with the reference value determined in advance, and presence of abnormality is determined.

The aforementioned temperature correction equation may be a correction equation corresponding to the operation condition (driving current) of the light source device and is calculated by microcontroller 32 on the basis of the driving current of the light source device.

By means of such configuration, since the operation state of the light source device can be accurately detected and determined, if the operation state of the light source device is in a normal state, the light source device is operated, while if in an abnormal state, the light source device can be accurately shut down.

The calculation result performed by microcontroller 32 of light source device 400 can be also sent as signal Sour from terminal T3 of external connecting member 166 from microcontroller 32 to microcontroller 532 of external driving circuit 230. At this time, such a method can be used that signal $S_{IN}$ is sent from microcontroller 532 side to microcontroller 32 side, and signal $S_{OUT}$ is sent from microcontroller 32 side to microcontroller 532 side in accordance with the signal. In external driving circuit 230, received signal $S_{OUT}$ from light source device 400 is processed by microcontroller 532, and while the result is communicated to controller 240, a predetermined electric current $I_{OP}$ and voltage $V_{OP}$ are generated by using voltage dropping circuit 501 and the sense resistor from electricity VB supplied from battery 250 and is input into terminal T1 of light source device 400. As described above, microcontroller 32 can freely change the electricity to be supplied to semiconductor light-emitting device 10 of light source device 400 separately from transistor 30 by using external driving circuit 230 outside of light source device 400. In external driving circuit 230, predetermined voltage VIN is input from terminal T4 to light source device 400 by voltage dropping circuit 502 and is used as a power source for microcontroller 32.

Subsequently, a layout of each wiring layer of mounted substrate 160 mounted on light source device 400 of this embodiment will be described with reference to FIG. 32.

FIG. 32 is a schematic diagram for explaining a configuration of mounted substrate 160 of light source device 400 according to embodiment 4. In mounted substrate 160 of this embodiment, four layers, that is, first wiring layer WL1, second wiring layer WL2, third wiring layer WL3, and fourth wiring layer WL4 are formed as the wiring layers. And either one of second wiring layer WL2 and third wiring layer WL3 on an inner side portion is ground (GND) wiring. By means of such configuration, ground wiring can be disposed between different digital single lines. Thus, mutual influences of noises of the signal lines and deterioration of signals of the signal line caused by cross-talk are suppressed.

Moreover, in second wiring layer WL2 and third wiring layer WL3 on an inner side portion, one side is made ground (GND) wiring and the other as printed wiring through which a large electric current is made to flow to semiconductor light-emitting device 10. By means of such configuration, wiring with a large conductive film width formed to allow the large electric current to flow can be formed inside, and deterioration of close contact between the base material on the surface layer side and the wiring layer can be suppressed.

In FIG. 32, the ground wiring is formed on second wiring layer WL2, and most of printed wiring 162A and 162C connected to the anode terminal and the cathode terminal of semiconductor light-emitting device 10 are formed on third wiring layer WL3 in the configuration. And microcontroller 32 is mounted on the surface of first wiring layer WL1. Moreover, transistor 30 is also mounted on the surface of first wiring layer WL1.

By means of such configuration, first wiring layer WL1 on which microcontroller 32 is mounted and third wiring layer WL3 and fourth wiring layer WL4 which are the other wiring layers are separated by second wiring layer WL2 which is the ground wiring. Thus, a possibility that microcontroller 32 receives cross-talk of the noise from external wiring and is mis-operated can be reduced. Furthermore, microcontroller 32 and transistor 30 are mounted on the same wiring layer of the same mounted substrate. Therefore, since the signal from microcontroller 32 can be transmitted to transistor 30 at a high speed, when abnormality occurs in light source device 400, light source device 400 can be stopped at a high speed.

Moreover, state detection circuit 1 including first light-receiving element 42 as well as second light-receiving element 44 and thermistor THO1 is formed on the surface of fourth wiring layer WL4 of mounted substrate 160. At this time, microcontroller 32 is installed between first light-receiving element 42 as well as second light-receiving element 44 and semiconductor light-emitting device 10 in plan view. By means of such configuration, the semiconductor light-emitting device, the microcontroller, and the light-receiving element can be disposed easily in the light source device, and the light-receiving element can be disposed at a position away from the semiconductor light-emitting device which is a heat generation source in the light source device. Thus, a temperature rise of the light-receiving element upon receipt of an influence of heat generation of the semiconductor light-emitting device and generation of an error in the operation state signal output from the light-receiving element can be suppressed.

Moreover, in mounted substrate 160, temperature detection element THO1 which is a thermistor, for example, is installed between the connection portion with semiconductor light-emitting device 10 and a mounted position of microcontroller 32 in plan view. By means of this configuration, the temperature detection element can be disposed close to the semiconductor light-emitting device, and since the microcontroller which is another heat generation source is not disposed between the semiconductor light-emitting device and the temperature detection element, temperature measurement of the semiconductor light-emitting device can be made with high accuracy by using the temperature detection element. Furthermore, a temperature change of the semiconductor light-emitting device can be detected at a high speed by using the temperature detection element.

Note that, in mounted substrate 160 in FIG. 32, filter circuit NF is disposed in the periphery of microcontroller 32 and is connected to microcontroller 32. As a result, a noise of the operation state signal input into microcontroller 32 can be reduced.

In the aforementioned mounted substrate 160, mounted substrate 160 may be constituted by flat plates without a bent portion. By constituting as above, lowering of mechanical strength of the mounted substrate can be suppressed, and the mounted substrate can be manufactured easily. And mounted substrate 160 is fixed to a fixing surface of a portion dented inward by one step from first surface 50t on first surface 50t side which is a fixing surface of base 50. By means of such configuration, the light source device can be fixed with the external heat radiator having a flat surface and first surface 50t which is the fixing surface of the light source device in planar contact. Therefore, a heat radiation path from the light source device to the external heat radiator can be easily configured.

Moreover, external connecting member 166 mounted on mounted substrate 160 may be a connector inserted/removed in a direction in parallel with a planar direction of mounted substrate 160, that is, a direction of arrow 166a in FIG. 29. By using external connecting member inserted/removed in this direction, the external connecting member which is thin in a thickness direction, that is, a direction perpendicular to first surface 50t (up-and-down direction on the figure) can be used, and thinning of the light source device can be realized. Moreover, by using the external connecting member inserted/removed in this direction, pedestal 50d having second surface 50s of base 50 can be disposed on an upper part of the external connecting member and thus, a small-sized light source device can be realized. Moreover, by having the light source device in which the semiconductor light-emitting device and the light-receiving element are mounted on the same mounted substrate and an optical system using reflection optical element 20b which reflects the emitted light and light transmitting member 60 is used, a small-sized light source device in which an optical path of the optical system is thin in the direction perpendicular to first surface 50t can be realized.

Subsequently, an embodiment of light projecting device 900 using light source device 400 will be illustrated with reference to FIG. 33 and FIG. 34.

Figure 33:
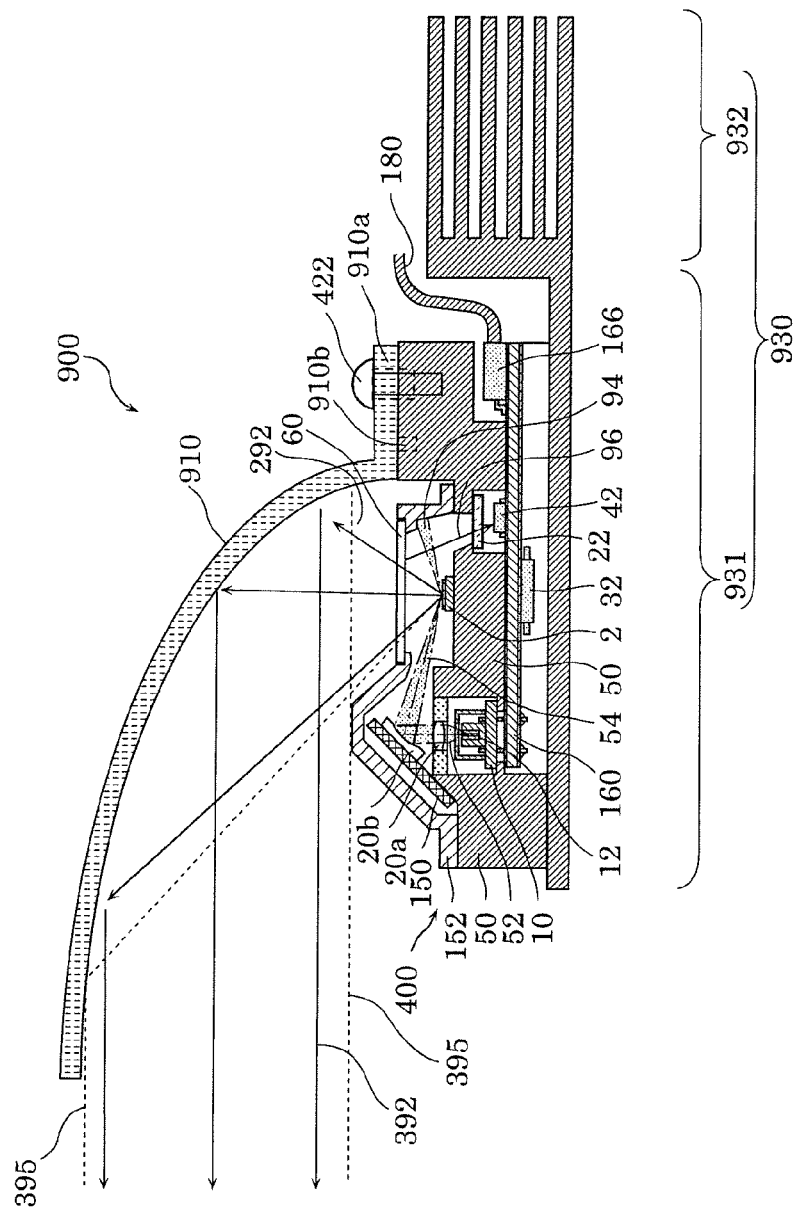
FIG. 33 is a schematic sectional view illustrating a configuration of a light projecting device configured by using the light source device according to embodiment 4.
Figure 34:
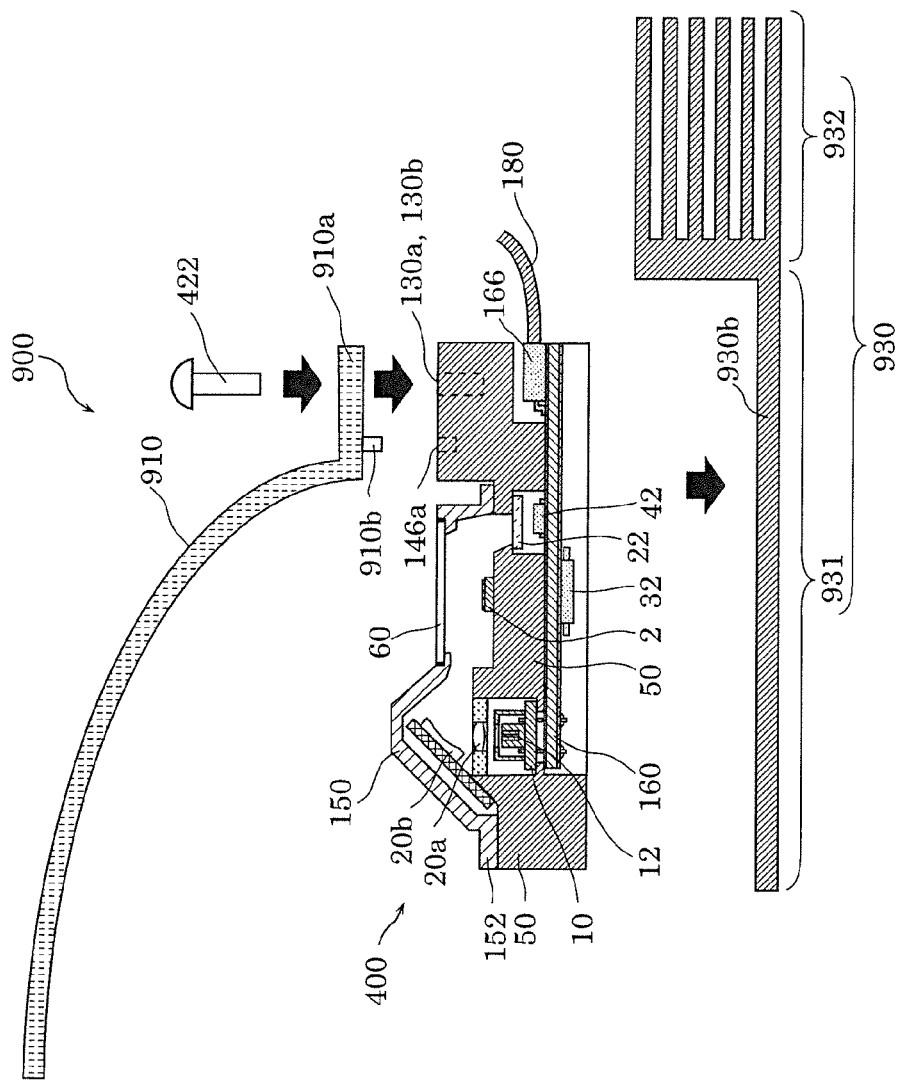
FIG. 34 is a schematic diagram for explaining a manufacturing method of the light projecting device configured by using the light source device according to embodiment 4.

FIG. 33 is a schematic sectional view illustrating a configuration of light projecting device 900 constituted by using light source device 400 according to embodiment 4. Moreover, FIG. 34 is a schematic diagram for explaining a manufacturing method of light projecting device 900 constituted by using light source device 400 according to embodiment 4.

In light projecting device 900, reference hole 146a for positioning with external heat radiator 930 made of heat radiation plate 931 disposed on first surface 50t side and heat radiation fin 932 with accuracy and long hole 146b which makes a pair with reference hole 146a are provided in light source device 400.

And light source device 400 is disposed so that first surface 50t side of the light source device is in contact with installation surface 930b in external heat radiator 930 and is fixed to through holes 140A, 140B, 140C, and 140C formed in a peripheral portion of base 50 by screws (not shown) or the like. Furthermore, in light projecting device 900, light projecting optical member 910 which is a parabolic mirror, for example, is fixed to second surface 50s of base 50 in light source device 400. At this time, fixing portion 910a is formed in light projecting optical member 910, and two reference pins 910b formed on this fixing portion 910a are aligned with reference hole 146a and long hole 146b formed in second surface 50s of base 50 in light source device 400. Then, light source device 400 and light projecting optical member 910 are fixed by two opening portions 910c and screw holes 130a and 130b formed in the same surface as reference hole 146a with two screws 422. As described above, by using light source device 400 of this embodiment, the heat radiator and the light projecting optical member required for light projecting device 900 can be positioned and fixed to light source device 400 easily. Therefore, light projecting device 900 can be configured and manufactured easily. Moreover, since first surface 50t of light source device 400 is fixed to external heat radiator 930, heat generated in semiconductor light-emitting device 10 can be easily radiated by heat radiation plate 931 of external heat radiator 930 from first surface 50t. And the heat conducted to heat radiation plate 931 is radiated to an outside air by heat radiation fin 932. Therefore, a temperature rise of semiconductor light-emitting device 10 can be easily reduced.

Subsequently, a portion other than mounted substrate 160 of light source device 400 of this embodiment will be described in detail.

Figure 35:
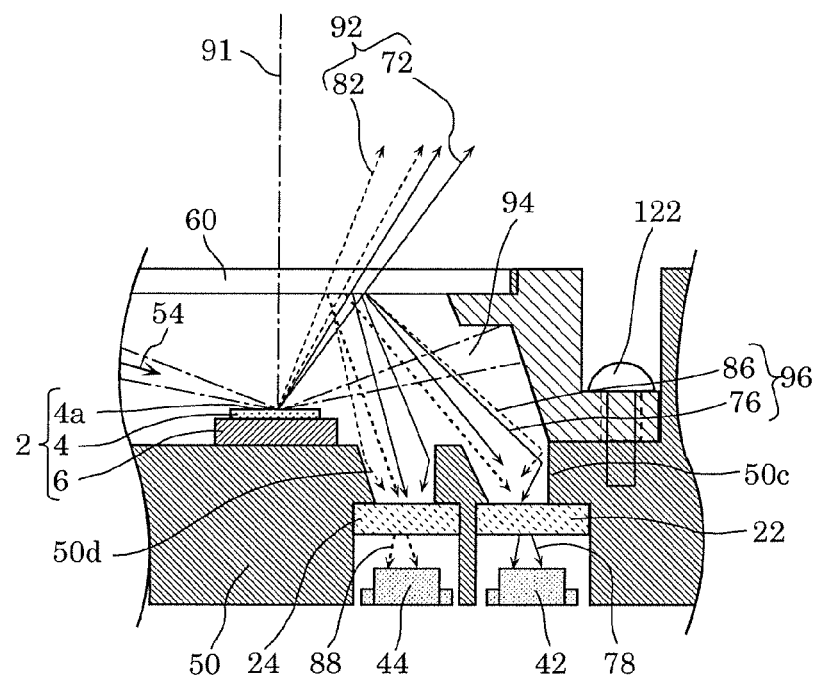
FIG. 35 is a schematic sectional view for explaining a configuration in the vicinity of a wavelength-converting element and a light-receiving element of the light source device according to embodiment 4.

FIG. 35 is a partial enlarged sectional view which enlarges the vicinity of wavelength-converting member 4, first light-receiving element 42, and second light-receiving element 44 of light source device 400. Emitted light 52 which is a laser beam with the wavelength of 450 nm, for example, is radiated from semiconductor light-emitting element 12 of semiconductor light-emitting device 10 and is converted to propagated light 54. Propagated light 54 incident to light emitter 4a of wavelength-converting element 2 is radiated as emitted light 92 in which first emitted light 72 and second emitted light 82 are mixed. A part of emitted light 92 is reflected by light transmitting member 60 and goes toward first light-receiving element 42 and second light-receiving element 44 as reflected light 96. Reflected light 96 is constituted by first reflected light 76 which is a first emitted light reflected by light transmitting member 60 and second reflected light 86 which is a second emitted light reflected by light transmitting member 60. And reflected light 96 passes through first optical filter 22 and second optical filter 24 and reaches first light-receiving element 42 and second light-receiving element 44.

At this time, reflected light 96 passes through light-guide opening portions 50c and 50d formed in base 50 and reaches first optical filter 22 and second optical filter 24. At this time, light-guide opening portions 50c and 50d may be configured to become smaller toward first light-receiving element 42 and second light-receiving element 44. By means of such configuration, reflected light 96 goes toward first light-receiving element 42 and second light-receiving element 44 while being multiply reflected by side surfaces of light-guide opening portions 50c and 50d and thus, reflected light 96 can be led to first light-receiving element 42 and second light-receiving element 44 efficiently.

Figure 36:
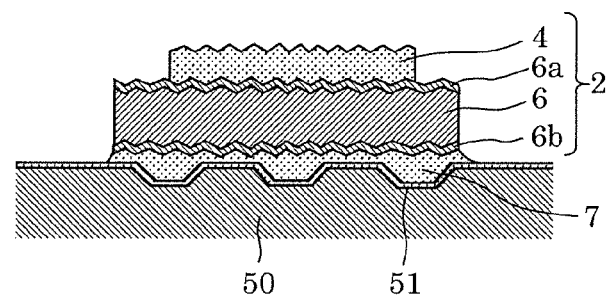
FIG. 36 is a schematic diagram for explaining a configuration in the vicinity of the wavelength-converting element of the light source device according to embodiment 4.

FIG. 36 is a schematic partial enlarged sectional view which enlarges wavelength-converting element 2 and the vicinity thereof. Wavelength-converting element 2 includes support member 6 and wavelength-converting member 4 disposed on support member 6. Wavelength-converting member 4 includes a fluorescent material activated by rare-earth elements. And the fluorescent material absorbs at least a part of propagated light 54 and emits fluorescence with a wavelength different from a wavelength of propagated light 54 as wavelength-converted light.

Irregularity is formed on the surface of base 50 on which wavelength-converting element 2 is installed. And bonding layer 51 made of a tin (Sn) or a nickel (Ni) plating layer, for example, is formed on the surface of base 50. Support member 6 of wavelength-converting element 2 is constituted by a silicon substrate, for example, and irregularity is formed also on the surface on wavelength-converting member 4 side and both surfaces of base 50 side. And reflection film 6a made of Ag and dielectric multi-layered film, for example, is formed on the surface on wavelength-converting member 4 side. And on the surface on base 50 side of support member 6, bonding layer 6b made of titanium, platinum, and gold is formed, for example. On the surface of reflection film 6a of support member 6, wavelength-converting member 4 made of a fluorescent material which is cerium-activated yttrium-aluminum-garnet fluorescent element is mixed with a transparent binding material made of silsesquioxane is formed.

Moreover, support member 6 and base 50 are bonded with bonding layer 6b and bonding layer 51 formed on the surface of each of them by bonding member 7 such as a low melting-point solder material made of tin, silver, and copper, for example.

Subsequently, a detecting method when abnormality occurs in the wavelength-converting member during the operation in light source device 400 with the aforementioned configuration will be described with reference to the drawings.

Figure 37A:
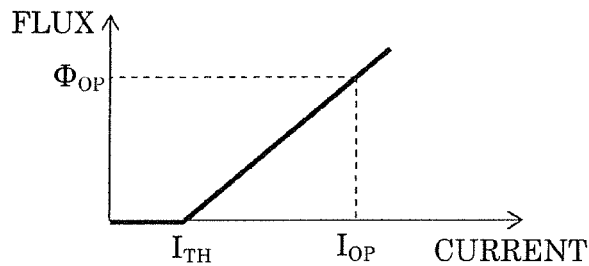
FIG. 37A is a view for explaining an operation of the light source device according to embodiment 4.
Figure 37B:
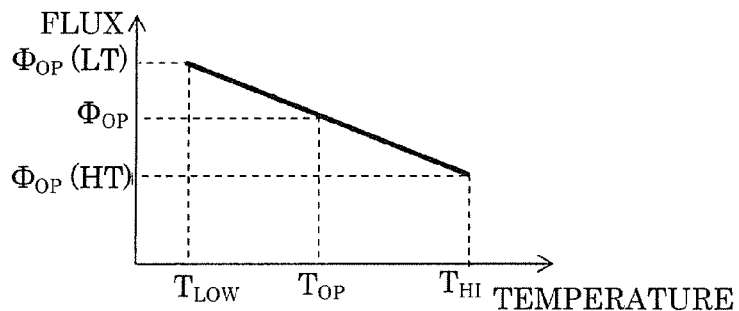
FIG. 37B is a view for explaining the operation of the light source device according to embodiment 4.
Figure 37C:
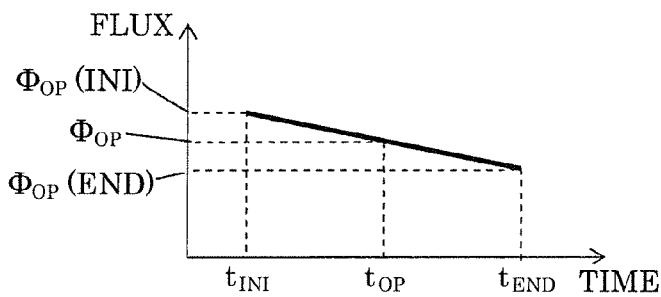
FIG. 37C is a view for explaining the operation of the light source device according to embodiment 4.

FIG. 37A to FIG. 37C are conceptual diagrams illustrating a relationship between an operation condition of the semiconductor light emitting device of the light source device and a light flux which is a light amount of the emitted light radiated from the wavelength-converting member. FIG. 37A illustrates a relationship between an electric current amount applied to semiconductor light-emitting device 10 of light source device 400 and a light flux of the emitted light emitted from the light source device. The light flux of the light source device is emitted having threshold value $I_{th}$ to the electric current amount applied to the light source device and has a characteristic that the light flux rapidly increases with an increase in the electric light amount exceeding threshold value $I_{th}$. Assume that light flux $\Phi_{OP}$ is emitted to electric current amount $I_{OP}$. FIG. 37B illustrates a relationship between a temperature of light source device 400, that is, semiconductor light-emitting device 10 and the light flux emitted from the light source device. In a normal operation, light flux $\Phi_{OP}$ is emitted to electric current amount Top, but if the temperature of the light source device rises, the light flux lowers and becomes light flux $\Phi_{OP}$(HT) at operation guaranteed upper-limit temperature $T_{HI}$. Moreover, if the temperature of the light source device lowers, the light flux increases, and light flux $\Phi_{OP}$(LT) is emitted at operation guaranteed lower-limit temperature $T_{LOW}$.

On the other hand, the light flux is also changed with respect to the operation time. FIG. 37C is a relationship between time during which light source device 400 is operated and the light flux of the emitted light. With regard to the light flux of light source device 400, the light flux of the light source device has a characteristic that the light flux can obtain light flux $\Phi_{OP}$(INI) at operation initial time $t_{IN1}$, but as the operation continues, the light flux gradually lowers and becomes light flux $\Phi_{OP}$(END) at time $t_{END}$ after the operation guaranteed period of time. As described above, the light amount emitted from the wavelength-converting member of the light source device is changed not only to abnormality of the wavelength-converting member but also to an environmental change during a normal operation of the light source device, that is, a change in the electric current amount to be applied, a change in the temperature of the light source device, and a change in the operation time of the light source device. This change in the light flux becomes a change in the light amount incident to the light-receiving element and becomes a change in signals $S_{PD1}$ and $S_{PD2}$ which are operation state signals output from the light-receiving element. Therefore, the change in signals $S_{PD1}$ and $S_{PD2}$ caused by the environmental change during the normal operation is not determined to be abnormality by microcontroller 32, and reference values $S_{1MAX}$, $S_{1MIN}$, $S_{2MAX}$, $S_{2MIN}$, need to be set for determining abnormality when wavelength-converting element 2 is damaged.

Figure 38A:
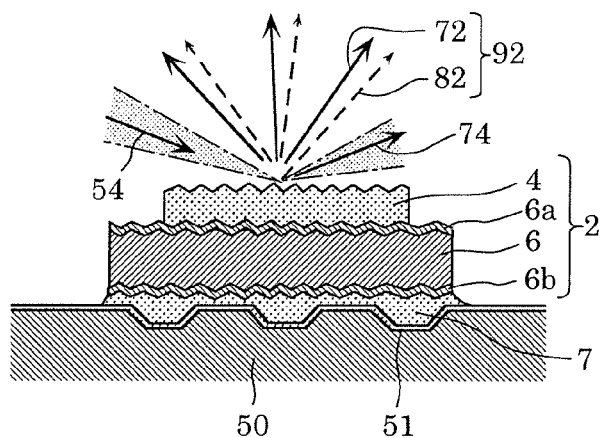
FIG. 38A is a view for explaining deformation and alteration of the wavelength-converting element according to embodiment 4.
Figure 38B:
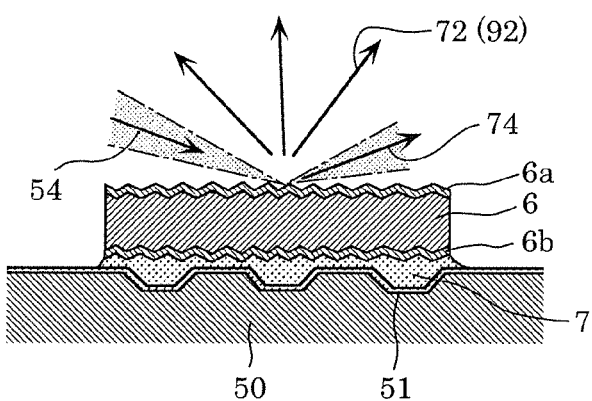
FIG. 38B is a view for explaining deformation and alteration of the wavelength-converting element according to embodiment 4.
Figure 38C:
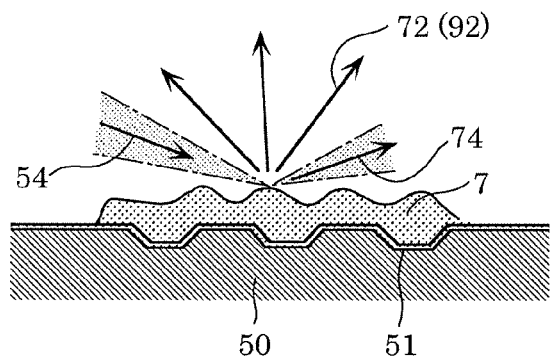
FIG. 38C is a view for explaining deformation and alteration of the wavelength-converting element according to embodiment 4.

Subsequently, a case where destruction of wavelength-converting element 2 of light source device 400 is determined by reference values $S_{1MAX}$, $S_{1MIN}$, $S_{2MAX}$, $S_{2MIN}$ will be described with reference to FIG. 38A to FIG. 38C. FIG. 38A illustrates a state where light source device 400 is normally operated. FIG. 38B is a diagram illustrating a case where wavelength-converting member 4 is completely separated from wavelength-converting element 2 of light source device 400. FIG. 38C is a diagram illustrating a case where whole wavelength-converting element 2 is separated from base 50.

Figure 40B:
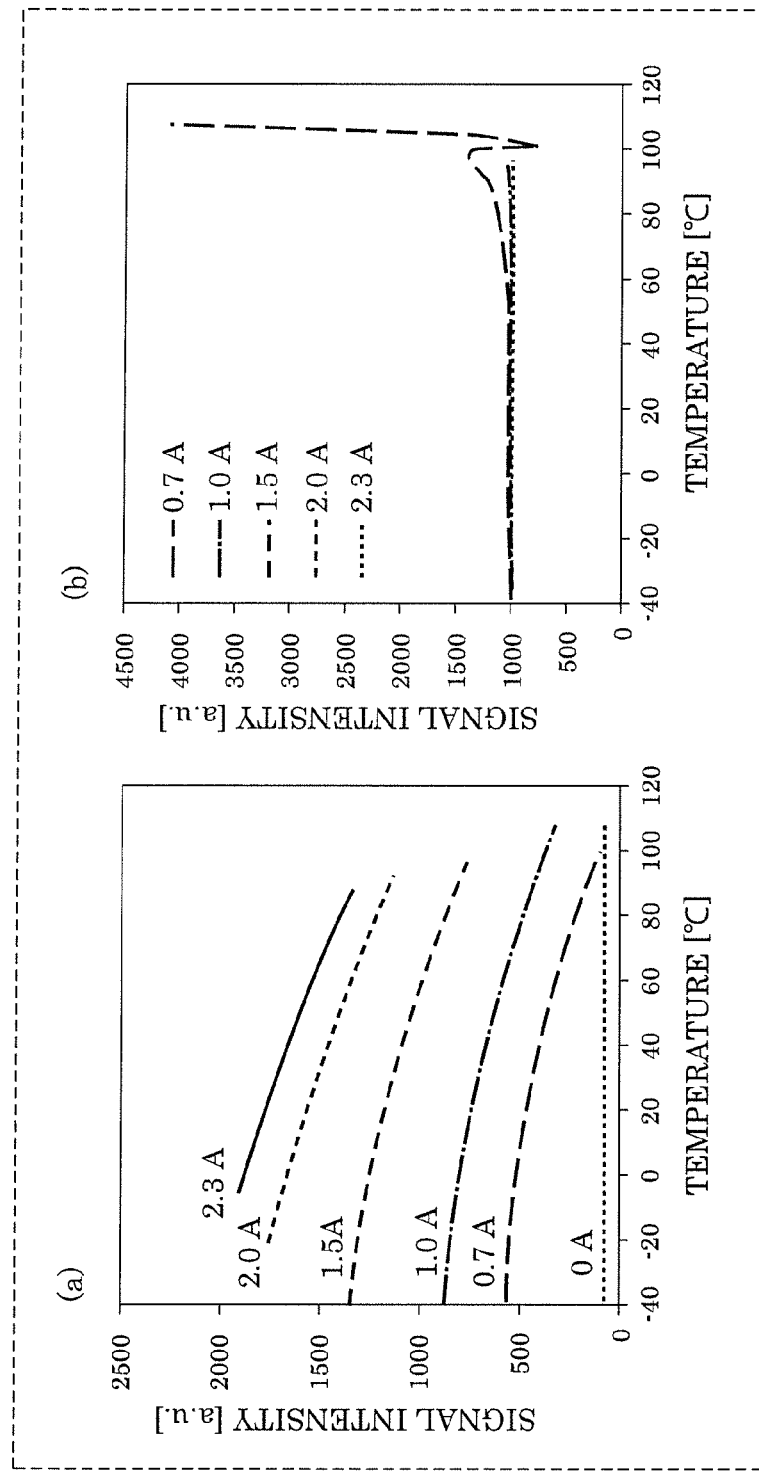
FIG. 40B is a view for explaining an example of a detection result of a state detection circuit according to embodiment 4.

FIG. 39, FIG. 40A, and FIG. 40B are diagrams for explaining examples of the detection results of state detection circuit 1 according to embodiment 4. More specifically, FIG. 39, FIG. 40A, and FIG. 40B illustrate results of actual measurement of a signal amount incident to the light-receiving element for each operation state of light source device 400. Moreover, results of determinations of (iii) to (vi) made in accordance with the algorithm in FIG. 23 on the basis of the results are illustrated. At this time, signals $S_{PD2}$ and $S_{PD1}$ extracted by first light-receiving element 42 and second light-receiving element 44 of state detection circuit 1 were standardized by 100 as described in a column in (A) in FIG. 39. Moreover, 50, 150, 70, and 130 were used as reference values $S_{2MIN}$, $S_{2MAX}$, $S_{1MIN}$, $S_{1MAX}$, respectively, at this time. In FIG. 39, (A) is a normal operation state at an environmental temperature of a room temperature (25° C.) and an applied electric current is $I_{OP}$, (B) is the normal operation state at the environmental temperature of the low temperature (−40° C.) and the applied electric current is $I_{OP}$, (C) is the normal operation state at an environmental temperature of the high temperature (+80° C.) and the applied electric current is $I_{OP}$, (D) is the normal operation state at the environmental temperature of the room temperature (25° C.) and after continuous operation at the applied electric current $I_{OP}$ for 500 hours, (E) is a state where the light source device is in an abnormal state and the wavelength-converting element is in a state of FIG. 38B, (F) is an operation state where the light source device is in the abnormal state and the wavelength-converting element is in a state of FIG. 38C, (G) is an operation state where the light source device is in the abnormal state and the wavelength-converting element is in a state of FIG. 24(b), and (H) is an operation state where the light source device is in the abnormal state and the wavelength-converting element is in a state of (c) in FIG. 24.

As a result, any of the operation states (B), (C), and (D) is determined to be normal from the signal from state detection circuit 1. On the other hand, the operation states (E), (F), and (H) are determined to be abnormal by signal $S_{PD2}$. Moreover, the operation state (G) is determined to be abnormal by signal $S_{PD1}$. By means of the aforementioned configuration, a normal operation state and an abnormal operation state can be determined by a light amount of the first emitted light and the light amount of the second emitted light.

Moreover, FIG. 40A illustrates a case where 70, 150, 70, and 130 are used as reference values $S_{2MIN}$, $S_{2MAX}$, $S_{1MIN}$, $S_{1MAX}$, respectively. In this case, the normal operation state and the abnormal state can be determined only by the light amount of the second emitted light.

Note that, other than the aforementioned configuration, the normal operation state and the abnormal operation state may be determined only by the light amount of the first emitted light by changing setting of the reference value to an appropriate value. Moreover, the normal operation state and the abnormal operation state can be also determined only by the light amount of the second emitted light.

By means of such configuration, a broken state of the fluorescent element can be accurately extracted and determined by detecting the light amount of at least either one of the first emitted light which is an emitted light scattered by the fluorescent element and the second emitted light which is fluorescence converted by the fluorescent element and emitted and by inputting into the microcontroller as the operation state signal. And light source device 400 can be stopped at a high speed by using transistor 30 mounted inside light source device 400 by using the determination result. Moreover, light source device 400 can be stopped by using a driving circuit connected to the outside by using external wiring from microcontroller 32.

Note that, in addition to the aforementioned configuration, the normal operation state and the abnormal operation state may be determined only by the light amount of the first emitted light by setting an appropriate value to a signal of the reference value.

Figure 37D:
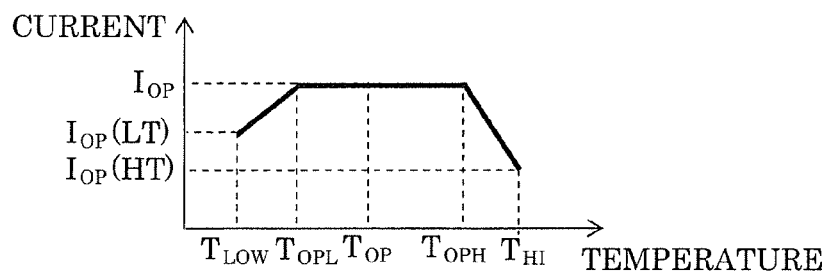
FIG. 37D is a view for explaining the operation of the light source device according to embodiment 4.

Moreover, in the light source device with the aforementioned configuration, the broken state of the wavelength-converting member which is one of the operation states of the light source device can be extracted more accurately by inputting the light amounts of the first emitted light which is a blue color scattered by the fluorescent element and the second emitted light which is fluorescence converted by the wavelength-converting member and emitted as operation state signals into the respective microcontrollers and by calculating a ratio between the first emitted light and the second emitted light. That is, a change in conversion efficiency of the wavelength-converting member can be precisely extracted and determined by detecting a ratio between the light absorbed by the wavelength-converting member and changed and the light not absorbed, Moreover, FIG. 40B illustrates an example of an experiment result when the operation state of the light source device is determined by using the algorithm in FIG. 31B. First, (a) in FIG. 40B is a result obtained by detecting a signal value output from the light-receiving element when the light source device is fabricated, the driving current is converted to 0 A, 0.7 A, 1.0 A, 1.5 A, 2.0 A, and 2.3 A, and the environmental temperature is changed from −40° C. to approximately 110° C. At this time, the light-receiving element is configured such that second emitted light which is fluorescence is mainly incident. The signal value increases along the relationship with the light flux of the emitted light illustrated in FIG. 37A when the driving current becomes larger. When the temperature becomes high, the signal value decreases along the relationship with the light flux of the emitted light illustrated in FIG. 37C. At this time, the driving current applied to the light source device was set at the temperature of $T_{OPL}$ or more and $T_{OPH}$ or less as illustrated in FIG. 37D, whereby deterioration of the semiconductor light-emitting device was suppressed.

When the light source device is operated in such high ranges of the driving current and the environmental temperature, the signal value output from the light-receiving element is extremely large with fluctuation of the emitted light. Therefore, the reference value which detects abnormality cannot be determined easily.

On the other hand, (b) in FIG. 40B illustrates a value obtained by converting signal value $S_{PD2}$ indicated in (a) in FIG. 40B by a conversion equation determined in advance. The temperature correction coefficient at this time was calculated by $P/(\alpha T^2+\beta T+\gamma)$ (P, $\alpha$, $\beta$, and $\gamma$ are arbitrary coefficients. T is an environmental temperature obtained from the temperature detection element). As a result, the converted value becomes substantially constant regardless of the driving current and the environmental temperature of the light source device, and in (b) in FIG. 40B, the reference values can be determined easily such that the reference value $S_{2MAX}$ is 1500 and $S_{2MIN}$ is 500, for example. In the experiment example in (b) in FIG. 40B, in the case where the driving current is 0.7 A and the environmental temperature is 70° C. or more, fluctuation is large even with the converted value. This is an influence of fluctuation in a threshold value $I_{th}$ of each light source device illustrated in FIG. 37A. Therefore, a lower limit of the driving current may be determined in accordance with the environmental temperature as a driving condition of the light source device.

By means of the aforementioned configuration, the operation state of the light source device can be accurately detected, and when abnormality occurs in the light source device, the operation can be accurately stopped.

Note that, in the conversion in FIG. 40B, the signal value was converted more accurately by subtracting a background component of the signal from the light-receiving element detected when the driving current was 0 A.

(Variation 1 of Embodiment 4)

A light source device according to variation 1 of embodiment 4 will be described by using FIG. 41.

Figure 41:
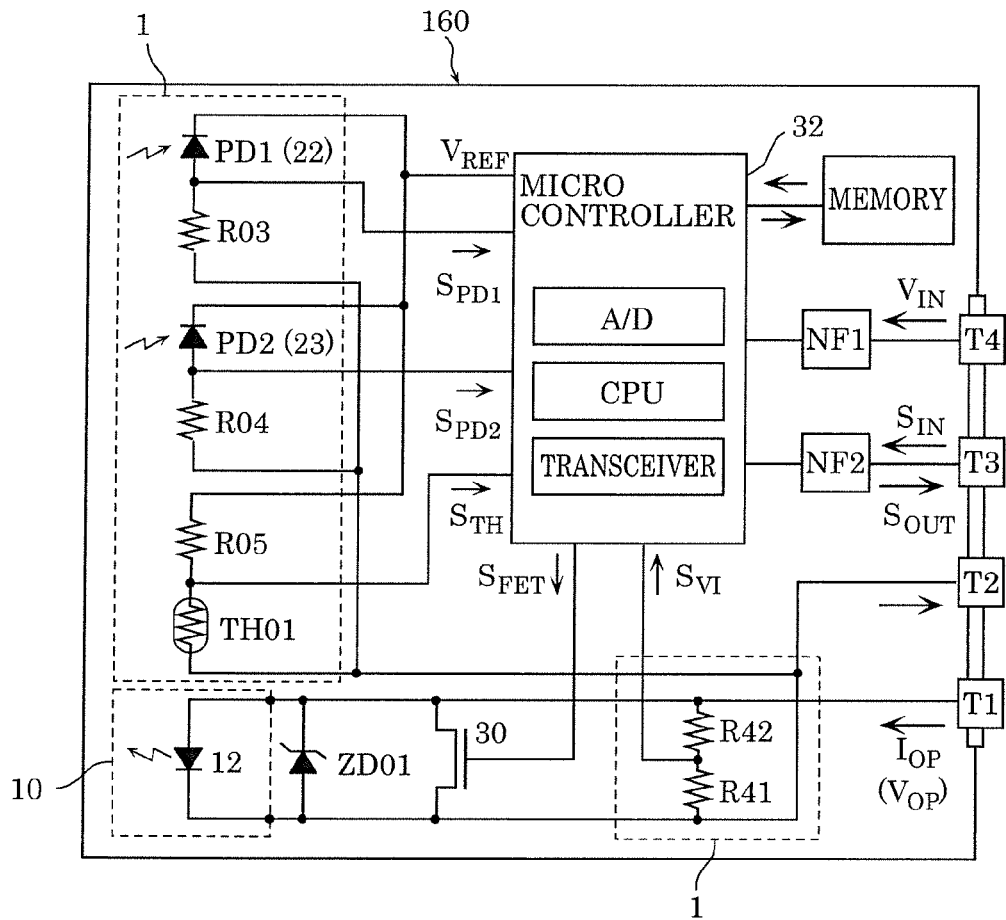
FIG. 41 is a circuit block diagram mounted on the light source device according to variation 1 of embodiment 4.

FIG. 41 illustrates a circuit block diagram of mounted substrate 160 mounted on the light source device according to variation 1 of embodiment 4. Mounted substrate 160 is different from the circuit block diagram in FIG. 31A and is connected in parallel with printed wiring connecting transistor 30 and the anode terminal of semiconductor light-emitting device 10 and printed wiring connecting transistor 30 and the cathode terminal of semiconductor light-emitting device 10. Thus, since an electric current does not flow in transistor 30 during the operation in a steady state, functional safety can be realized without increasing power consumption.

Moreover, in this variation, a non-volatile memory is further disposed outside microcontroller 32. By means of such configuration, since the non-volatile memory and a central processing unit of the microcomputer can be separately designed and disposed, the light emitting device can be configured more freely.

(Variation 2 of Embodiment 4)

Subsequently, a light source device according to variation 2 of embodiment 4 will be described with reference to FIG. 42 to FIG. 44. Since this variation has a substantially same configuration as that of embodiment 4, different portions will be mainly described.

Figure 42:
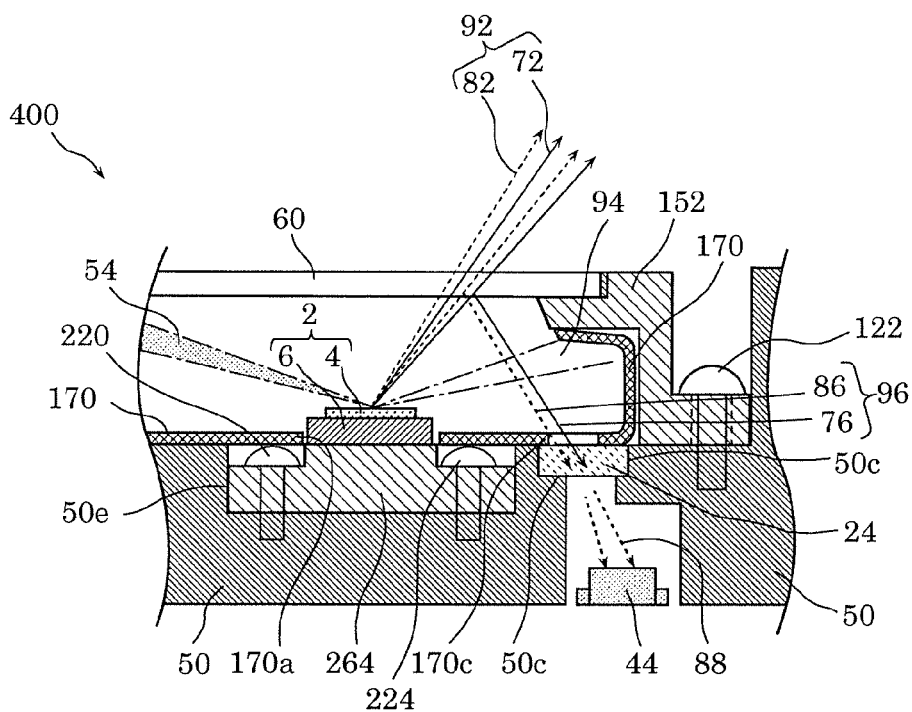
FIG. 42 is a schematic sectional view for explaining a configuration in the vicinity of the wavelength-converting element and the light-receiving element of the light source device according to variation 2 of embodiment 4.

FIG. 42 is a diagram which enlarges the vicinities of wavelength-converting element 2 and second light-receiving element 44 of light source device 400. In this variation, only second light-receiving element 44 and second optical filter 24 out of first light-receiving element 42, second light-receiving element 44, first optical filter 22, and second optical filter 24 will be described in order to facilitate the description.

In this variation, recess portion 50e is formed on a surface on base 50 at a position where wavelength-converting element 2 is disposed. Moreover, light-guide opening portion 50c is formed on base 50 similarly to embodiment 4 and the like, but a recess portion larger than a through hole is formed on wavelength-converting element 2 side, and first optical filter 22 is disposed in the recess portion. And wavelength-converting element 2 is fixed to holder 264, and holder 264 is further fixed in recess portion 50e by screws 222 and 224. At this time, as described in embodiment 4 in FIG. 36, holder 264 in which an aluminum alloy is tin-plated may be used so that wavelength-converting element 2 and holder 264 are fixed on a surface of an aluminum alloy, for example, with low melting-point solder. By means of such configuration, since wavelength-converting element 2 does not have to be directly fixed by soldering to base 50, surface plating processing of base 50 is not necessary, and a material of base 50 can be selected more freely.

Moreover, second optical filter 24 is inserted into base 50 from the side where wavelength-converting element 2 is disposed and fixed by an adhesive or the like. By means of such configuration, since wavelength-converting element 2 and second optical filter 24 can be fixed to base 50 from the same surface, manufacture of light source device 400 is facilitated.

Furthermore, the surface of base 50 in the vicinity of wavelength-converting member 4 is covered by base cover 170 which is a plate-shaped metal component. Base cover 170 may be constituted by metal such as an aluminum alloy and stainless steel. Furthermore, irregularity having average mean roughness substantially the same as a wavelength of the emitted light and arithmetic mean roughness of 0.5 µm or more may be formed on the surface. Moreover, base cover 170 may be constituted to be bent so as to face the advance direction of emitted light 94 emitted from wavelength-converting element 2 so that emitted light 94 is irradiated to the surface of base cover 170. By means of such configuration, emitted light 94 can be shielded by base cover 170 so that emitted light 94 is not irradiated to holding member 152.

Moreover, base cover 170 may cover a part of or the whole of the surface on the side opposite to base 50 side of holder 264. By means of such configuration, even if screws 222 and 224 fixing holder 264 to base 50 are loosened, removal from base 50 can be suppressed. Furthermore, base cover 170 covers a part of or the whole of the surface on a side opposite to base 50 side of second optical filter 24. By means of such configuration, even if adhesion performances of the adhesive fixing second optical filter 24 to base 50 lower, removal from base 50 can be suppressed. That is, light source device 400 can be configured robustly by using base cover 170.

Figure 43:
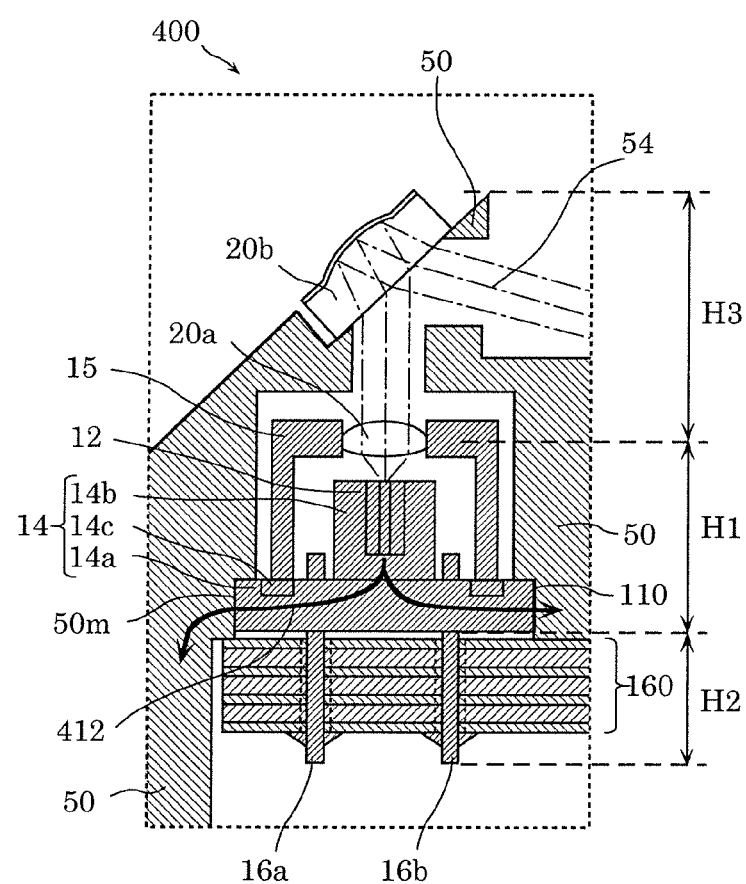
FIG. 43 is a schematic sectional view in the vicinity of a semiconductor light-emitting device of the light source device according to variation 2 of embodiment 4.
Figure 44:
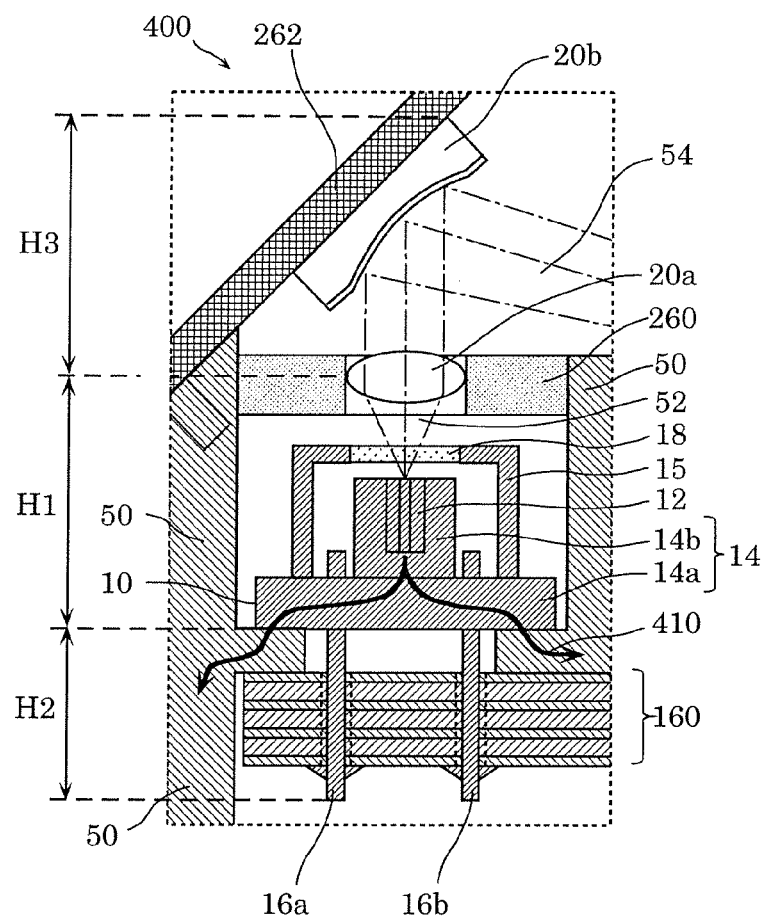
FIG. 44 is a schematic sectional view in the vicinity of the semiconductor light-emitting device of the light source device according to embodiment 4.

In this variation, as illustrated in FIG. 43 and FIG. 44, semiconductor light-emitting device 10 and its vicinity are also different.

FIG. 43 is an enlarged sectional view of semiconductor light-emitting device 10 according to variation 2 of embodiment 4 and the vicinity thereof, and FIG. 44 is an enlarged sectional view of semiconductor light-emitting device 10 according to embodiment 4 and the vicinity thereof. In semiconductor light-emitting device 10, package 14 is constituted by base 14a constituted by iron, heat sink 14b constituted by copper, and lead pins 16a and 16b. And semiconductor light-emitting device 10 is constituted by mounting semiconductor light-emitting element 12 on heat sink 14b, and by welding metal can 15 to which light transmitting member 18 is fixed to base 14a.

In embodiment 4 in FIG. 44, a recess portion was formed on wavelength-converting element 2 side of base 50, and semiconductor light-emitting device 10 was disposed. As a result, heat radiation path 410 goes from semiconductor light-emitting element 12 via heat sink 14b and base 14a, and heat is radiated to base 50 from a lower surface of base 14a.

On the other hand, in this variation 2 in FIG. 43, package 14 in which base 14a and heat sink 14b are integrally constituted by the same copper is used. Moreover, welding base 14c constituted by iron is formed on base 14a, and metal can 15 to which lens 20a is fixed is welded and fixed to welding base 14c of base 14a. In semiconductor light-emitting device 10 made as above, base 14a is fixed in the formed recess portion, that is, in opening portion 50m on base 50 from a side where mounted substrate 160 is disposed by press-fit, for example. At this time, heat radiation path 412 from base 14a to base 50 has a long distance from a side surface of base 14a to base 50 side, but since oxygen-free copper (390 W/mK) having heat conductivity of 5 times or more of iron with heat conductivity of 70 W/mK is used as a material of base 14a, a temperature rise of semiconductor light-emitting element 12 can be made equal to or less than that of embodiment 4. Moreover, since a part of base 50 is not fit between semiconductor light-emitting device 10 and mounted substrate 160, thickness H2 from the semiconductor light-emitting device to a joined portion with lead pins 16a and 16b on mounted substrate 160 can be made thinner. As described above, by making mounted substrate 160 with three layers or more and by combining a fixing method of the semiconductor light-emitting device of this variation, a width direction and a thickness direction of light source device 400 can be made smaller. Moreover, in this variation, since lens 20a is incorporated in semiconductor light-emitting device 110, the width can be further made thinner. That is, distance H1 between semiconductor light-emitting element 12 and lens 20a can be made smaller. Furthermore, by making distance H1 smaller, an effective diameter of lens 20a can be made smaller, and a beam diameter of emitted light 54 going toward reflection optical element 20b can be made smaller. As a result, the size of reflection optical element 20b can be made smaller, and the size of light source device 400 can be made further smaller. Furthermore, as illustrated in variation 2 in FIG. 43, a surface on a side opposite to the direction where semiconductor light-emitting device 10 is disposed is used as a reflection surface of reflection optical element 20b. By means of such configuration, since distance H3 from lens 20a to a farthest position of reflection optical element 20b can be made smaller, the size of the light source device can be further reduced.

(Variation 3 of Embodiment 4)

Subsequently, light source device 400 of variation 3 of embodiment 4 will be described with reference to FIG. 45.

Figure 45:
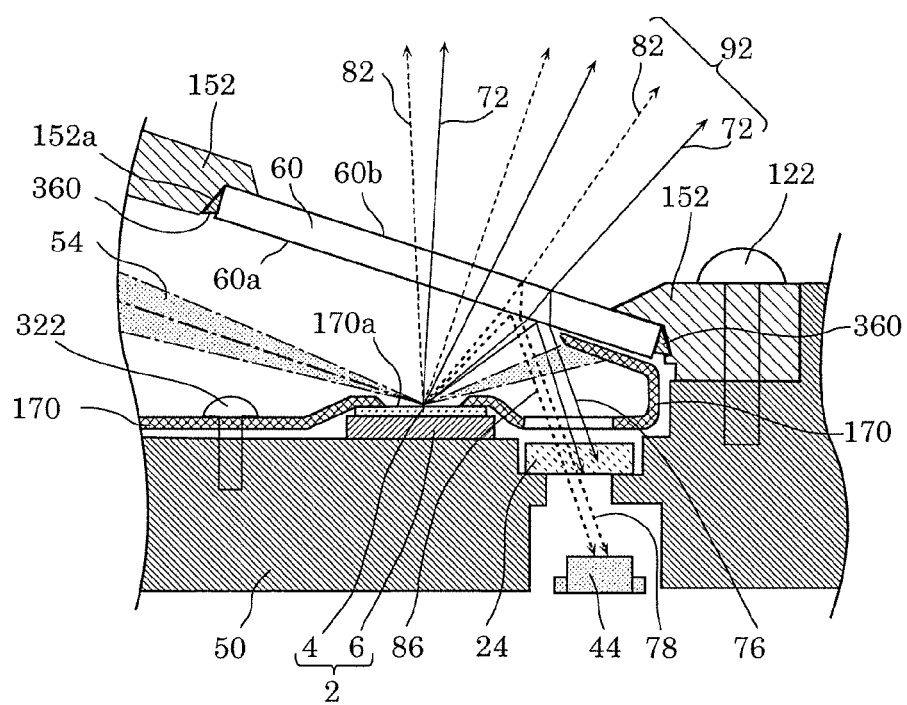
FIG. 45 is a view for explaining a configuration of the light source device according to variation 3 of embodiment 4.

FIG. 45 is a view which enlarges wavelength-converting element 2 of light source device 400 according to variation 3 of embodiment 4 and the vicinity of second light-receiving element 44. In this variation, only second light-receiving element 44 and second optical filter 24 out of first light-receiving element 42, second light-receiving element 44, first optical filter 22, and second optical filter 24 are described for explanation.

In this variation, a difference is that light transmitting member 60 has inclination with respect to wavelength-converting member 4. By means of such configuration, adjustment of an optical axis of the light reflected by light transmitting member 60 and incident to second light-receiving element 44 can be made more freely.

Particularly, a light reflected from surfaces 60a and 60b which are the surfaces on the both sides of light transmitting member 60 can be made incident to second light-receiving element 44 more freely. For example, an incident direction of first reflected light 76 and second reflected light 86 incident to second optical filter 24 can be made incident from a direction closer to the perpendicular with respect to the surface of second optical filter 24 as compared with the configuration of variation 2. Thus, an optical path of second emitted light 88 or the like led to second light-receiving element 44 through second optical filter 24 can be designed more easily.

In this embodiment, base cover 170 further covers a periphery of wavelength-converting element 2. That is, opening portion 170a is formed in base cover 170, and only wavelength-converting member 4 is exposed from the opening portion in the configuration. By means of such configuration, even if a light is irradiated to spots other than the vicinity of light emitter 4a of wavelength-converting element 2, the light can be scattered by base cover 170 in the configuration. Therefore, the operation state of the light source device can be detected by detecting a change in light amounts of first reflected light 76 and second reflected light 86 incident to first light-receiving element 42 or second light-receiving element 44.

Moreover, base cover 170 may be in contact with the surface of wavelength-converting element 2 in the vicinity of opening portion 170a. And base cover 170 is fixed to base 50 by screw 322. By means of such configuration, even if an adhesion function of an adhesive portion between wavelength-converting element 2 and base 50 lowers, wavelength-converting element 2 can be firmly fixed to base 50 by base cover 170. Therefore, removal of wavelength-converting element 2 itself from base 50 and an instantaneous change of the operation state of the light source device can be suppressed. Therefore, while a degree of an abnormal operation state of the light source device is small, the state is determined to be abnormal by the operation state detection circuit and can be fed-back to the microcontroller and the like.

Moreover, in this embodiment, opening portion 152a of holding member 152 has a stepped portion on base 50 side. And light transmitting member 60 is fixed to opening portion 152a by adhesive 360. By means of such configuration, even if adhesive 360 fixing light transmitting member 60 deteriorates, and light transmitting member 60 is removed, light transmitting member 60 is moved to base 50 side. Therefore, instantaneous loss from the optical path of emitted light 92 can be suppressed. Therefore, while the degree of an abnormal operation state of the light source device is small, the state is determined to be abnormal by the operation state detection circuit and can be fed-back to the microcontroller and the like.

Moreover, as illustrated in FIG. 45, light transmitting member 60 may be configured so as to be sandwiched by holding member 152 and base cover 170. By means of such configuration, light transmitting member 60 which leads emitted light 92 to the light-receiving element can be firmly fixed.

(Variation 4 of Embodiment 4)

Subsequently, light source device 400 of variation 4 of embodiment 4 will be described with reference to FIG. 46A.

Figure 46A:
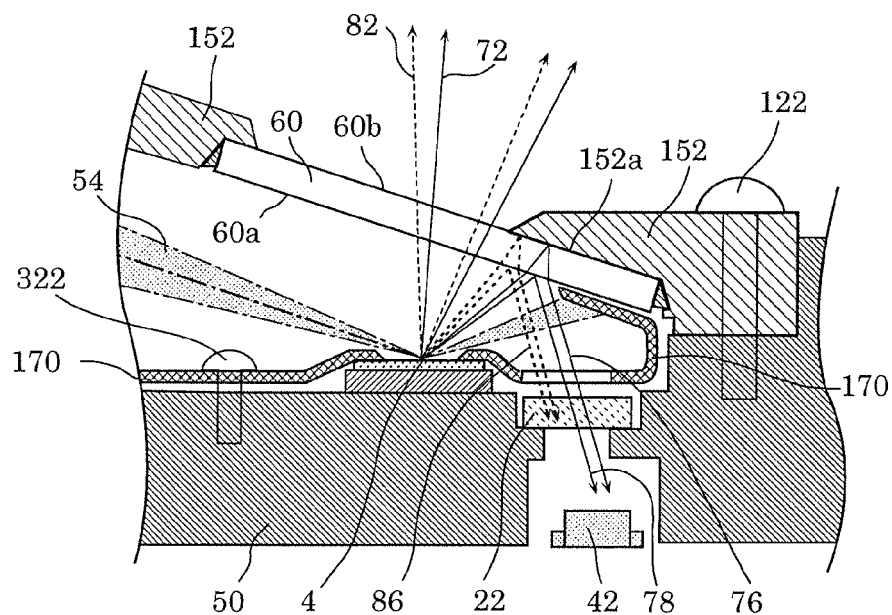
FIG. 46A is a view for explaining a configuration of the light source device according to variation 4 of embodiment 4.

FIG. 46A is a view which enlarges wavelength-converting element 2 of light source device 400 according to variation 4 of embodiment 4 and the vicinity of first light-receiving element 42. In this variation, only first light-receiving element 42 and first optical filter 22 out of first light-receiving element 42, second light-receiving element 44, first optical filter 22, and second optical filter 24 are described for explanation.

In this variation, holding member 152 of cover unit 150 is constituted so as to cover surface 60*b* side on an outer side of light transmitting member 60 as compared with variation 3. And the variation is designed such that the light going toward first light-receiving element 42 in a light emitted from wavelength-converting element 2 is reflected by the surface of opening portion 152*a* of holding member 152 of cover unit 150. By means of the configuration of this variation, adjustment of a light amount reflected by light transmitting member 60 and incident to first light-receiving element 42 can be made more freely. Moreover, since a region of surface 60*b* in the optical path of the light emitted from wavelength-converting element 2 and going toward first light-receiving element 42 is covered by means of this configuration, an ambient light from outside the light source device passes through light transmitting member 60, enters first light-receiving element 42, and output of a signal determined to be abnormal by the state detection circuit regardless of the normal state of the light source device can be suppressed.

(Variation 5 of Embodiment 4)

Figure 46B:
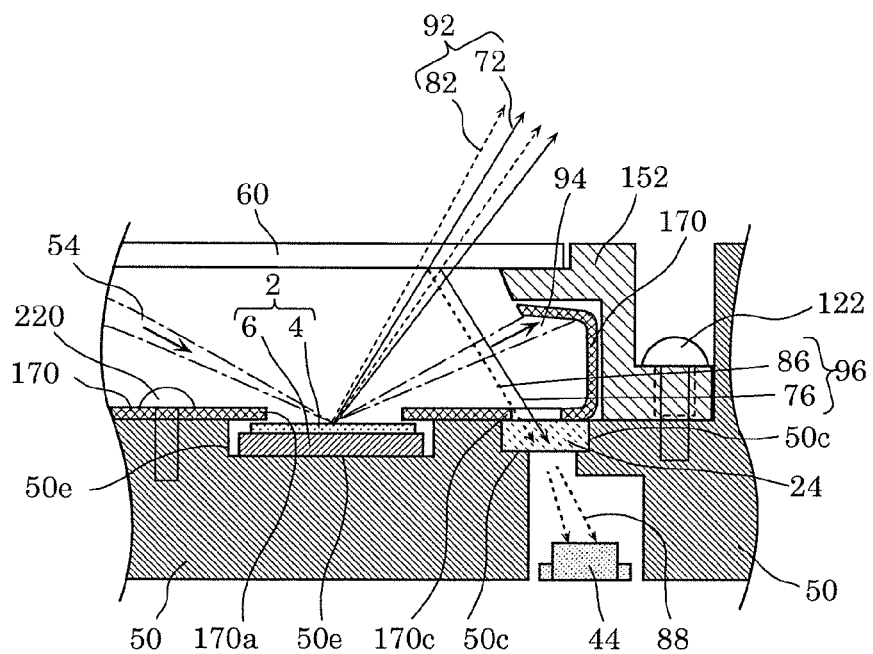
FIG. 46B is a view for explaining a configuration of the light source device according to variation 5 of embodiment 4.

Subsequently, light source device 400 of variation 5 of embodiment 4 will be described with reference to FIG. 46B.

In this variation, recess portion 50*e* is formed on a surface of base 50 at a position where wavelength-converting element 2 is disposed. Moreover, light-guide opening portion 50*c* is formed on base 50 similarly to embodiment 4 and the like, but a recess portion larger than a through hole is formed on wavelength-converting element 2 side, and second optical filter 24 is disposed in the recess portion. And wavelength-converting element 2 is fixed in recess portion 50*e*. At this time, wavelength-converting element 2 is fixed to recess portion 50*e* by an adhesive or solder. At this time, base cover 170 covers a part of or the whole of the surface of wavelength-converting member 4. By means of such configuration, even if the adhesion performances of the adhesive fixing wavelength-converting element 2 to base 50 lower, removal of wavelength-converting element 2 from base 50 can be suppressed. That is, light source device 400 can be configured more robustly by using base cover 170.

Note that, in the aforementioned embodiments and variations, base cover 170 in which black alumite-working is applied on the surface of an aluminum alloy plate or in which a black paint is formed on the surface of a stainless plate may be used. By means of such configuration, attenuation of first emitted light 74 can be promoted more.

(Variation 6 of Embodiment 4)

Subsequently, light source device 400 according to variation 6 of embodiment 4 will be described with reference to FIG. 47.

Figure 47:
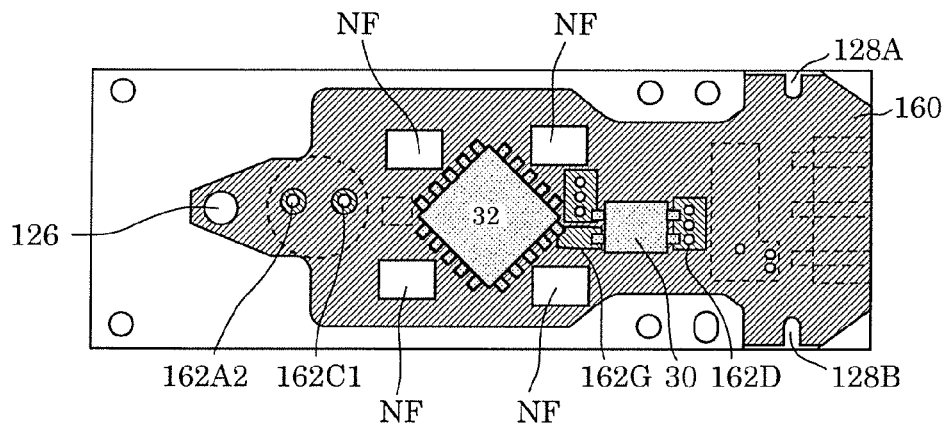
FIG. 47 is a view for explaining a configuration of the light source device according to variation 6 of embodiment 4.

FIG. 47 is a view for explaining a configuration of light source device 400 according to variation 6 of embodiment 4.

In this variation, a circuit layout of mounted substrate 160 in light source device 400 is different. Microcontroller 32 mounted on mounted substrate 160 has a substantially regular square or substantially rectangular outer shape and is disposed so that the long side direction of mounted substrate 160 is not in parallel with any of sides of microcontroller 32.

By means of such configuration, withdrawal of a large number of wirings from microcontroller 32 is made easy, and by effectively using a space, peripheral circuits can be designed on mounted substrate 160 more freely. And a length in the width direction of mounted substrate 160 can be made smaller in plan view. As a result, the size of light source device 400 can be reduced. More specifically, as illustrated in FIG. 47, four filter circuits NF can be disposed without changing the length of mounted substrate 160 in a short axis direction on four sides of microcontroller 32. Therefore, a function of mounted substrate 160 can be improved, and the size reduction of light source device 400 can be realized.

Embodiment 5

A configuration of light source device 500 according to embodiment 5 and light projecting device 900 using light source device 500 will be described with reference to FIG. 48 to FIG. 50A. Since light source device 500 of this embodiment has a substantially same structure as that of embodiment 4, only different portions will be described.

Figure 48:
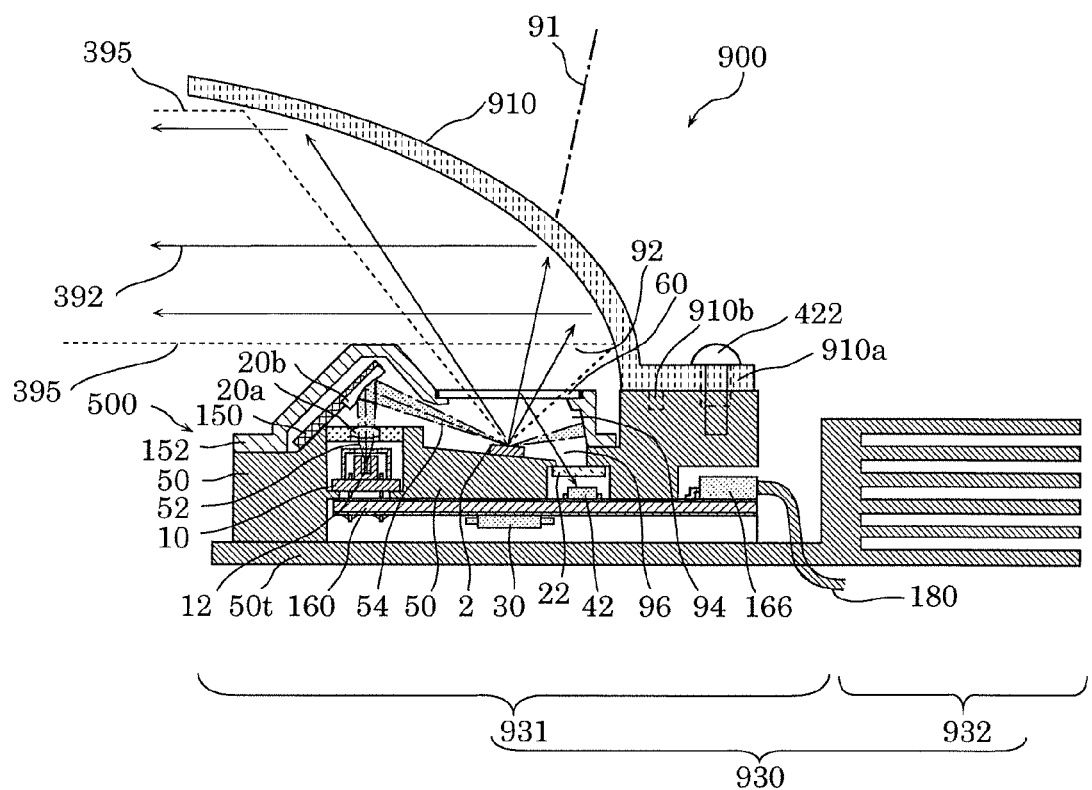
FIG. 48 is a schematic sectional view of a light projecting device according to embodiment 5.

FIG. 48 is a schematic sectional view of light projecting device 900 using light source device 500 according to embodiment 5. Light source device 500 of this embodiment has first surface 50*t* of base 50 fixed to an external device such as external heat radiator 930 similarly to embodiment 4. And emitted light 52 emitted from semiconductor light-emitting device 10 fixed to base 50 becomes propagated light 54 by lens 20*a* and reflection optical element 20*b* and is incident to wavelength-converting element 2. At this time, wavelength-converting element 2 is inclined to first surface 50*t* in a direction opposite to the incident side of propagated light 54. And light transmitting member 60 disposed above wavelength-converting element 2 is disposed in parallel with first surface 50*t*. By means of such configuration, emitted light 92 emitted to main axis 91 which is a normal direction from wavelength-converting element 2 passes diagonally through light transmitting member 60. Therefore, a part of emitted light 92 which is reflected by light transmitting member 60 and advances in the normal direction is diagonally reflected and is irradiated to base 50 closer to a position shifted in the direction opposite to the incident side of propagated light 54 than the position of wavelength-converting element 2. Therefore, by disposing first light-receiving element 42 at this portion, a part of emitted light 92 advancing in the normal direction can be led to first light-receiving element 42. Therefore, a light in an emission angle region with large light intensity in the light emitted from wavelength-converting element 2 can be contained within a detection range and thus, the operation state related to light emission of the light source device can be detected more accurately.

Figure 49A:
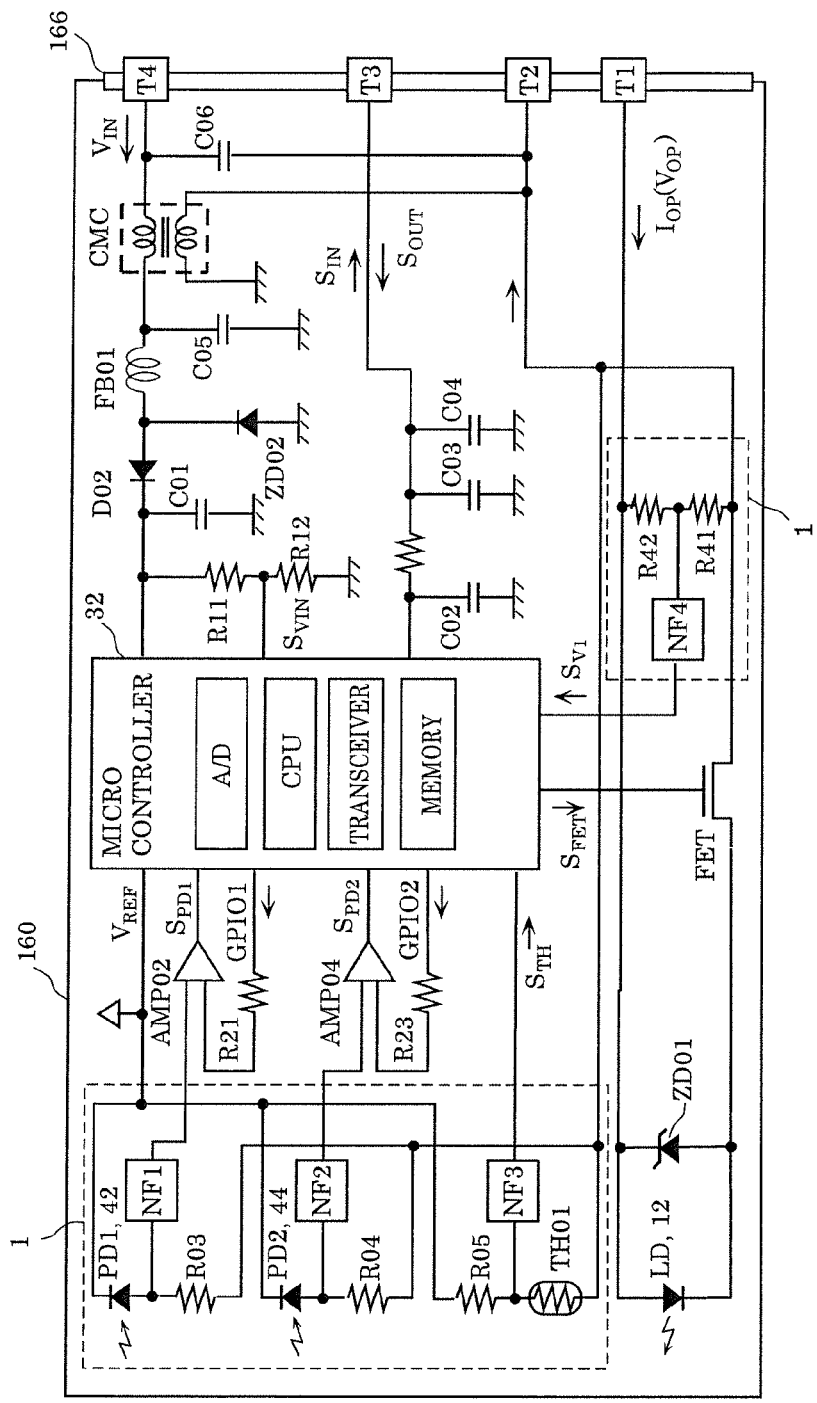
FIG. 49A is an example of a circuit block diagram of a mounted substrate mounted on the light source device according to embodiment 5.
Figure 49B:
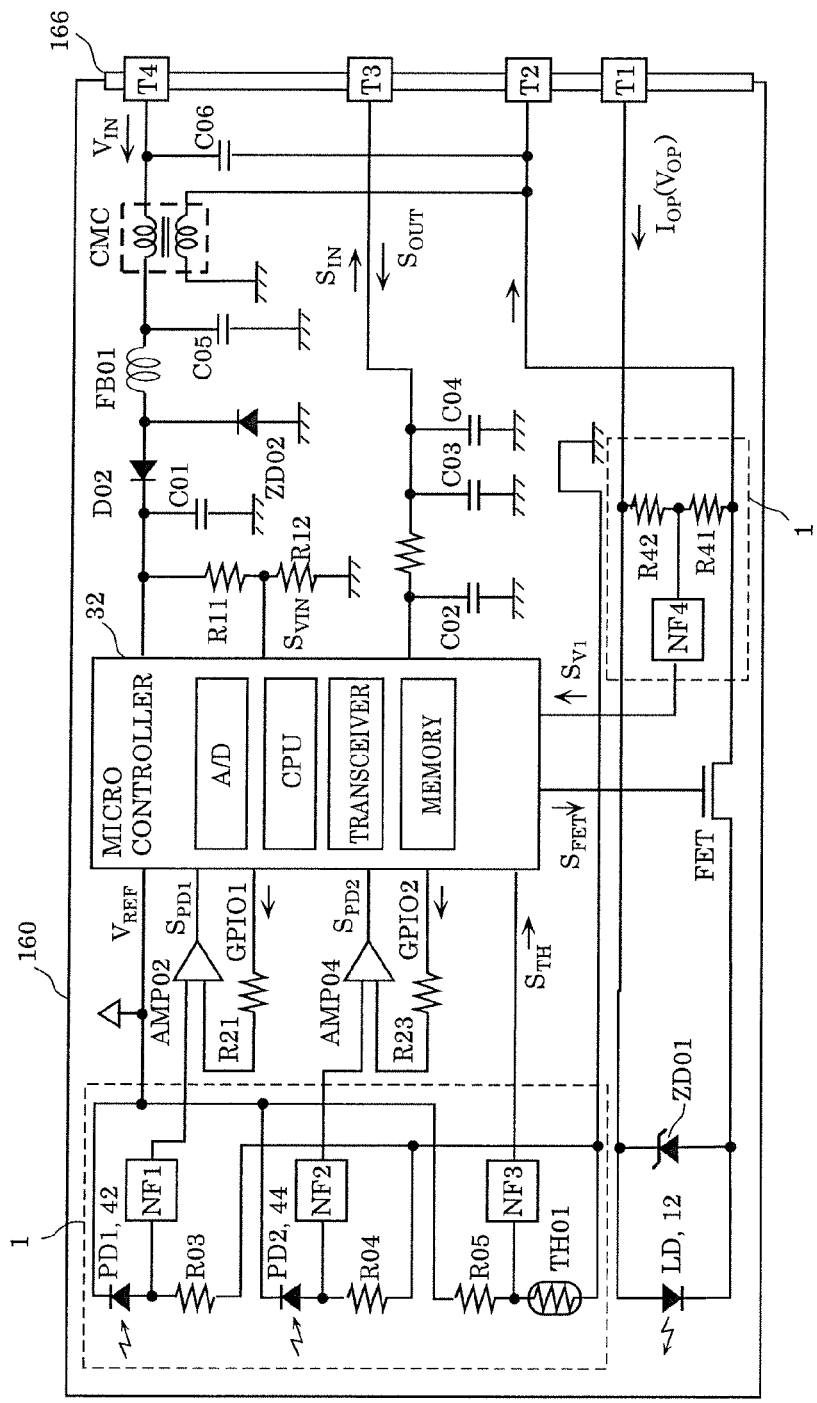
FIG. 49B is an example of the circuit block diagram of the mounted substrate mounted on the light source device according to embodiment 5.

FIG. 49A and FIG. 49B are diagrams illustrating examples of circuit block diagrams of an electric circuit mounted on mounted substrate 160 mounted in light source device 500 according to embodiment 5. In this embodiment, state detection circuit 1 includes resistors R42 and R41 connected in parallel-series to semiconductor light-emitting device 10 and can input signal $S_{V1}$ which is an operation state signal related to a voltage applied to semiconductor light-emitting device 10 into microcontroller 32. Moreover, state detection circuit 1 includes first light-receiving element 42, second light-receiving element 44, and temperature detection element THO1. First light-receiving element 42 receives a part of a first emitted light generated by scattering of emitted light 52 of semiconductor light-emitting device 10 by wavelength-converting element 2. Light-receiving element 44 receives a second emitted light generated by wavelength-conversion of emitted light 52 of semiconductor light-emitting device 10 by wavelength-converting element 2. At this time, the operation state signal output from first light-receiving element 42 becomes signal $S_{PD1}$ with an output adjusted by a gain switching circuit including amplifier AMP02 and resistor R21 and is input into microcontroller 32. Moreover, a signal output from second light-receiving element 44 also becomes signal $S_{PD2}$ with an output adjusted by a gain switching circuit including amplifier AMP04 and resistor R23 and is input into microcontroller 32. On the other hand, power voltage VIN to microcontroller 32 is input from terminal T4 of external connecting member 166. At this time, power voltage VIN from terminal T4 passes through a filter circuit constituted by ferrite beads FB01, Zener diode ZD02, and the like and is input into microcontroller 32.

In this embodiment, microcontroller 32 having a non-volatile memory is mounted on mounted substrate 160. By means of such configuration, a reference value of proper abnormality determination standard can be stored as a state determination standard of a light source device for each light source device as an initial value of the light source device. More specifically, in an inspection process during manufacture of a light source device, semiconductor light-emitting device 10 is lighted under a predetermined measurement condition, reference values $S_{2MIN}$, $S_{2MAX}$, $S_{1MIN}$, and $S_{1MAX}$ are calculated from the measurement results of an initial state at that time and can be stored in the non-volatile memory. By means of such configuration, proper reference values can be stored for individual light source devices, and a state of the light source device can be determined for each individual more accurately. Moreover, microcontroller 32 mounted on mounted substrate 160 has a transceiver function. And a terminal of the communication function of microcontroller 32 is connected to terminal T3 of external connecting member 166. At this time, a filter circuit constituted by capacitors CO2 and CO3 is disposed between the aforementioned terminal of the communication function and terminal T3. By means of such configuration, the determination result of microcontroller 32 can be transmitted to an external driving circuit, not shown, by using communication means. And a corresponding electric current be applied to light source device 500 by using the external driving circuit on the basis of the determination result.

Moreover, a signal related to an initial light amount value of either one of or both of a light amount of first emitted light and a light amount of second emitted light when the light source device is operated under a predetermined measurement condition in which a predetermined electric current value and a predetermined temperature are determined when the light source device is in the initial operation state may be stored in the non-volatile memory. And information on the electric current amount to be applied may be transmitted to the external control circuit by the communication means in accordance with the initial light amount value, and the predetermined electric current value may be applied to the semiconductor light-emitting device from the external driving circuit. By means of such configuration, the light source device can cause a constant light amount of the emitted light to be emitted regardless of a temperature change or aging over time. Thus, when the light source device is used as a front lamp of a vehicle or the like, front is irradiated with a constant illumination, whereby safety is improved. Moreover, since the initial light amount can be stored for each light source device, a signal reference value based on a constant ratio can be set for each light source device. Therefore, even if there is an individual difference in optical characteristics of the light source device, an abnormal operation state can be detected accurately regardless of the individual difference.

Moreover, as illustrated in FIG. 37C, the semiconductor light-emitting device has a characteristic that an optical output lowers as the operation time increases. Therefore, an aging variation coefficient which has operation time dependency of the optical output of the semiconductor light-emitting device is stored in the non-volatile memory of the light source device. At this time, light amount information of the light source device in an initial stage of the operation is also recorded in the non-volatile memory. And accumulated operation time of semiconductor light-emitting device 10 is measured by microcontroller 32 and is stored in the non-volatile memory. And an optimal driving current value is calculated by performing calculation by the microcontroller using the initial light amount value, the aging variation coefficient, and the accumulated operation time. And the optimal driving current value may be transmitted to the external driving circuit by using the communication means so that the predetermined electric current value is applied to the light source device from the external driving circuit. By configuring as above, the light amount of the emitted light emitted from the light source device can be made constant regardless of the operation time. Therefore, since the light amount received by the light-receiving element also becomes constant regardless of the operation time if there is no abnormality in the light source device, the abnormality of the light source device can be detected more accurately.

Moreover, an initial temperature value which is temperature information of the temperature detection element in the initial state may be stored in the non-volatile memory of microcontroller 32. That is, if there is a difference between the operation state signal at a temperature output by the temperature detection element of state detection circuit 1 of the light source device and a temperature of the light source device to be a reference, for example, the difference can be stored in advance. More specifically, the light source device is assembled in the light projecting device, for example, and the light projecting device is operated at a predetermined electric current value under a constant atmospheric temperature, and the value of the temperature detection element at that time is stored in the non-volatile memory. And when the light projecting device is operated by being used as the front lamp of an automobile, the atmospheric temperature is estimated to the temperature measured by the temperature detection element of state detection circuit 1 and output. Then, the driving current of the light source device to be applied with respect to the atmospheric temperature is calculated. By configuring as above, the state can be detected more accurately with respect to the temperature of the light source device, and the light source device can be operated accurately.

Moreover, the driving current value to the temperature of the light source device may be stored in the non-volatile memory of microcontroller 32. And the electric current value to be applied to the semiconductor light-emitting device may be determined by using the driving current value with respect to the stored temperature. As illustrated in FIG. 37D, for example, the driving current is lowered at temperature $T_{OPL}$ or less and the driving current may be lowered also at temperature $T_{OPH}$ or more. By operating as above, deterioration at COD of the semiconductor light-emitting device can be suppressed at a low temperature. Moreover, at a high temperature, deterioration caused by a temperature rise of an activated layer in the semiconductor light-emitting element of the semiconductor light-emitting device can be suppressed.

Figure 50A:
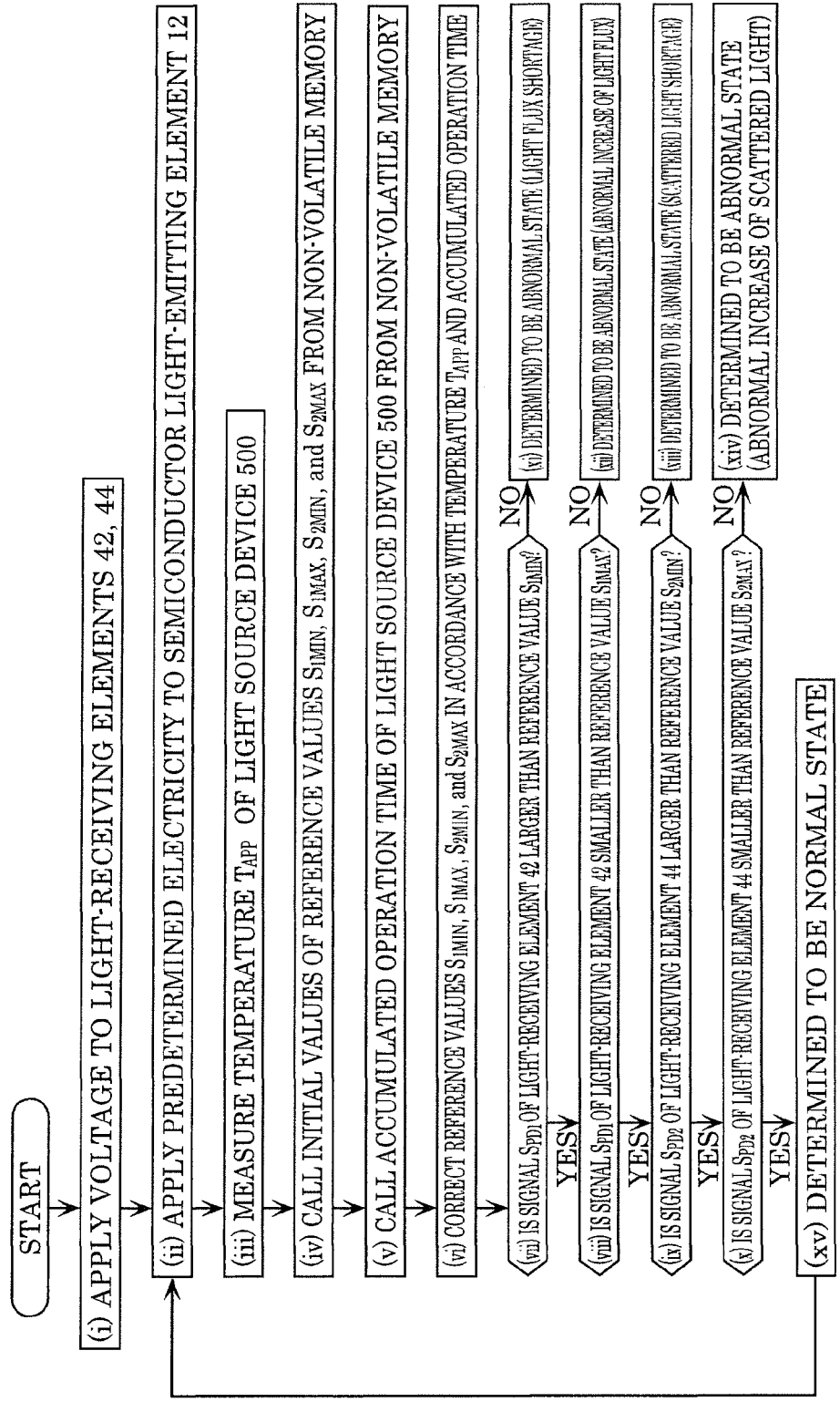
FIG. 50A is a flowchart for explaining an operation which detects a state of the light source device according to embodiment 5.

Note that, a method of detecting and determining the operation state of the light source device in accordance with the temperature or the accumulated operation time when light source device 500 is operated can be executed on the basis of a flowchart illustrated in FIG. 50A, for example.

More specifically, when the operation of light source device 300 is to be started, initially, (i) a predetermined voltage is applied to first light-receiving element 42 and second light-receiving element 44 of state detection circuit 1. Subsequently, predetermined electricity is applied to semiconductor light-emitting element 12, and signals $S_{PD1}$ and $S_{PD2}$ which are output voltages from first light-receiving element 42 and second light-receiving element 44 are determined by microcontroller 32 in the following order. First, (ii) predetermined electricity is applied to semiconductor light-emitting element 12, and the emitted light which is a laser beam is radiated. Subsequently, (iii) temperature $T_{APP}$ of light source device 500 is measured. Then, (iv) initial values of reference values $S_{1MAX}$, $S_{1MIN}$, $S_{2MAX}$, and $S_{2MIN}$ are called from the non-volatile memory and stored in the microcontroller. Subsequently, (v) the accumulated operation time of light source device 500 is called from the non-volatile memory and stored in the microcontroller. Subsequently, (vi) reference values $S_{1MAX}$, $S_{1MIN}$, $S_{2MAX}$, and $S_{2MIN}$ are corrected in accordance with temperature $T_{APP}$ and the accumulated operation time. After conducting such calculation, (vii), (viii), (ix) and (x) which are a sequence similar to sequences (iii), (iv), (v), and (vi) in FIG. 23 of embodiment 3 are executed. When the determinations from (vii) to (ix) are all cleared, (xv) the operation state is determined to be normal, the operation of light source device 500 is continued, and the routine proceeds to step (ii) after a predetermined time.

As described above, by determining signals $S_{PD1}$ and $S_{PD2}$ on the basis of the aforementioned flow inside microcontroller 32, the operation state inside light source device 300 can be detected easily and accurately.

Moreover, in this embodiment, as illustrated in FIG. 49A and FIG. 49B, filter circuits NF1 and NF2 are provided between output terminals of light-receiving elements 42 and 44 and an input terminal of microcontroller 32. Filter circuits NF1 and NF2 may be filter circuits of two stages or more or two orders or more constituted by combining two types or more of resistors and two types or more of capacitors, for example. At this time, a high-frequency component of the operation state signal from the light-receiving element is removed by combining a plurality of filter circuits or more specifically, by combining a plurality of low-pass filters. By means of such configuration, even if pulsed light is emitted by driving semiconductor light-emitting device 10 of light source device 500 by pulse-width modulation (PWM) driving, for example, the signal from the light-receiving element can be smoothened by the filter circuits. Thus, the operation state signal output from the light-receiving element does not have to be synchronized with the calculation of microcontroller 32, and a signal amount of the operation state signal of the light-receiving element can be detected accurately with simple configuration.

Moreover, in this embodiment, the signal from the light-receiving element input into microcontroller 32 of light source device 500 is averaged by signal processing (software) in microcontroller 32. By means of such configuration, even if the light source device is driven in a PWM driving mode, a pulse signal output from the light-receiving element can be averaged and input into a calculator of the microcontroller and thus, a light of the semiconductor light-emitting device can be detected by the light-receiving element.

Moreover, in light source device 500 of this embodiment, as illustrated in FIG. 49A and FIG. 49B, the filter circuit is inserted on wiring connecting terminal T4 of external connecting member 166 and microcontroller 32. At this time, a common-mode choke coil (CMC) is disposed between external connecting member 166 and the input terminal of microcontroller 32. By means of such configuration, a noise accompanying a high-frequency pulse generated in microcontroller 32 is transmitted to external connecting member 166 from the microcontroller side and to the external wiring connected to external connecting member 166, the driving circuit, a battery, and the like, and mis-operation of other electric circuits connected to the battery and the like can be suppressed. Moreover, the light source device may be used by changing an operation current such as a pulse-current operation. At this time, an output signal of the light-receiving element or the temperature detection element is rapidly changed by a change in a light amount of emitted light 92 of the light source device and a change in a heat generation amount, and a jitter on a ground level is generated. This ground-level jitter becomes a noise. In this case, as in the configuration of the electric circuit in FIG. 49B, the ground wiring connected to state detection circuit 1 constituted by light-receiving elements 42 and 44, temperature detection element THO1, and the like is connected to external connecting member 166 through CMC. By means of such configuration, the noise caused by the ground-level jitter is output to the outside, and mis-operation of the other electric circuits can be suppressed.

Moreover, in light source device 500 of this embodiment, as illustrated in FIG. 49A and FIG. 49B, a gain switching circuit is provided on electric wiring between the light-receiving element and the microcontroller. By means of such configuration, even under a driving condition different from the normal driving condition of the light source device, signal intensity of signal $S_{PD1}$ or $S_{PD2}$ which is an operation state signal can be adjusted. That is, even if light source device 500, that is, semiconductor light-emitting device 10 is driven with a sufficiently small electric current amount, different from the normal driving condition, for example, the signal output from the light-receiving element upon receipt of light radiated from the wavelength-converting member can be detected accurately. Thus, the operation state of the wavelength-converting member can be detected accurately.

In the aforementioned light source device, the non-volatile memory is assumed to be incorporated in microcontroller 32, but this is not limited. The non-volatile memory may be mounted on mounted substrate 160, and determination may be made by microcontroller 32 by exchanging data with microcontroller 32 in communication, for example.

(Variation 1 of Embodiment 5)

Subsequently, light source device 500 and light projecting device 900 according to variation 1 of embodiment 5 will be described with reference to FIG. 50B.

Figure 50B:
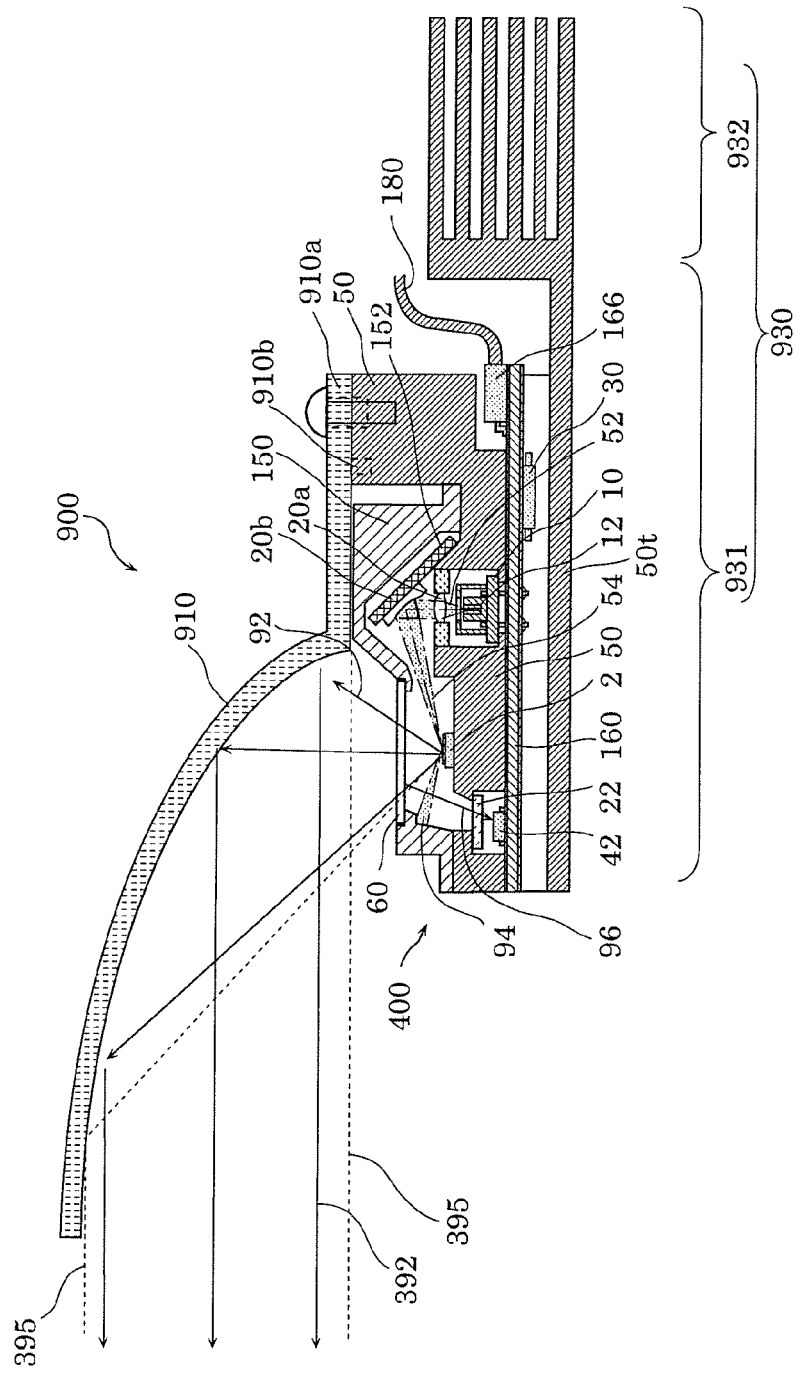
FIG. 50B is a schematic sectional view of the light projecting device according to variation 1 of embodiment 5.

FIG. 50B is a schematic sectional view of light projecting device 900 using light source device 500 according to variation 1 of embodiment 5. Light source device 500 of this embodiment has first surface 50t of base 50 fixed to an external device such as external heat radiator 930 similarly to embodiment 5.

And semiconductor light-emitting device 10 fixed to base 50 is connected to mounted substrate 160 on which external connecting member 166 is mounted. And emitted light 52 emitted from semiconductor light-emitting device 10 fixed to base 50 becomes propagated light 54 by lens 20a and reflection optical element 20b, and is incident to wavelength-converting element 2.

At this time, semiconductor light-emitting device 10 is configured to be disposed between external connecting member 166 and wavelength-converting element 2. And first light-receiving element 42 is mounted on mounted substrate 160 on a side opposite to external connecting member 166 when seen from semiconductor light-emitting device 10. At this time, wavelength-converting element 2 is fixed so as to be in parallel with first surface 50t similarly to embodiment 1 and the like.

A part of emitted light 92 emitted from wavelength-converting element 2 is reflected by light transmitting member 60 and is incident to first light-receiving element 42 disposed on an end portion of mounted substrate 160.

By means of such configuration, since first light-receiving element 42 can be disposed on the end portion of mounted substrate 160, first light-receiving element 42 can be disposed on mounted substrate 160 more freely.

(Variation 2 of Embodiment 5)

Subsequently, light source device 500 according to variation 2 of embodiment 5 will be described with reference to FIG. 51 and FIG. 52. The light source device of this variation is characterized by detection on an abnormal operation state of the light source device by a method different from the light source device of embodiment 5. Particularly, that is an operation of determining whether the operation state signal from the light-receiving element is influenced by the ambient light or not while the light source device is made to emit light, when the light source device of this variation is incorporated in the light projecting device in use, if an ambient light such as a stray light is incident to the light source device from the outside, and the light-receiving element outputs an abnormal operation state signal, and the operation is returned to normal when the influence of the ambient light disappears.

More specifically, when state detection circuit 1 of the light source device detects an abnormality, a method of applying an electric current to semiconductor light-emitting device 10 is changed from continuous operation driving to pulsed driving operation, a signal change from state detection circuit 1 during the pulsed driving is detected, and the operation state of the light source device is detected. Since this variation has a substantially same configuration as the light source device in embodiment 5, different portions will be mainly described.

Figure 51:
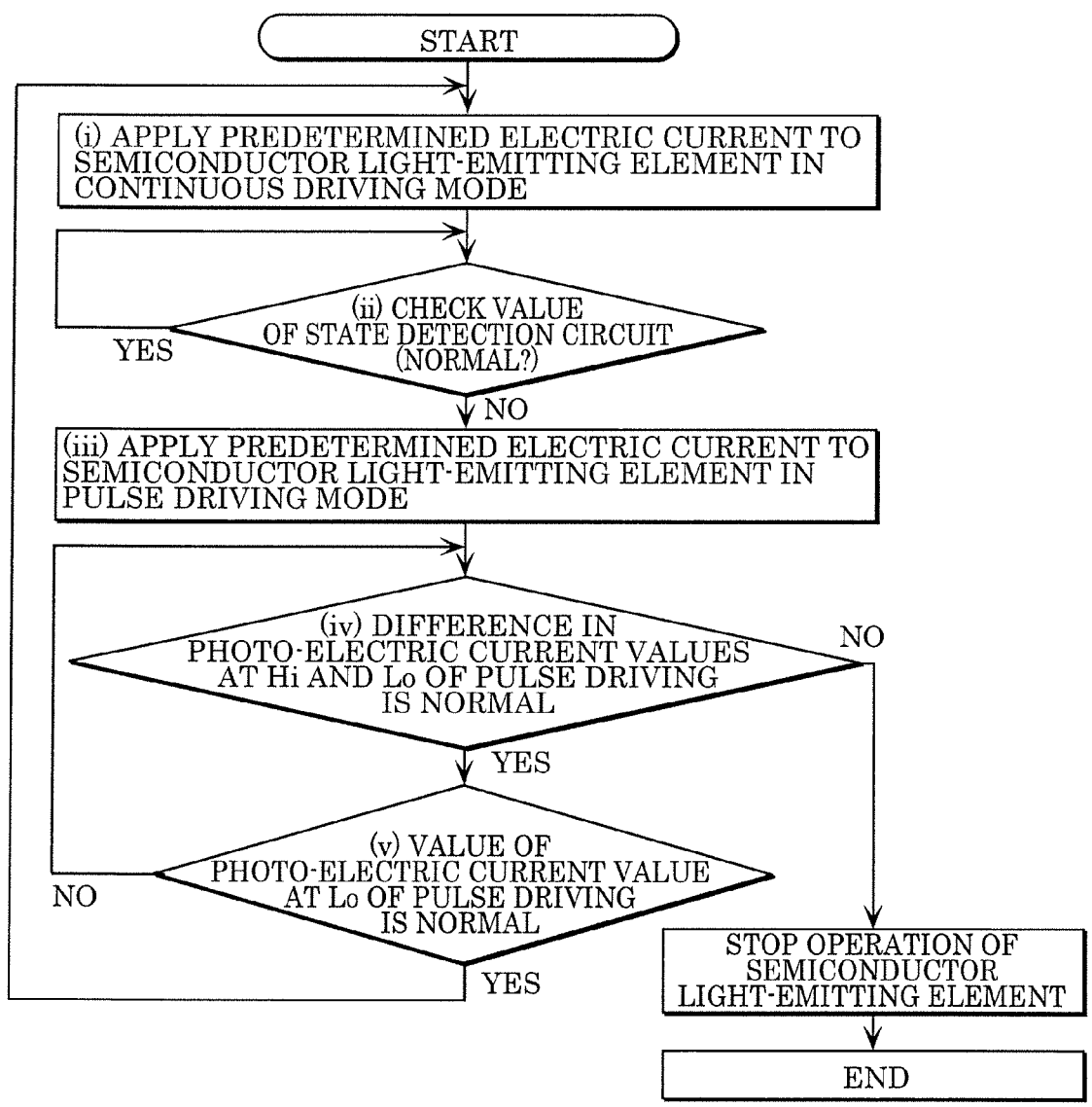
FIG. 51 is a flowchart for explaining an operation of the light source device according to variation 2 of embodiment 5.
Figure 52:
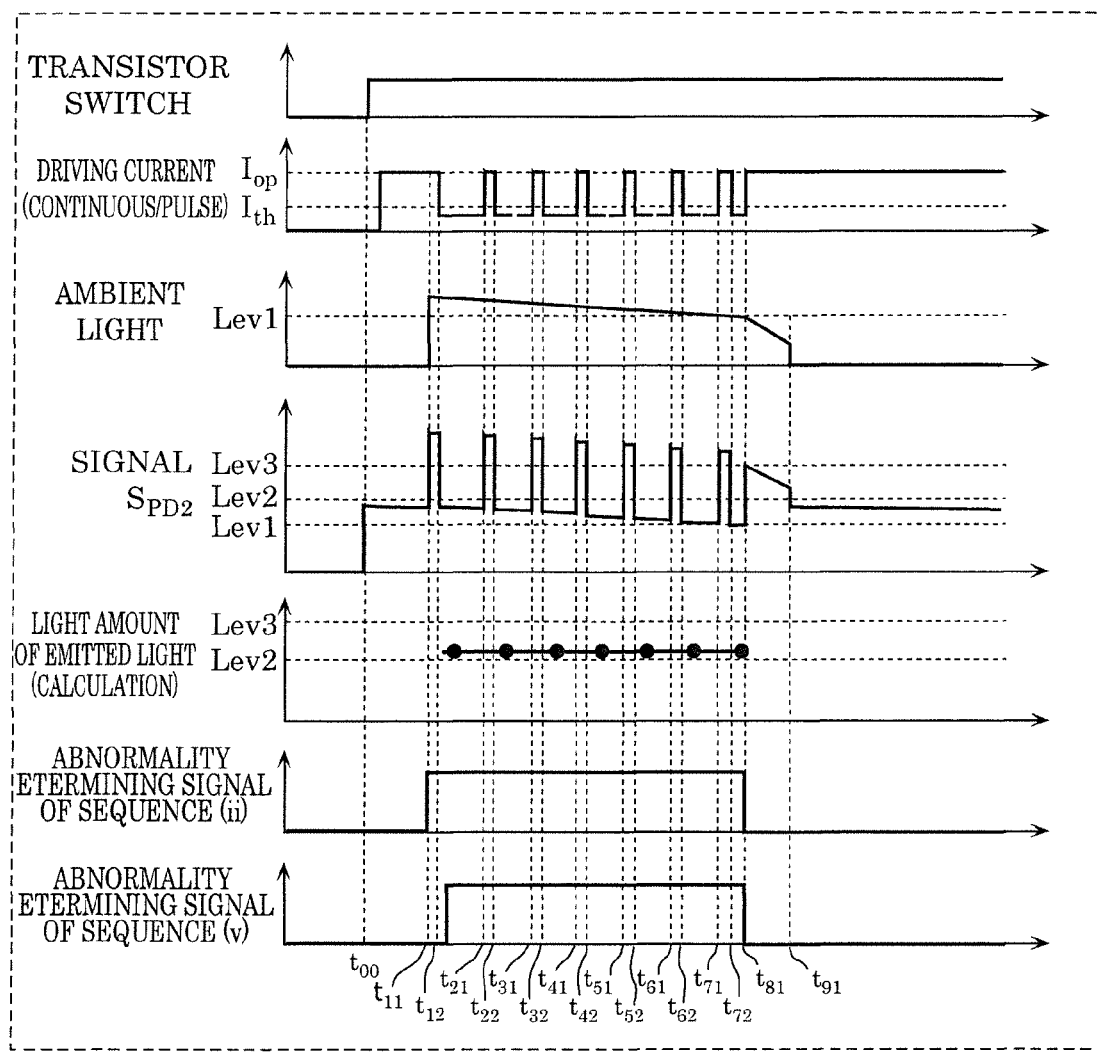
FIG. 52 is a timing chart for explaining the operation of the light source device according to variation 2 of embodiment 5.

FIG. 51 is a flowchart for explaining an operation of light source device 500 according to this variation. FIG. 52 is a schematic timing chart of each signal for explaining the operation of light source device 500 according to this variation.

Hereinafter, light source device 500 and an operation of its state detection circuit will be described with reference to FIG. 51 and FIG. 52. First, an example of the operation when light source device 500 of this variation is incorporated in the light projecting device, used as a front lamp of an automobile, and light source device 500 of this variation is lighted, for example, will be described.

(i) A predetermined electric current is applied to the semiconductor light-emitting device which is a semiconductor laser, and the light source device is lighted in a continuous driving mode.

(ii) A signal from the light-receiving element which is a photodetector is input into the microcontroller during the operation of the light source device, is compared with the reference value, and is determined whether it is normal or abnormal. In the case of normal (Yes), the light source is operated continuously, while in the case of abnormal (No), the routine goes to sequence (iii).

(iii) A driving current of the pulse is applied to the semiconductor light-emitting device, and the light source device is operated in a pulse driving mode.

(iv) A signal of the light-receiving element is also output as a pulse signal in accordance with the pulse driving of the light source device. This signal is input into the microcontroller, a difference between the pulse signal of the peak (Hi) case and the signal amount of the bottom ($L_0$: pulse-off) case, and intensity of the emitted light emitted from the light source device is detected. If the intensity is the normal (Yes), the routine goes to sequence (v), while in the case of abnormal (No), the semiconductor light-emitting device is stopped.

(v) The signal amount of the bottom (Lo) of the pulse signal of the light-receiving element is calculated, and if the light amount of the ambient light is still at a predetermined value or more (No), the routine goes to sequence (iv), and the intensity of the emitted light emitted from the light source device is detected again. If the light amount of the ambient light falls to the predetermined value or less (Yes), the routine goes to sequence (i) again, and the light source device is made to emit light in the normal continuous operation mode.

By using the light source device performing the aforementioned operation, even if the ambient light such as a stray light is incident to the light source device from the outside, the light source device is instantaneously turned off, and rapid darkening on a front of the automobile can be suppressed.

The above will be described in more detail with reference to the timing chart in FIG. 52. First, it is assumed that the transistor is turned on at time too, and after a predetermined period of time, the driving current $I_{OP}$ is applied to the semiconductor light-emitting device in the continuous driving mode, and the light source device is made to emit light. In the middle of the aforementioned operation, the ambient light is incident to the light source device at time $t_{11}$, the light intensity of the ambient light gradually lowers and becomes negligibly small at time $t_{31}$.

Here, assume that sequence (ii) in FIG. 51 sets that it is determined to be abnormal when signal $S_{PD2}$ which is the operation state signal from the light-receiving element of state detection circuit 1 of light source device 500 exceeds reference value Lev3. In this case, the microcontroller of the light source device determines that the operation state of the light source device is abnormal from time $t_{11}$ to $t_{12}$, and the driving current of the light source device is switched to the pulse driving mode. And a difference between signal $S_{PD2}$ from $t_{21}$ to $t_{22}$ when the first pulse electric current is applied to signal $S_{PD2}$ and signal $S_{PD2}$ from $t_{22}$ to $t_{31}$ when the pulse electric current is turned off is calculated, and the light amount of the emitted light of the light source device is calculated. At this time, assume that a determination standard at sequence (iv) in FIG. 51 is OK (YES) at reference value Lev2 or more and reference value Lev 3 or less. At this time, the state detection circuit and the microcontroller of the light source device are operated at sequence (iv)→(v) →(iv). And as indicated by a black circle in FIG. 52, if there is no abnormality in the light amount of the emitted light, sequences (iv) and (v) in FIG. 51 are repeatedly operated from time $t_{31}$ to time $t_{71}$. And when the ambient light gradually lowers and the signal falls to reference value Lev1 or less from time $t_{71}$ to time $t_{81}$, it is determined that the influence of the ambient light has sufficiently decreased, the routine goes from sequences (v) to (ii), and such control is executed that the driving of the light source device is switched to the continuous driving mode in the normal operation state.

By means of such configuration, even if the signal amount different from the normal operation state is output since the ambient light is incident to the light-receiving element of light source device 500, the signal influenced by the ambient light can be distinguished from the signal in the case of abnormality occurring in light source device 100.

Embodiment 6

Subsequently, light source device 600 of embodiment 6 will be described with reference to FIG. 53 and FIG. 54.

Figure 53:
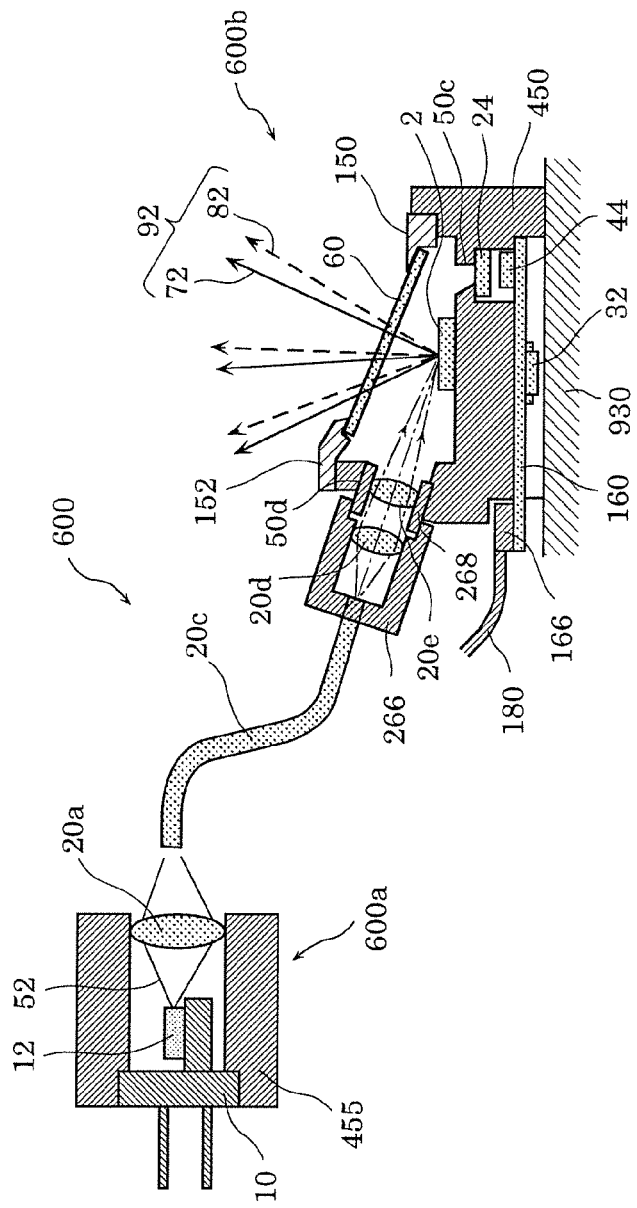
FIG. 53 is a schematic sectional view for explaining a light source device according to embodiment 6.
Figure 54:
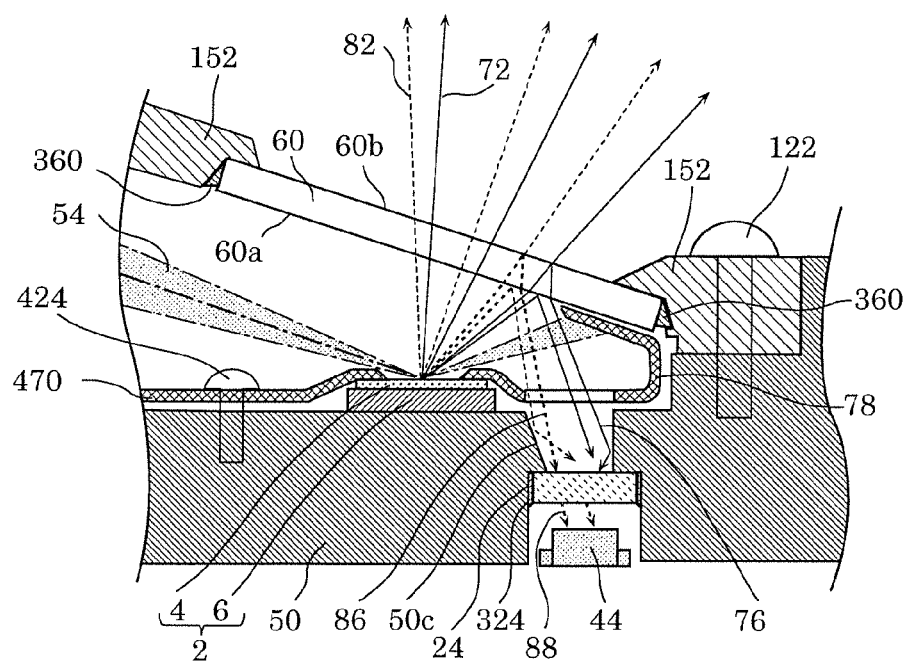
FIG. 54 is a schematic sectional view for explaining a configuration in the vicinity of a wavelength-converting element and a light-receiving element of the light source device according to embodiment 6.

FIG. 53 is a schematic sectional view for explaining light source device 600 according to embodiment 6. Moreover, FIG. 54 is a schematic sectional view for explaining a configuration of the vicinities of wavelength-converting element 2, first light-receiving element 42, and second light-receiving element 44 of light source device 600 according to embodiment 6.

Light source device 600 of this embodiment illustrated in FIG. 53 is different from the other embodiments in a point that semiconductor light-emitting device unit 600*a* on which semiconductor light-emitting device 10 is mounted and wavelength-converting element unit 600*b* on which wavelength-converting element 2 is mounted are joined by optical fiber 20*c*.

First, in semiconductor light-emitting device unit 600*a*, semiconductor light-emitting device 10 on which semiconductor light-emitting element 12 is mounted is fixed by press-fit, for example, in one of opening portions of base 455 having through holes. Lens 20*a* which is a light-collecting lens, for example, is fixed to the other opening portion of base 455. Emitted light 52 emitted from semiconductor light-emitting device unit 600*a* is collected by lens 20*a* and is incident to optical fiber 20*c*.

On the other hand, in wavelength-converting element unit 600*b*, wavelength-converting element 2 is mounted on base 450 constituted by an aluminum alloy, for example. On a side of base 450 where wavelength-converting element 2 is mounted, light-guide opening portion 50*d* for irradiating emitted light 54 propagated by optical fiber 20*c* to wavelength-converting element 2 and light-guide opening portion 50*c* for taking out the light emitted by wavelength-converting element 2 to the outside are formed. Moreover, cover unit 150 constituted by holding member 152 and light transmitting member 60 is mounted on base 450 so as to cover wavelength-converting element 2.

Mounted substrate 160 is disposed on a surface opposite to the surface of base 450 to which wavelength-converting element 2 is fixed. Light-receiving element 44, external connecting member 166, and microcontroller 32 are mounted on mounted substrate 160. Moreover, light-guide opening portion 50*c* which reaches the surface where mounted substrate 160 is disposed is provided in the vicinity of wavelength-converting element 2 of base 450, and second optical filter 24 and light-receiving element 44 are disposed. Moreover, holder 266 which holds lens 20*d* connected to the emission side of optical fiber 20*c* and holder 268 which holds lens 20*e* connected to lens 20*d* are mounted on opening portion 50*d* of base 50.

In light source device 600 with the aforementioned configuration, the light having been propagated optical fiber 20*c* passes through lenses 20*d* and 20*e* and is incident as propagated light 54 to wavelength-converting member 4 of wavelength-converting element 2. And a part of propagated light 54 becomes first emitted light 72, while another part becomes second emitted light 82 by wavelength-converting member 4 and the light are radiated. At this time, parts of first emitted light 72 and second emitted light 82 are reflected by surfaces 60*a* and 60*b* of light transmitting member 60 and become first reflected light 76 and second reflected light 86 and are incident to second optical filter 24. And second emitted light 88 which is a light with a part of wavelengths cut by second optical filter 24 is incident to light-receiving element 44. The light incident to light-receiving element 44 is converted to a predetermined operation state signal by light-receiving element 44, is input into microcontroller 32, and then, is calculated. The result is transmitted through external connecting member 166 and external wiring 180 and is used for controlling a driving circuit of the semiconductor light-emitting device, not shown. Note that base cover 470 constituted by a plate-shaped metal is disposed above wavelength-converting element 2 of wavelength-converting element unit 600*b* and light-guide opening portion 50*c* and is fixed by screw 424.

In light source device 600 with the aforementioned configuration, if separation or the like occurs in wavelength-converting member 4, a light emitted from wavelength-converting element 2 is received by light-receiving element 44, and the operation state signal is determined by microcontroller 32 so that semiconductor light-emitting device 10 can be controlled similarly to the other embodiment.

By means of such configuration, if abnormality occurs inside light source device 600, semiconductor light-emitting device 10 can be stopped at a high speed, and light source device 600 can be configured more freely.

Note that, in aforementioned embodiments 1 to 6, a semiconductor light-emitting device in which a semiconductor light-emitting element is mounted on a TO-CAN type package having a lead pin for anode terminal and a lead pin for a cathode terminal is used as the semiconductor light-emitting device and is described, but this is not limited. The semiconductor light-emitting device is not particularly limited as long as the semiconductor light-emitting element is mounted on a package having an anode terminal and a cathode terminal.

Note that, in aforementioned embodiments 1 to 6, one in which only one semiconductor light-emitting device is mounted on the mounted substrate is described, but this is not limited. For example, a plurality of the semiconductor light-emitting devices may be connected in series and connected to wiring for anode and wiring for cathode. Moreover, a plurality of the semiconductor light-emitting devices may be connected in parallel and connected to wiring for anode and wiring for cathode.

Embodiment 7

Figure 55A:
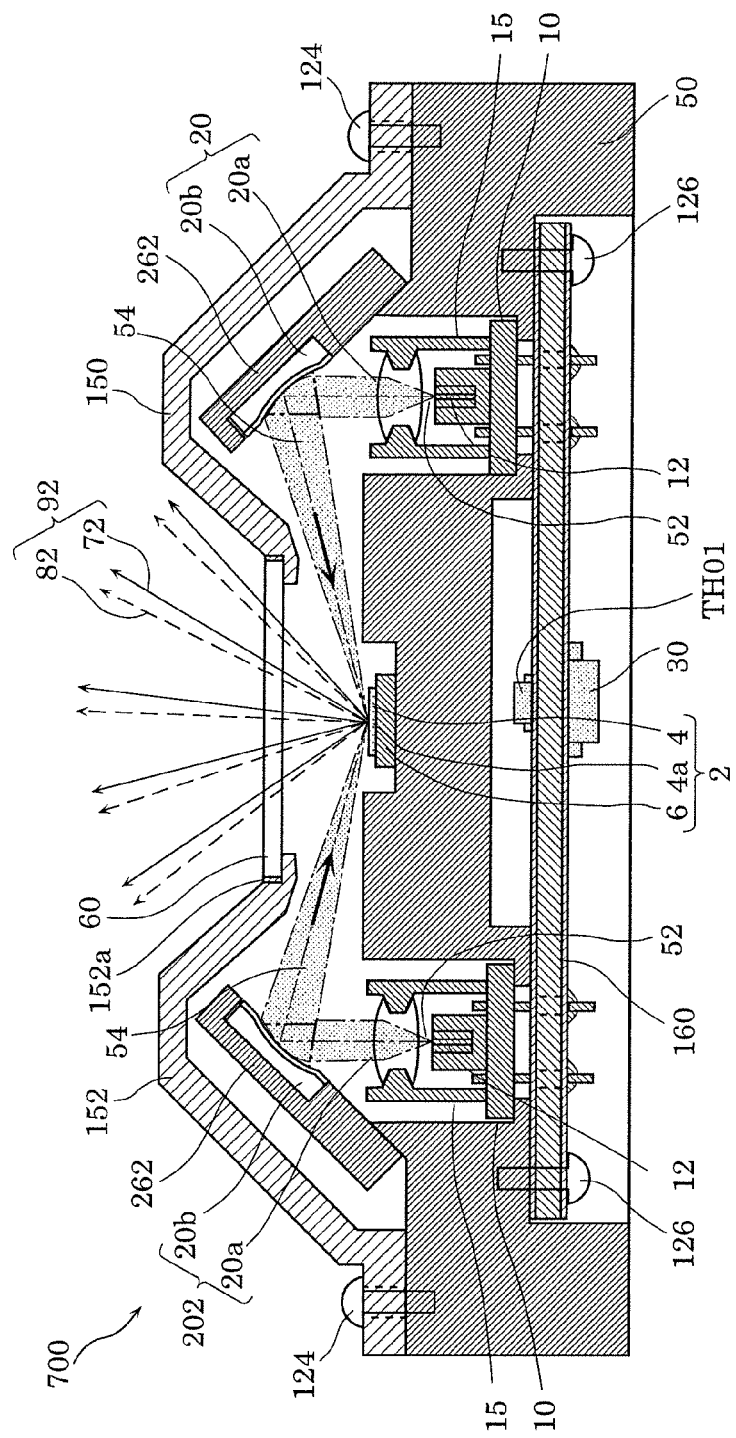
FIG. 55A is a schematic sectional view of a light source device according to embodiment 7.
Figure 55B:
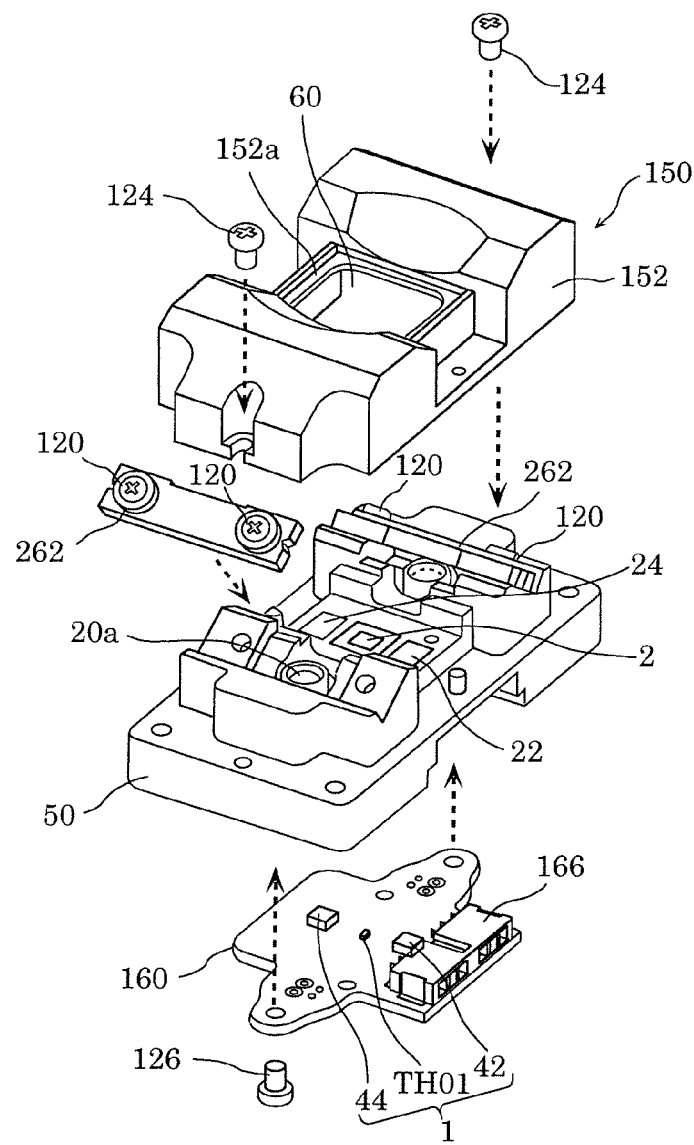
FIG. 55B is an exploded perspective view of a part of components of the light source device according to embodiment 7.

A configuration of light source device 700 according to embodiment 7 will be described with reference to FIG. 55A and FIG. 55B. Light source device 700 of this embodiment is an example of a light source device using a plurality of semiconductor light-emitting devices, or more specifically, two semiconductor light-emitting devices 10 are mounted on light source device 700. FIG. 55A illustrates a schematic sectional view of light source device 700. FIG. 55B is an exploded perspective view of a part of components of light source device 700 and is also a view for explaining a manufacturing method.

In light source device 700 of this embodiment, two semiconductor light-emitting devices 10 are fixed to base 50, and two semiconductor light-emitting devices 10 are connected to the same mounted substrate 160 and moreover, are disposed so as to face wavelength-converting element 2, which are mainly different from light source device 200 in FIG. 18 illustrated in embodiment 2. And emitted light 52 emitted from the two semiconductor light-emitting devices 10 to the same direction, that is, to above the figure is reflected by reflection optical element 20*b* disposed with respect to each of semiconductor light-emitting devices 10 and becomes propagated light 54 propagated while collecting the light in the direction of wavelength-converting element 2.

And two propagated light 54 are irradiated in a state partially or wholly overlapped in the vicinity of light emitter 4*a* on wavelength-converting member 4 of wavelength-converting element 2. And emitted light 92 with intensity according to light intensity of light in which two propagated light 54 are combined is radiated from light emitter 4*a*.

By means of such configuration, excitation light with higher light intensity and light density can be irradiated onto wavelength-converting member 4 by using the plurality of semiconductor light-emitting devices 10. Thus, emitted light 92 with high brightness and/or large light flux can be emitted from light source device 700.

Moreover, the plurality of semiconductor light-emitting devices 10 is connected to one sheet of mounted substrate 160 on which external connecting member 166 is mounted. Thus, electricity can be supplied easily to the plurality of semiconductor light-emitting devices from the outside. At this time, the plurality of semiconductor light-emitting devices 10 may be connected in series so that the same electric current amount is applied by using two terminals of external connecting member 166. Moreover, electric current amounts different from each other can be applied to two semiconductor light-emitting devices 10 by using four terminals of external connecting member 166, and light intensity of propagated light 54 to be irradiated to wavelength-converting element 2 is adjusted so that a light amount of emitted light 92 can be freely set.

Moreover, as illustrated in an exploded view in FIG. 55B, state detection circuit 1 constituted by first light-receiving element 42, second light-receiving element 44, temperature detection element THO1, and the like may be formed on mounted substrate 160. By means of such configuration, wiring of the plurality of the semiconductor light-emitting devices and wiring of state detection circuit 1 can be realized by using the one sheet of mounted substrate 160 and thus, light source device 700 can be configured easily.

Light source device 700 of this embodiment is configured such that semiconductor light-emitting device 10 in which lens 20*a* is fixed to metal can 15 is fixed to the bottom surface of the recess portion having an opening on reflection optical element 20*b* side as semiconductor light-emitting device 10. Moreover, first optical filter 22, second optical filter 24, and wavelength-converting element 2 are also configured to be fixed to the bottom surface of the recess portion having the opening on reflection optical element 20*b* side. And reflection optical element 20*b* is fixed to holder 262, and holder 262 is configured to be fixed to base 50 by screw 120.

By means of such configuration, first optical filter 22, second optical filter 24, wavelength-converting element 2, two semiconductor light-emitting devices 10, and two reflection optical elements 20*b* can be disposed from the same direction of base 50 and fixed as illustrated in FIG. 55B and thus, light source device 700 can be manufactured easily. Moreover, since all state detection circuits 1 and external connecting member 166 are mounted on the same mounted substrate 160, and mounted substrate 160 is connected to a plurality of semiconductor light-emitting devices 10, light source device 700 can be manufactured easily even if the plurality of semiconductor light-emitting devices 10 is used.

Moreover, in light source device 700, first optical filter 22, second optical filter 24, first light-receiving element 42, and second light-receiving element 44 are disposed by facing a direction orthogonal to an advance direction of propagated light 54 of wavelength-converting element 2. By means of such configuration, a region in the vicinity of wavelength-converting element 2 where two semiconductor light-emitting devices 10 and two reflection optical elements 20*b* are not disposed can be used and thus, small-sized light source device 700 can be configured easily.

Embodiment 8

Figure 56A:
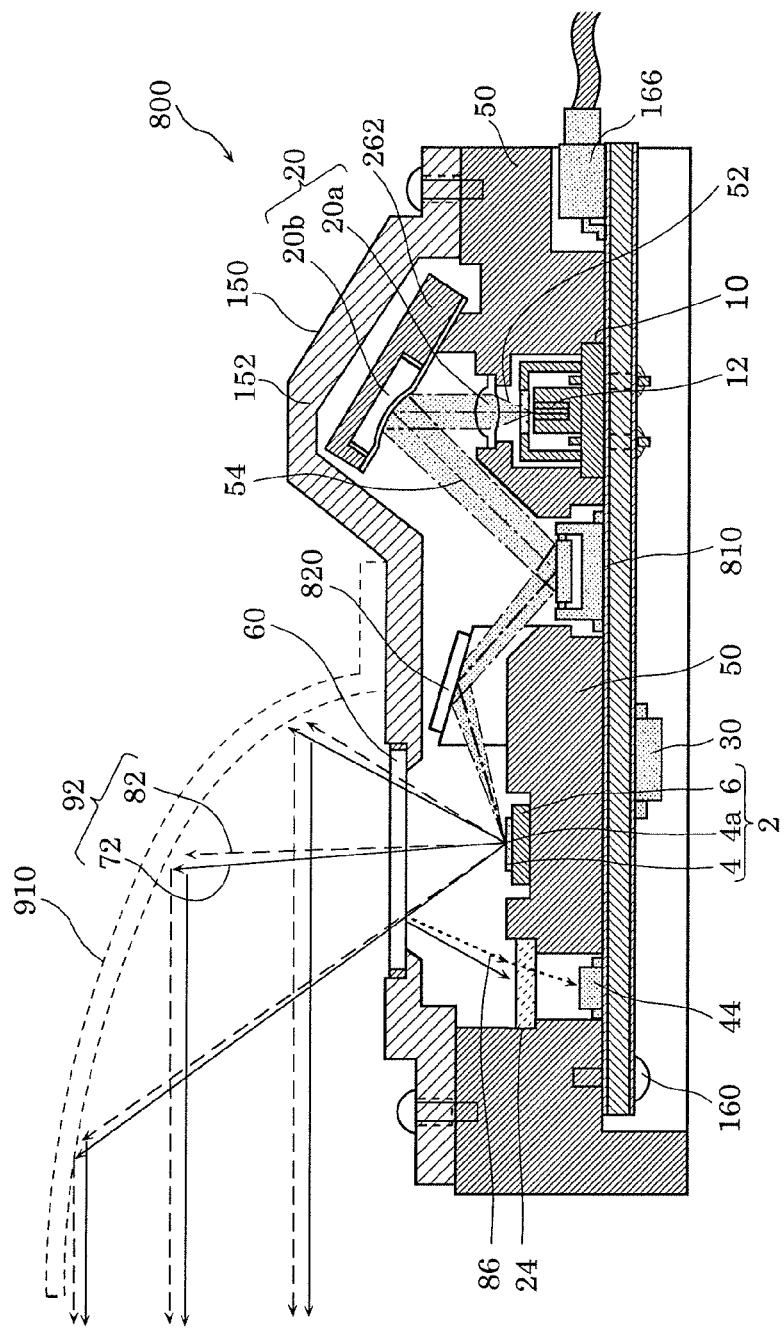
FIG. 56A is a schematic sectional view of a light source device according to embodiment 8.
Figure 56B:
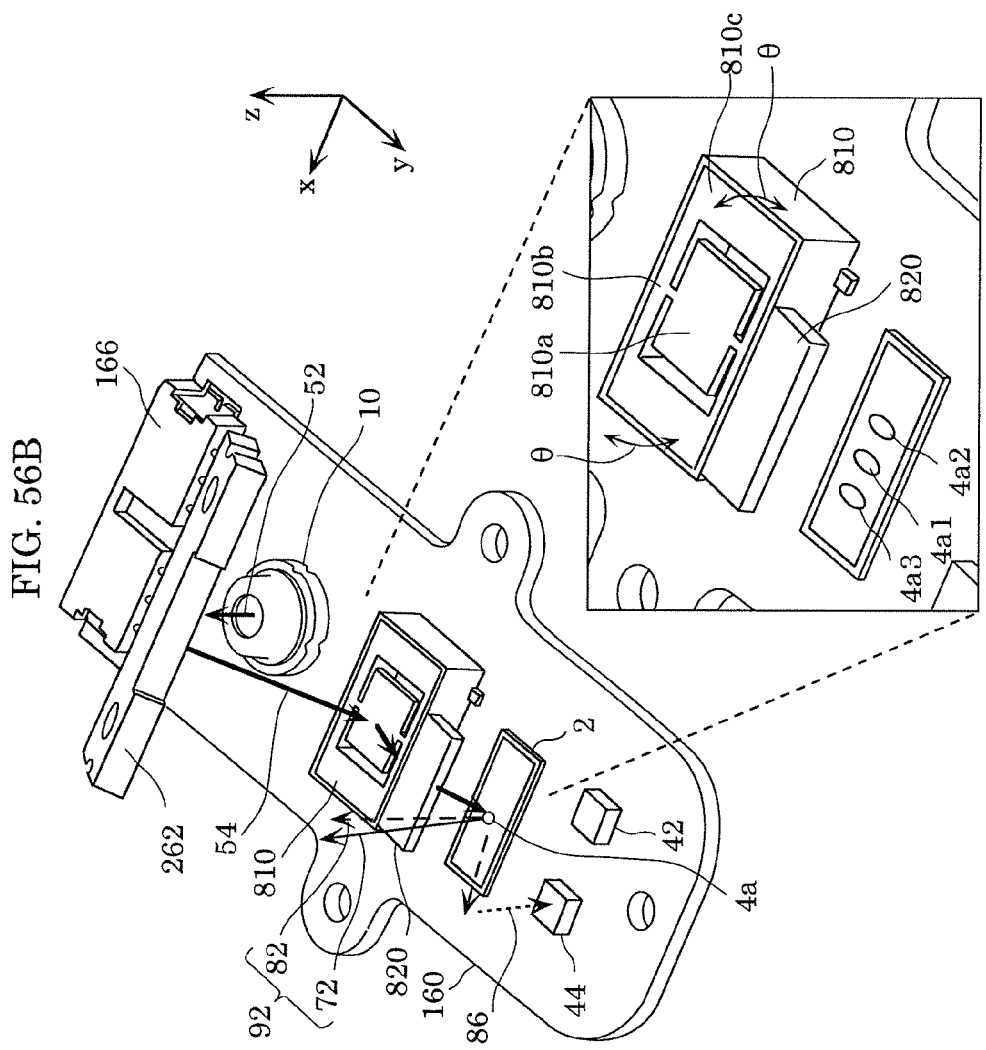
FIG. 56B is a perspective view which mainly extracts a major active element and an optical element of the light source device according to embodiment 8.
Figure 57:
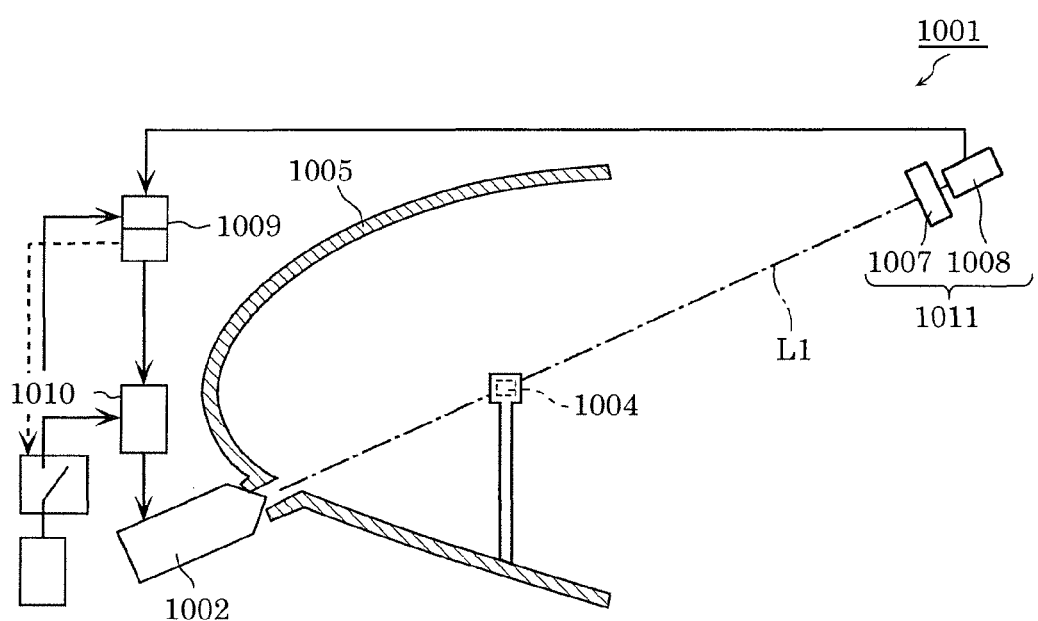
FIG. 57 is a schematic diagram illustrating a configuration of a conventional light source device.

A configuration of light source device 800 according to embodiment 8 will be described with reference to FIG. 56A and FIG. 56B. Light source device 800 of this embodiment is different from light source device 100 of embodiment 1 mainly in a point that movable mirror unit 810 is further provided. FIG. 56A is a schematic sectional view of light source device 800, and FIG. 56B is a perspective view mainly extracting major active elements and optical elements of light source device 800. A view enlarging the vicinity of movable mirror unit 810 is illustrated in a lower right part of FIG. 56B.

In light source device 800, movable mirror unit 810 is connected to mounted substrate 160 similarly to semiconductor light-emitting device 10 and first light-receiving element 42. Movable mirror unit 810 has movable mirror 810*a* supported by a pair of torsion bars 810*b* with respect to support member 810*c* as illustrated in FIG. 56B. Movable mirror 810*a* is slightly rotated around torsion bars 810*b* by electrostatic force, electromagnetic force, or the like, and a mirror surface is inclined to a θ direction. More specifically, a permanent magnet is provided in movable mirror unit 810, and wiring which causes an electric current to flow is formed in movable mirror 810*a*. And by causing the electric current to flow through the wiring of movable mirror 810*a*, a Lorentz force is generated, and movable mirror 810*a* is rotated in a y-axis direction and is inclined to the θ direction.

In this configuration, emitted light 52 emitted from semiconductor light-emitting device 10 is reflected by reflection optical element 20*b* and becomes propagated light 54, is reflected by movable mirror 810*a* of movable mirror unit 810, is further reflected by reflection mirror 820, and is irradiated to light emitter 4*a* of wavelength-converting element 2. At this time, by changing a direction or an amount of the electric current to be applied to movable mirror 810*a*, an inclination angle of movable mirror 810*a* can be changed. By means of this adjustment of the inclination angle of movable mirror 810*a*, light emitter 4*a* can change a position in wavelength-converting member 4 as light emitters 4*a*1, 4*a*2, and 4*a*3 in the enlarged view on a lower right part of FIG. 56B. As a result, emitted light 92 emitted from light source device 800 can be emitted arbitrarily to different directions by light projecting optical member 910. When such light source device is used as a vehicle front lamp, for example, a front lamp which can realize adaptive front-lighting system (AFS) can be easily configured.

Moreover, a part of emitted light 92 emitted from wavelength-converting element 2 is reflected by light transmitting member 60 and can be led to first light-receiving element 42.

As described above, in the light source device of this embodiment, a light emission position of the emitted light emitted from the light source device can be easily changed, and movable mirror unit 810 which is an active element for changing the light emission position can be connected to one sheet of mounted substrate 160 similarly to first light-receiving element 42, semiconductor light-emitting device 10, and the like. Thus, light source device 800 can be configured easily, and light source device 800 can be electrically connected to the outside and operated easily.

Other Embodiments

The light source device and the light projecting device of the present disclosure have been described on the basis of the aforementioned embodiments, but the light source device and the light projecting device according to the present disclosure are not limited to the aforementioned embodiments. Another embodiment realized by combining arbitrary constituent elements in the aforementioned embodiments, variations obtained by applying various modifications on the aforementioned embodiments conceived of by those skilled in the art within a range not departing from the gist of the present disclosure, and various equipment such as a distance-measuring image pickup device incorporating the light source device and the light projecting device of the present disclosure are also included in the present disclosure.

INDUSTRIAL APPLICABILITY

The present disclosure can be widely used as various optical devices such as light source devices used in vehicle exterior illumination such as a front lamp, a front fog-lamp, a side irradiation lamp, a width indicator lamp, a tail lamp, and the like or a display field such as a projection display device, and an illumination field such as industrial illumination, medical illumination, and the like and light projecting devices using them and the like.

What is claimed is:

1. A light source device used for exterior illumination of a vehicle, comprising:
    a single mounted substrate;
    a semiconductor light-emitting device which emits a laser beam;
    an external connecting member connected to the semiconductor light-emitting device and to which a driving current of the semiconductor light-emitting device is supplied from outside the light source device;
    a wavelength-converting member which radiates wavelength-converted fluorescence when irradiated with the laser beam as an excitation light;
    an operation state detection circuit which includes one or more light-receiving elements, detects an operation state of the light source device in accordance with light information detected by the one or more light-receiving elements, and outputs an operation state signal;
    a microcontroller which controls the operation of the semiconductor light-emitting device in accordance with the operation state signal; and
    a non-volatile memory which is disposed inside the microcontroller or on the single mounted substrate, wherein
    the semiconductor light-emitting device, the external connecting member, the microcontroller, and the operation state detection circuit are mounted on the single mounted substrate,
    the one or more light-receiving elements receive a scattered light generated by scattering the laser beam on the wavelength-converting member or the wavelength-converted fluorescence,
    an initial light amount value according to a light amount of at least a light amount of the scattered light or a light amount of the wavelength-converted fluorescence when the semiconductor light-emitting device is operated under an initial state measurement condition is stored in the non-volatile memory, and
    operation control of the semiconductor light-emitting device is executed by using the initial light amount value.

2. The light source device according to claim 1, wherein a temporal change coefficient related to aging over time of the semiconductor light-emitting device determined in advance and accumulated operation time of the semiconductor light-emitting device measured by using the microcontroller and the non-volatile memory are stored in the non-volatile memory, and
    operation control of the semiconductor light-emitting device is executed by using the initial light amount value, the temporal change coefficient, and the accumulated operation time.

3. The light source device according to claim 1, wherein the operation state detection circuit includes a temperature detection element and outputs the operation state signal in accordance with temperature information detected by the temperature detection element.

4. The light source device according to claim 3, wherein an initial temperature value according to a temperature when the semiconductor light-emitting device is operated under an initial state measurement condition is stored in the non-volatile memory, and
    operation control of the semiconductor light-emitting device is executed by using the initial temperature value and the temperature information.

5. The light source device according to claim 3, wherein driving current information according to the temperature information is stored in the non-volatile memory, and
    operation control of the semiconductor light-emitting device is executed by using the driving current information.

6. The light source device according to claim 1, further comprising:
    a transistor which controls an operation of the semiconductor light-emitting device, wherein
    the transistor is mounted on the single mounted substrate.

7. The light source device according to claim 6, wherein the transistor is connected in series to the semiconductor light-emitting device.

8. The light source device according to claim 1, wherein the semiconductor light-emitting device has an anode terminal and a cathode terminal, and
    the operation state detection circuit detects a voltage of the anode terminal and outputs the operation state signal in accordance with detected voltage information.

9. The light source device according to claim 1, further comprising:
    a transistor which controls an operation of the semiconductor light-emitting device, wherein
    the microcontroller controls the transistor in accordance with the operation state signal, independently of control outside the light source device.

10. The light source device according to claim 1, wherein when the operation state signal indicates operation abnormality of the light source device, the semiconductor light-emitting device is pulse-driven and has operation controlled by referring to an output signal of the one or more light-receiving elements during a pulse-off period of the pulse driving.

11. The light source device according to claim 1, further comprising:
a gain switching circuit which controls an amplitude of an output signal of the one or more light-receiving elements between the one or more light-receiving elements and the microcontroller.

12. The light source device according to claim 1, further comprising:
an optical filter in an optical waveguide between the wavelength-converting member and the one or more light-receiving elements.

13. The light source device according to claim 1, further comprising:
a base on which the wavelength-converting member is installed; and
a base cover having a plate shape and an arithmetic mean roughness of a surface at 0.5 μm or more in a periphery of the wavelength-converting member.

14. The light source device according to claim 1, further comprising:
a light transmitting member in a light emission path to an outside, wherein
the light transmitting member is a light collecting lens.

15. The light source device according to claim 1, wherein
the single mounted substrate is a multi-layered wiring board having three layers or more,
the semiconductor light-emitting device has an anode terminal and a cathode terminal, and
inner wiring of the single mounted substrate is used for wiring connecting the anode terminal or the cathode terminal and the external connecting member.

16. The light source device according to claim 3, wherein
the temperature detection element is disposed between the semiconductor light-emitting device and the microcontroller in plan view.

* * * * *